(12) United States Patent
Yamakoshi et al.

(10) Patent No.: US 10,651,188 B2
(45) Date of Patent: May 12, 2020

(54) SEMICONDUCTOR DEVICE AND A MANUFACTURING METHOD THEREOF

(71) Applicant: Renesas Electronics Corporation, Tokyo (JP)

(72) Inventors: Hideaki Yamakoshi, Tokyo (JP); Takashi Hashimoto, Tokyo (JP); Shinichiro Abe, Tokyo (JP); Yuto Omizu, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/520,758

(22) Filed: Jul. 24, 2019

(65) Prior Publication Data
US 2019/0348429 A1 Nov. 14, 2019

Related U.S. Application Data

(63) Continuation of application No. 15/871,818, filed on Jan. 15, 2018, now abandoned.

(30) Foreign Application Priority Data

Mar. 30, 2017 (JP) .................................. 2017-067913

(51) Int. Cl.
*H01L 27/11568* (2017.01)
*G11C 11/40* (2006.01)
(Continued)

(52) U.S. Cl.
CPC ........ *H01L 27/11568* (2013.01); *G11C 11/40* (2013.01); *H01L 27/11573* (2013.01);
(Continued)

(58) Field of Classification Search
None
See application file for complete search history.

(56) References Cited

U.S. PATENT DOCUMENTS 7,259,422 B1    8/2007  Hisamoto et al.
8,338,252 B2 *  12/2012 Yaegashi ........... H01L 21/26513
                                                            438/258
(Continued)

FOREIGN PATENT DOCUMENTS

JP    2007-243095 A    9/2007
JP    2016-048710 A    4/2016

OTHER PUBLICATIONS

Extended European Search Report dated Oct. 4, 2018, in European Patent Application No. 18153859.6.

*Primary Examiner* — Hung K Vu
(74) *Attorney, Agent, or Firm* — SGPatents PLLC

(57) ABSTRACT

In a MONOS memory having an ONO film, dielectric breakdown and a short circuit are prevented from occurring between the end of the lower surface of a control gate electrode over the ONO film and a semiconductor substrate under the ONO film. When a polysilicon film formed over the ONO film ON is processed to form the control gate electrode, the ONO film is not processed. Subsequently, a second offset spacer covering the side surface of the control gate electrode is formed. Then, using the second offset spacer as a mask, the ONO film is processed. This results in a shape in which in the gate length direction of the control gate electrode, the ends of the ONO film protrude outwardly from the side surfaces of the control gate electrode, respectively.

11 Claims, 34 Drawing Sheets

(51) Int. Cl.
*H01L 27/11573* (2017.01)
*H01L 29/66* (2006.01)
*H01L 29/792* (2006.01)
*H01L 21/28* (2006.01)

(52) U.S. Cl.
CPC ...... *H01L 29/66833* (2013.01); *H01L 29/792* (2013.01); *H01L 29/40117* (2019.08)

(56) References Cited

U.S. PATENT DOCUMENTS

| | | | |
|---|---|---|---|
| 8,372,718 B2* | 2/2013 | Fujii | H01L 21/823418 |
| | | | 257/E21.625 |
| 9,685,453 B2 | 6/2017 | Owada | |
| 2009/0008701 A1 | 1/2009 | Kim et al. | |
| 2010/0112768 A1 | 5/2010 | Lee et al. | |
| 2012/0168847 A1 | 7/2012 | Fang et al. | |
| 2014/0179076 A1* | 6/2014 | Shinohara | H01L 29/42344 |
| | | | 438/275 |
| 2015/0171103 A1 | 6/2015 | Ishida et al. | |
| 2015/0287811 A1 | 10/2015 | Ramkumar et al. | |

* cited by examiner

SEMICONDUCTOR DEVICE AND A MANUFACTURING METHOD THEREOF

CROSS-REFERENCE TO RELATED APPLICATIONS

The disclosure of Japanese Patent Application No. 2017-067913 filed on Mar. 30, 2017 including the specification, drawings and abstract is incorporated herein by reference in its entirety.

BACKGROUND

The present invention relates to a semiconductor device, and a manufacturing method thereof, and is applicable to, for example, manufacturing of a semiconductor device having a low breakdown voltage transistor and a high breakdown voltage transistor.

As one of nonvolatile storage elements, a single gate type MONOS (Metal Oxide Nitride Oxide Semiconductor) memory including source/drain regions formed at the surface of a semiconductor substrate, a memory gate electrode, and a charge accumulation film formed between the semiconductor substrate and the memory gate electrode is known. For a nonvolatile storage device, such MONOS memories are arranged in an array to form a memory array. Selection of the MONOS memory at a read operation, or the like can be performed, for example, using a selection transistor coupled in series with each MONOS memory.

Patent Document 1 (Japanese Unexamined Patent Application Publication No. 2016-48710) describes that a single gate type MONOS memory, a low breakdown voltage MOSFET (Metal Oxide Semiconductor Field Effect Transistor), and a high breakdown voltage MOSFET are merged over the same substrate.

Patent Document 2 (Japanese Unexamined Patent Application Publication No. 2007-243095) describes that in a split gate type MONOS memory including mutually adjacent control gate electrode and memory gate electrode, the end of an ONO (Oxide Nitride Oxide) film under the memory gate electrode is prevented from being retreated.

CITED DOCUMENTS

Patent Documents

[Patent Document 1] Japanese Unexamined Patent Application Publication No. 2016-48710
[Patent Document 2] Japanese Unexamined Patent Application Publication No. 2007-243095

SUMMARY

The end of an insulation film (ONO film) interposed between a substrate and a gate electrode, and including a charge accumulation part in a MONOS memory is a site susceptible to dielectric breakdown due to electric field concentration. Particularly, when the end of the insulation film is retreated from the side surface of the gate electrode, dielectric breakdown is remarkably caused.

Other objects and novel features will be apparent from the description of this specification and the accompanying drawings.

Of the embodiments disclosed in the present application, representative ones will be described in brief as follows.

In accordance with a method for manufacturing a semiconductor device of one embodiment, a polysilicon film formed over an insulation film including a charge accumulation part is processed, thereby to form a control gate electrode. Subsequently, an offset spacer covering the side surface of the control gate electrode is formed. Then, using the offset spacer as a mask, the insulation film is processed.

Further, in accordance with a semiconductor device of another embodiment, in a single gate type MONOS memory, the ends of a gate insulation film including a charge accumulation film under a control gate electrode protrude outwardly from the side surfaces of the control gate electrode, respectively.

In accordance with one embodiment, the reliability of a semiconductor device can be improved.

DETAILED DESCRIPTION

Figure 1:
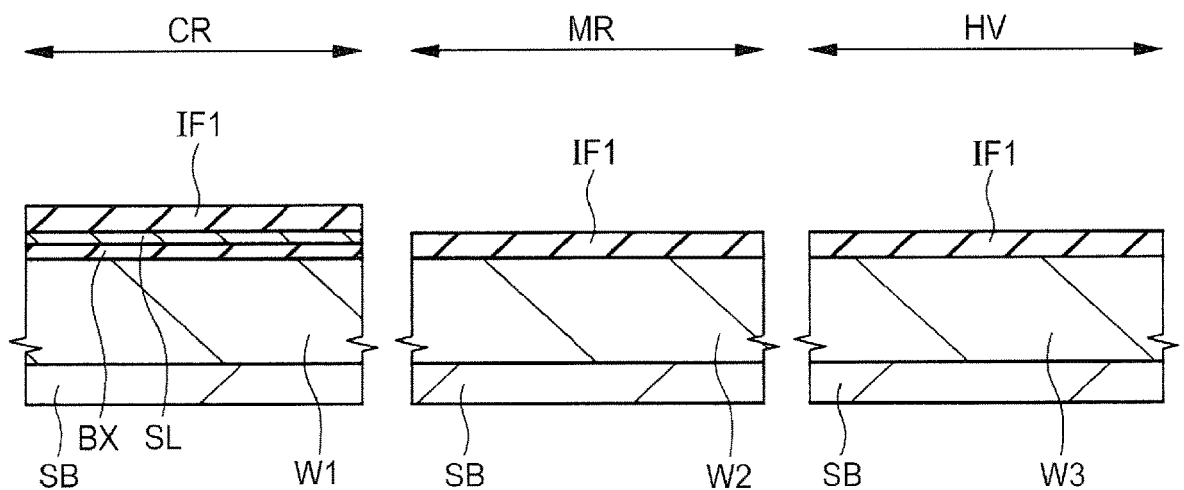
FIG. 1 is a cross sectional view of a semiconductor device of First Embodiment during a manufacturing step.

In description of the following embodiment, the embodiment may be described in a plurality of divided sections or embodiments for convenience, if required. However, unless otherwise specified, these are not independent of each other, but are in a relation such that one is a modified example, details, a complementary explanation, or the like of a part or the whole of the other. Further, in the following embodiments, when a reference is made to the number of elements, and the like (including number, numerical value, quantity, range, or the like), the number of elements, or the like is not limited to the specific number, but may be greater than or less than the specific number, unless otherwise specified, except for the case where the number is apparently limited to the specific number in principle, or except for other cases.

Further, in the following embodiments, it is needless to say that the constitutional elements (including element steps, or the like) are not always essential, unless otherwise specified, and except for the case where they are apparently considered essential in principle, or except for other cases. Similarly, in the following embodiments, when a reference is made to the shapes, positional relationships, or the like of the constitutional elements, or the like, it is understood that they include ones substantially analogous or similar to the shapes or the like, unless otherwise specified, and unless otherwise considered apparently in principle, or except for other cases. This also applies to the foregoing numerical values and ranges.

Below, the embodiments will be described in details by reference to the accompanying drawings. Incidentally, in all the drawings for describing the embodiments, the members having the same function are given the same reference signs and numerals, and a repeated description thereon is omitted. Further, in the following embodiments, a description on the same or similar parts will not be repeated in principle unless otherwise required.

First Embodiment

A semiconductor device of the present embodiment is a semiconductor device including a nonvolatile memory (nonvolatile storage element, flash memory, or nonvolatile semiconductor storage device). In the present embodiment, and the following embodiments, a nonvolatile memory will be described with reference to a memory cell based on an n channel type MISFET (Metal Insulator Semiconductor Field Effect Transistor).

Further, the polarities (the polarities of the applied voltages at the times of write, erase, and read, and the polarities of carriers) in the present embodiment and in the following embodiments are for describing the operation in the case of a memory cell based on an n channel type MISFET. When a memory cell is based on a p channel type MISFET, by inverting all the polarities of applied potentials, the conductivity type of carriers, and the like, it is possible to obtain the same operation in principle. In other words, even with a memory cell based on a p channel type MISFET, it is possible to obtain the same effects as those of the embodiments described below. Alternatively, when other transistors than the memory cell are MISFETs not of an n channel type but of a p channel type, the same effects as those of the embodiments described below can be obtained. Incidentally, a MISFET may be referred to as a MOSFET.

Description of a Method for Manufacturing a Semiconductor Device

Below, by reference to FIGS. 1 to 14, a method for manufacturing a semiconductor device of the present embodiment will be described. FIGS. 1 to 14 are each a cross sectional view for illustrating a manufacturing step of the semiconductor device of the present embodiment. FIGS. 1 to 14 each show a core region (logic circuit region, or low breakdown voltage transistor region) CR, a memory cell region MR, and an I/O region (high breakdown voltage transistor region) HV sequentially from the left-hand side of the drawing.

Figure 35:
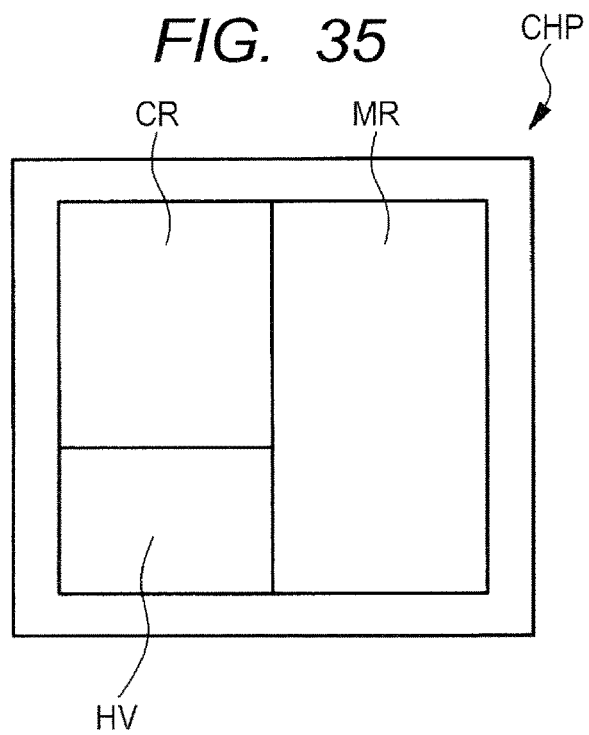
FIG. 35 is a schematic plan view showing the semiconductor device of Third Embodiment.

The core region CR, the memory cell region MR, and the I/O region HV are all present at the top surface of the same semiconductor substrate, and are present at positions not overlapping one another in a plan view. The core region CR is a region for providing therein a low breakdown voltage MISFET forming a control circuit or the like. The I/O region HV is a region for providing therein a high breakdown voltage MISFET forming a circuit for performing input/output with devices outside a semiconductor chip, a power supply circuit, or the like. The arrangement of the regions in the chip is shown in FIG. 35.

The core region CR and the I/O region HV are regions forming peripheral circuit regions. The peripheral circuit is a circuit other than a nonvolatile memory. The peripheral circuit is, for example, in a memory module, a control circuit, a sense amplifier, a column decoder, a row decoder, an input/output circuit with the outside of the module, a power supply circuit, or, outside the memory module, a processor such as a CPU, various analogue circuits, a SRAM (Static Random Access Memory) memory module, or an external input/output circuit.

The memory cell region MR is a region for forming therein a single gate type MONOS (Metal Oxide Nitride Oxide Semiconductor) memory. The MONOS memory is an electrically writable/erasable nonvolatile semiconductor storage device, and is formed of a MISFET including one control gate electrode. The MONOS memory has a trapping insulation film under the gate electrode of the MISFET, uses the charge accumulation state at the trapping insulation film as stored information, and reads out the information as a threshold value of the transistor. The trapping insulation film denotes an insulation film capable of accumulating electric charges (which will be hereinafter mainly referred to as a charge accumulation film). As one example thereof, mention may be made of a silicon nitride film. Implantation/discharge of electric charges into such a charge accumulation film (charge accumulation part, charge holding part, or charge holding film) causes the MISFET to be shifted in threshold value and to operate as a storage element.

The MISFET to be formed in the core region CR is a low breakdown voltage MISFET driven at a lower voltage than that for the MISFET to be formed in the I/O region HV and the memory cell region MR. Herein, a description will be given to the formation of n channel type MISFETs in the core region CR and the I/O region HV. However, in the regions, p channel type MISFETs are also formed.

In the manufacturing steps of the semiconductor device of the present embodiment, first, as shown in FIG. 1, a semiconductor substrate SB including a BOX (Buried Oxide) film BX and a semiconductor layer (SOI layer) SL each of a buried oxide film sequentially formed over the top surface thereof is provided. A lamination substrate formed of the semiconductor substrate SB, the BOX film BX and the semiconductor layer SL forms a SOI (Silicon On Insulator) substrate. The semiconductor substrate SB is formed of, for example, a single crystal silicon (Si). The film thickness of the semiconductor layer SL is, for example, 12 nm.

Subsequently, using a photolithography technology and an etching method, the semiconductor layer SL and the BOX film BX in the memory cell region MR and the I/O region HV are removed. As a result, the top surface of the semiconductor substrate SB in the memory cell region MR and the I/O region HV is exposed from the semiconductor layer SL and the BOX film BX. The semiconductor substrate SB in the region (the memory cell region MR and the I/O region HV) not having the BOX film BX and the semiconductor layer SL is referred to as a bulk substrate.

Subsequently, in a region not shown, an element isolation region for isolating the core region CR, the memory cell region MR, and the I/O region HV from one another is formed. The element isolation region is formed of an insulation film (e.g., a silicon oxide film) embedded in a trench extending from the top surface of the semiconductor substrate SB to an intermediate depth of the semiconductor substrate SB. The element isolation region in the core region CR is formed penetrating through the insulation film IF1, the semiconductor layer SL, and the BOX film BX.

Subsequently, using an ion implantation method, a p type impurity (e.g., B (boron)) is implanted into the top surface of the semiconductor substrate SB, thereby to form wells W1 to W3 of p type semiconductor regions in the top surface of the semiconductor substrate SB. Herein, the ion implantation step is performed separately on each of the core region CR, the memory cell region MR, and the I/O region HV. Thus, the wells W1 to W3 having mutually different impurity densities are differently formed. As a result, the well W1 is formed at the top surface of the semiconductor substrate SB in the core region CR, the well W2 is formed at the top surface of the semiconductor substrate SB in the memory cell region MR, and the well W3 is formed at the top surface of the semiconductor substrate SB in the I/O region HV.

Subsequently, using, for example, a thermal oxidation method, there is formed an insulation film IF1 covering the top surface of the semiconductor layer SL in the core region CR, and the top surface of the semiconductor substrate SB in the memory cell region MR and the I/O region HV. The insulation film IF1 is formed of, for example, a silicon oxide film.

Figure 2:
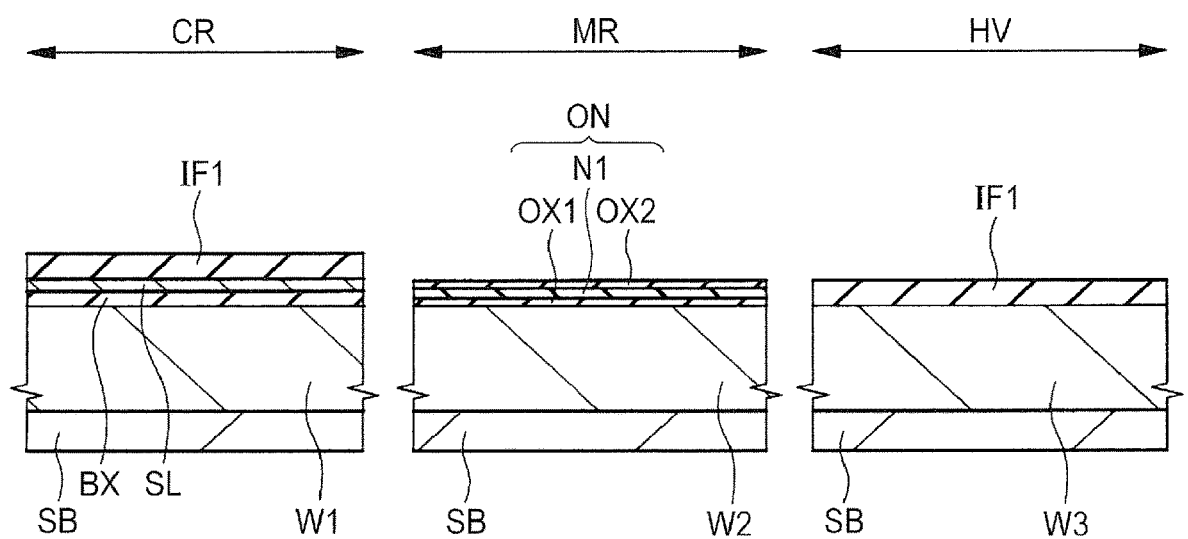
FIG. 2 is a cross sectional view of the semiconductor device during a manufacturing step following FIG. 1.

Then, as shown in FIG. 2, using a photoresist film (not shown) exposing the memory cell region MR, and covering the core region CR and the I/O region HV as a mask (implantation inhibiting mask), a p type impurity is selectively implanted into the top surface of the semiconductor substrate SB in the memory cell region MR by an ion implantation method, or the like. As a result, a channel region (not shown) is formed at the top surface of the semiconductor substrate SB in the memory cell region MR. Then, using the photoresist film as a mask (protective mask), etching is performed, thereby to remove the insulation film IF1 in the memory cell region MR. Herein, by performing wet etching using, for example, HF (hydrofluoric acid), the insulation film IF1 in the memory cell region MR is removed. Subsequently, the photoresist film is removed.

Subsequently, an ONO film ON is formed over the semiconductor substrate SB. Namely, using, for example, a thermal oxidation method, a silicon oxide film OX1 is formed. Then, a silicon nitride film N1 and a silicon oxide film OX2 are sequentially formed using, for example, a CVD (Chemical Vapor Deposition) method. This results in the formation of an ONO film ON formed of the silicon oxide film OX1, the silicon nitride film N1, and the silicon oxide film OX2. As a result, the ONO films ON are formed over the semiconductor layer SL in the core region CR, over the semiconductor substrate SB in the memory cell region MR, and over the insulation film IF1 in the I/O region HV, respectively. The film thickness of the silicon oxide film OX1 is, for example, 2 nm, the film thickness of the silicon nitride film N1 is, for example, 8 nm, and the film thickness of the silicon oxide film OX2 is, for example, 3 nm.

Subsequently, a photoresist film (not shown) covering the ONO film ON in the memory cell region MR is formed. Then, the silicon oxide film OX2 in the core region CR and the I/O region HV is removed by performing wet etching using, for example, HF (hydrofluoric acid). Then, the photoresist film is removed. Subsequently, by performing wet etching using, for example, phosphoric acid, the silicon nitride film N1 in the core region CR and the I/O region HV is removed. Subsequently, using a photolithography technology and an etching method, the silicon oxide film OX1 and the insulation film IF1 in the core region CR are removed. By this step, the ONO film ON is left only in the memory cell region MR.

Figure 3:
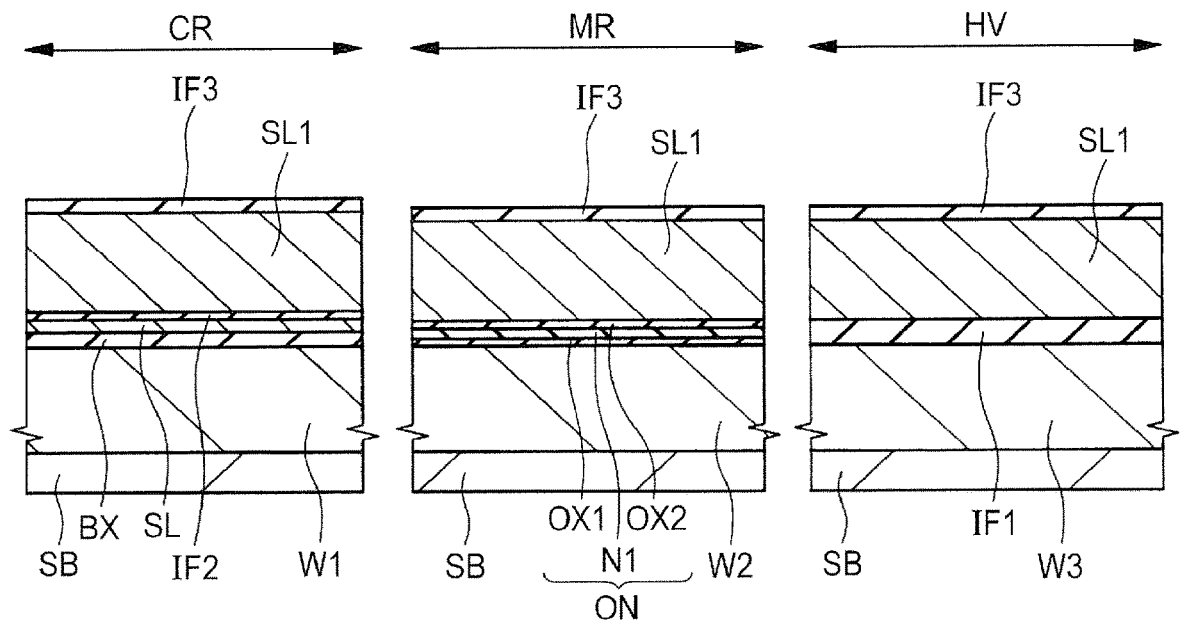
FIG. 3 is a cross sectional view of the semiconductor device during a manufacturing step following FIG. 2.

Then, as shown in FIG. 3, using, for example, a thermal oxidation method, an insulation film IF2 is formed over the top surface of the semiconductor layer SL in the core region CR. The insulation film IF2 is formed of, for example, a silicon oxide film, and has a smaller film thickness than that of the insulation film IF1. Subsequently, entirely over the top surface of the semiconductor substrate SB, a polysilicon film SL1 and an insulation film IF3 are sequentially formed by, for example, a CVD method. The insulation film IF3 is formed of, for example, a silicon nitride film.

Figure 4:
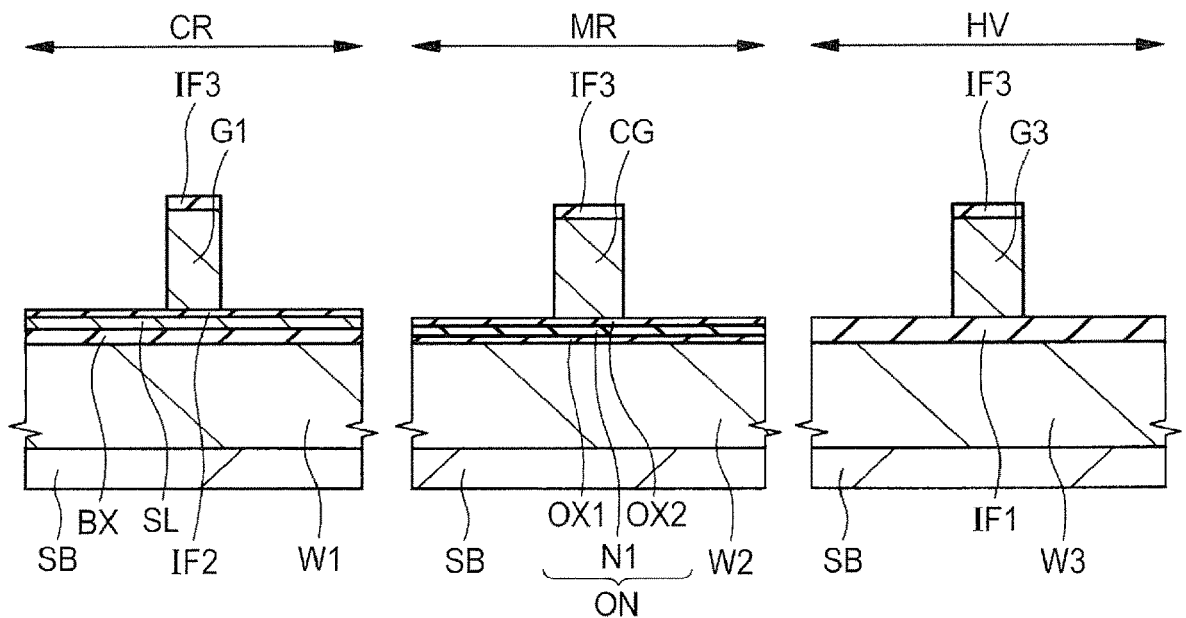
FIG. 4 is a cross sectional view of the semiconductor device during a manufacturing step following FIG. 3.

Then, as shown in FIG. 4, using a photolithography technology and a dry etching method, the insulation film IF3 and the polysilicon film SL1 are processed, thereby to expose the top surface of the insulation film IF2, the top surface of the ONO film ON, and the top surface of the insulation film IF1, respectively. As a result, over the semiconductor layer SL in the core region CR, a gate electrode G1 formed of the polysilicon film SL1 is formed via the insulation film IF2. Further, over the semiconductor substrate SB in the memory cell region MR, a control gate electrode CG formed of the polysilicon film SL1 is formed via the ONO film ON. Further, over the semiconductor substrate SB in the I/O region HV, a gate electrode G3 formed of the polysilicon film SL1 is formed via the insulation film IF1. The gate electrode G3 has a larger width (gate length) than that of the gate electrode G1.

Thus, by performing etching using the photoresist film, the hard mask film, or the like, processed into a desired shape by light exposure and development as a mask, the underlying film is processed into a desired shape. This is referred to as patterning. Herein, etching is performed under the conditions with a high selectivity so that dry etching is stopped at the top surface of the silicon oxide film. Patterning of the insulation film IF2, the ONO film ON, and the insulation film IF1 is not performed. Therefore, the silicon layer SL is not cut away by dry etching. Respective top surfaces of the gate electrodes G1 and G3, and the control gate electrode CG are covered with the insulation film IF3 of a hard mask (cap insulation film).

Figure 5:
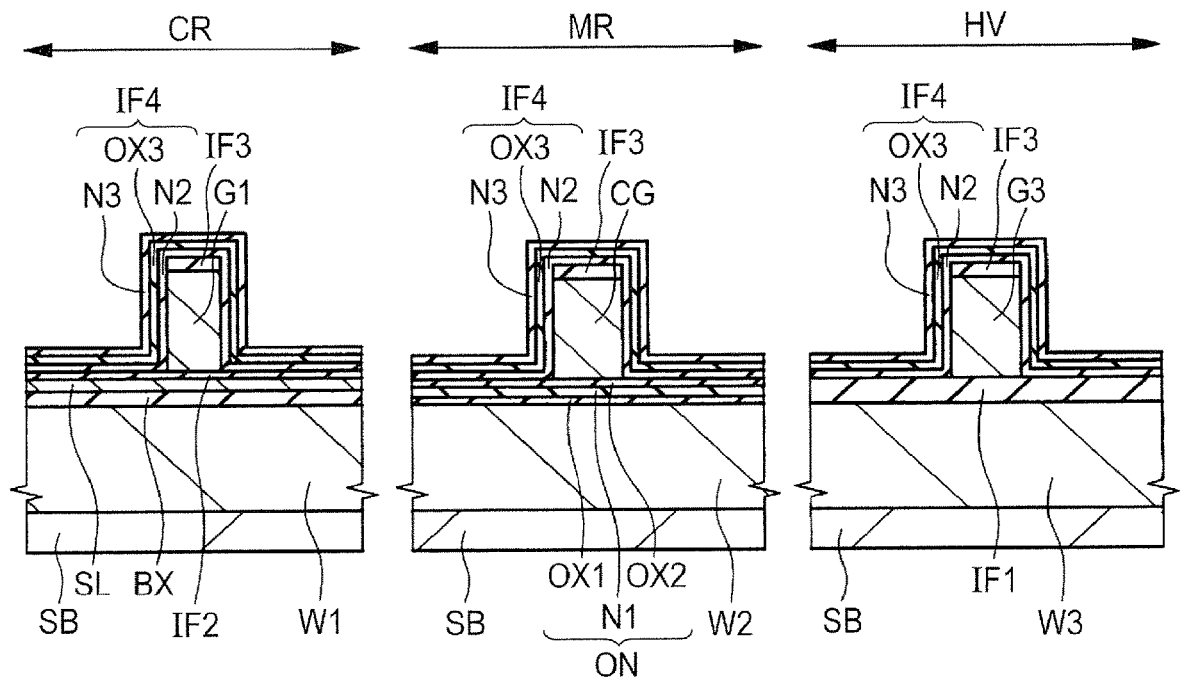
FIG. 5 is a cross sectional view of the semiconductor device during a manufacturing step following FIG. 4.

Then, as shown in FIG. 5, an insulation film IF4 having a role of protecting respective side surfaces of the gate electrodes G1 and G3, and the control gate electrode CG is formed (deposited) entirely over the top surface of the semiconductor substrate SB, using, for example, a CVD method. The insulation film IF4 is a lamination film formed of a silicon nitride film N2, a silicon oxide film OX3, and a silicon nitride film N3 sequentially stacked from the top surface side of the semiconductor substrate SB. Incidentally, the insulation film IF4 may be of a monolayer structure formed of only, for example, a silicon oxide film or a silicon nitride film.

The insulation film IF4 covers respective side surfaces and top surfaces of the gate electrodes G1 and G3, and the control gate electrode CG, covers the side surface and the top surface of the insulation film IF3, and covers respective top surfaces of the insulation films IF1 and IF2, and the ONO film ON. Each film thickness of the silicon nitride film N2, the silicon oxide film OX3, and the silicon nitride film N3 is, for example, 3 nm. Respective side surfaces of the gate electrodes G1 and G3, and the control gate electrode CG are covered with the silicon nitride film N2, the silicon oxide film OX3, and the silicon nitride film N3 sequentially formed from the side of their respective side surfaces.

Figure 6:
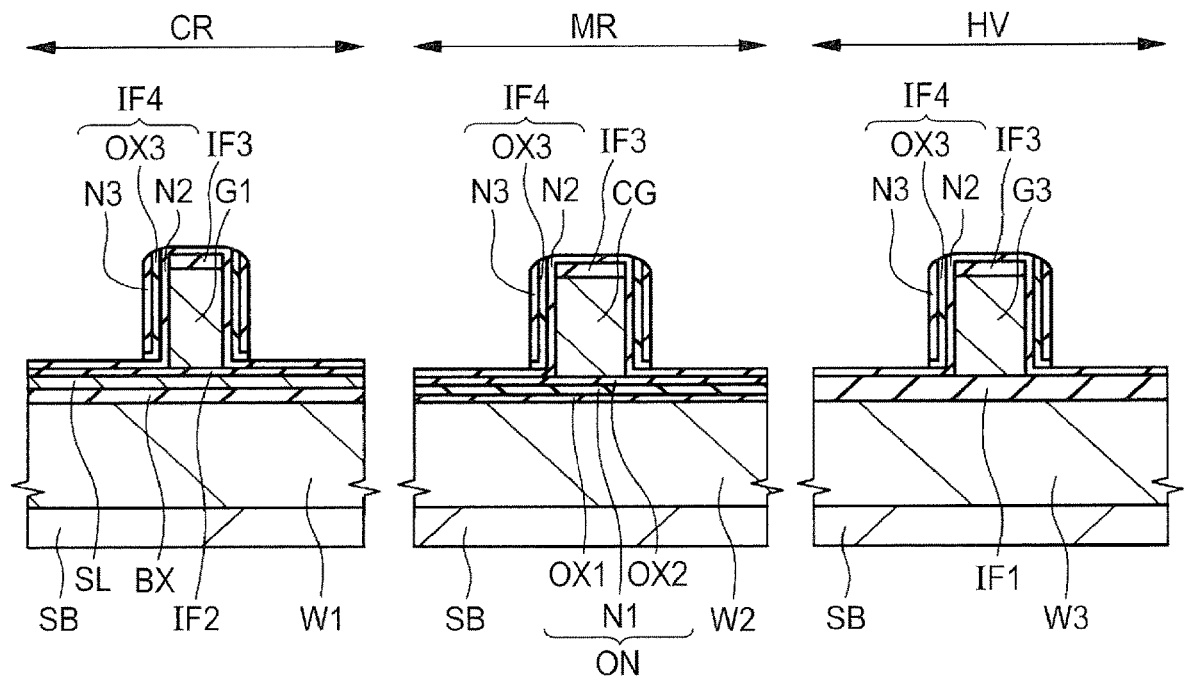
FIG. 6 is a cross sectional view of the semiconductor device during a manufacturing step following FIG. 5.

Then, as shown in FIG. 6, dry etching of anisotropic etching is performed, thereby to remove respective portions of the silicon nitride film N3 and the silicon oxide film OX3. As a result, the top surface of the silicon nitride film N2 formed along the top surface of the semiconductor substrate SB is exposed. In other words, only the silicon nitride film N2 is left over the insulation film IF3. For this reason, the silicon nitride film N3 and the silicon oxide film OX3 are left only at respective side surfaces of the gate electrodes G1 and G3, and the control gate electrode CG. The portions of the silicon nitride film N2 not removed herein have a role of preventing the oxidation of the top surface of the semiconductor substrate SB, the top surface of the silicon layer, and respective side surfaces of the gate electrodes G1 and G3, and the control gate electrode CG in steps from now on.

Figure 7:
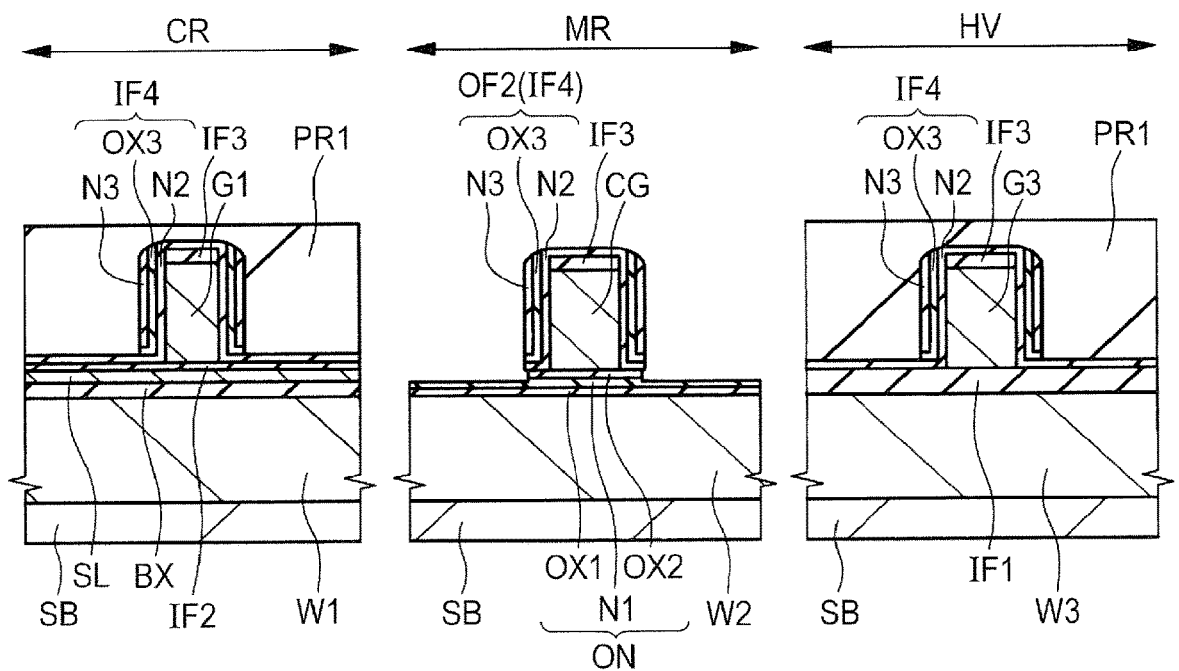
FIG. 7 is a cross sectional view of the semiconductor device during a manufacturing step following FIG. 6.

Then, as shown in FIG. 7, a photoresist film (protective film) PR1 covering the core region CR and the I/O region HV, and exposing the memory cell region MR is formed. Subsequently, dry etching is performed using the photoresist film PR1 as a mask. As a result, in the memory cell region MR, the silicon nitride film N2 exposed from the silicon nitride film N3 and the silicon oxide film OX3, and the silicon oxide film OX2 and the silicon nitride film N1 exposed from the control gate electrode CG, the silicon nitride film N3, and the silicon oxide film OX3 are removed. However, the silicon nitride film N1 exposed from the control gate electrode CG, the silicon nitride film N3, and the silicon oxide film OX3 is not entirely removed, and the top surface of the silicon nitride film N1 is retreated, and a part of the film thickness of the silicon nitride film N1 is left. Accordingly, the top surface of the silicon oxide film OX1 in the memory cell region MR is not exposed.

Herein, in the core region CR and the I/O region HV, the silicon nitride film N1 with the same thickness as that of the silicon nitride film N2 extending in the direction (the transverse direction) along the top surface of the semiconductor substrate SB is left. Namely, by the dry etching, of the total film thickness (8-nm) portion of the silicon nitride film N1, for example, the 5-nm thick portion is etched back, and the 3-nm thick portion is left. Thus, a part of the silicon nitride film N1 is left. This can equalize the state of respective film structures with the insulation film left lateral to the gate electrode G1 over the core region CR, the insulation film left lateral to the control gate electrode CG in the memory cell region MR, and the insulation film left lateral to the gate electrode G3 in the I/O region HV. As a result, by the steps from this point, it is possible to form the elements over the SOI substrate, and the elements over the bulk substrate with precision. In other words, it becomes easy to form respective merged elements with desirable characteristics.

An insulation film IF4 formed of the silicon nitride film N2, the silicon oxide film OX3, and the silicon nitride film N3 covering the side surface of the control gate electrode CG forms an offset spacer OF2. In the dry etching step, the insulation film IF3 and the offset spacer OF2 in the memory cell region MR are also used as a mask. Dry etching using the offset spacer OF2 covering the side surface of the control gate electrode CG as a mask was performed. As a result, the ends in the transverse direction (gate length direction) of the silicon oxide film OX2 processed by the dry etching protrude outwardly from the side surfaces of the control gate electrode CG, respectively.

Figure 8:
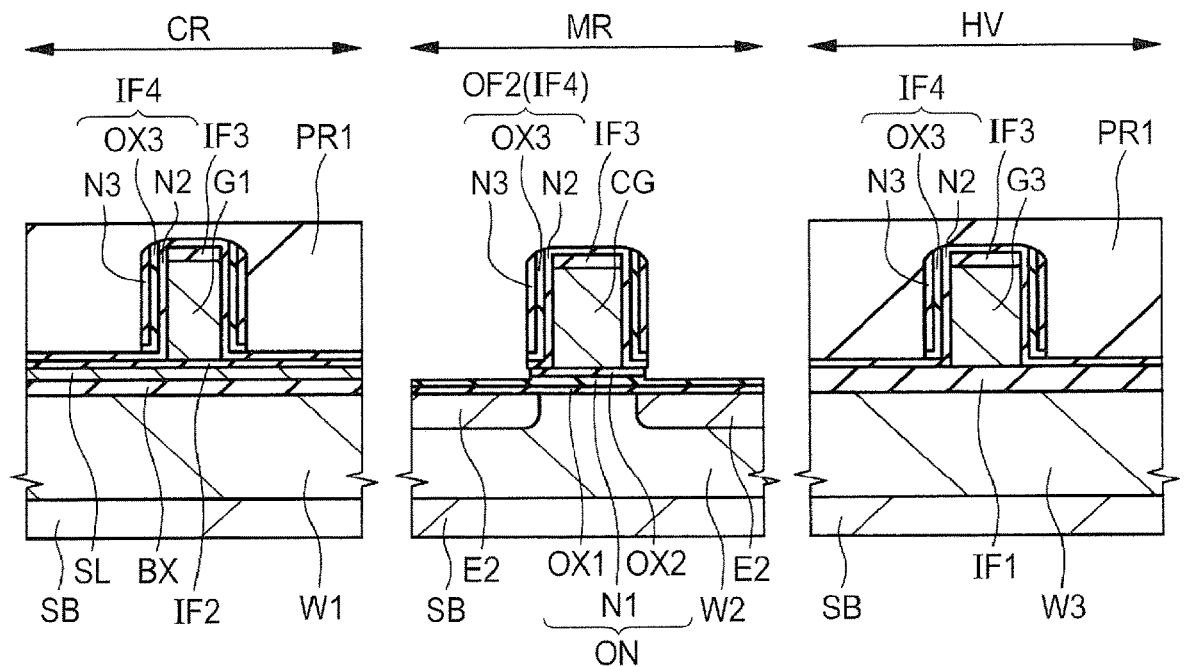
FIG. 8 is a cross sectional view of the semiconductor device during a manufacturing step following FIG. 7.

Then, as shown in FIG. 8, using the photoresist film PR1 as a mask, an n type impurity (e.g., As (arsenic) or P (phosphorus)) is implanted into the top surface of the semiconductor substrate SB. As a result, a pair of extension regions E2 are formed at the top surface of the semiconductor substrate SB in the memory cell region MR. Each extension region E2 is an n type semiconductor region shallower in depth than the well W2.

Figure 9:
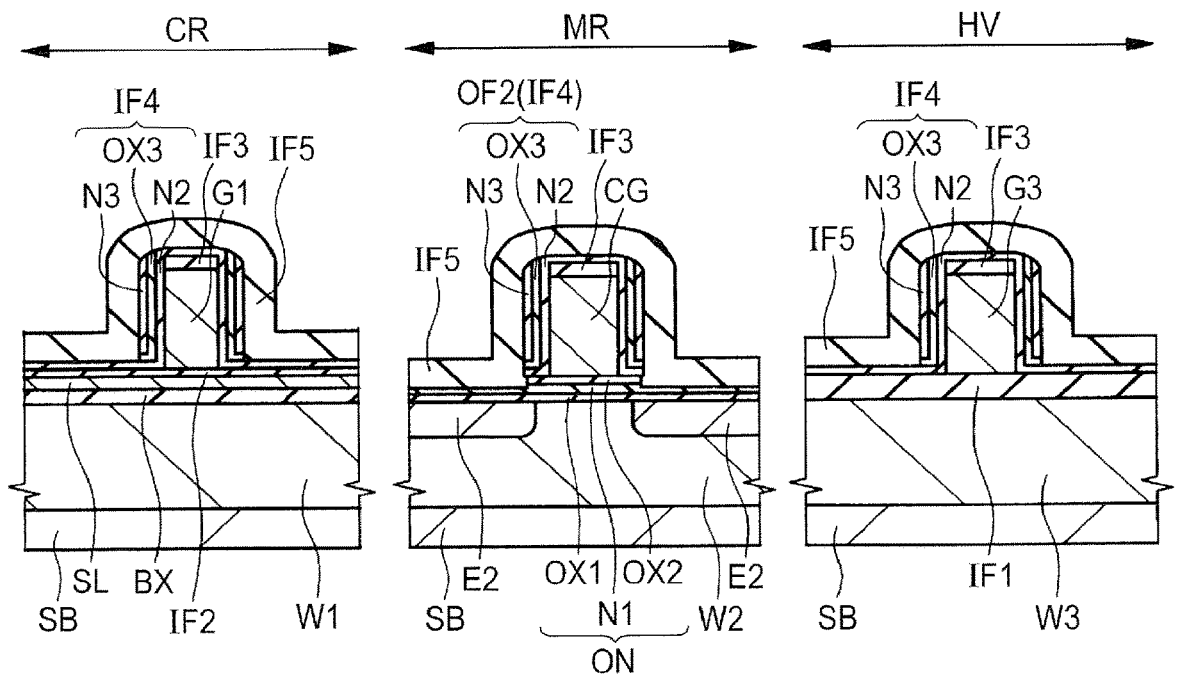
FIG. 9 is a cross sectional view of the semiconductor device during a manufacturing step following FIG. 8.

Then, as shown in FIG. 9, the photoresist film PR1 is removed. Then, entirely over the top surface of the semiconductor substrate SB, using, for example, a CVD method, an insulation film IF5 is formed (deposited). The insulation film IF5 is formed of, for example, a silicon nitride film. The insulation film IF5 is used as a protective film for preventing the formation of an epitaxial layer in the memory cell region MR and the I/O region HV in the later epitaxial growth step in the core region CR.

Figure 10:
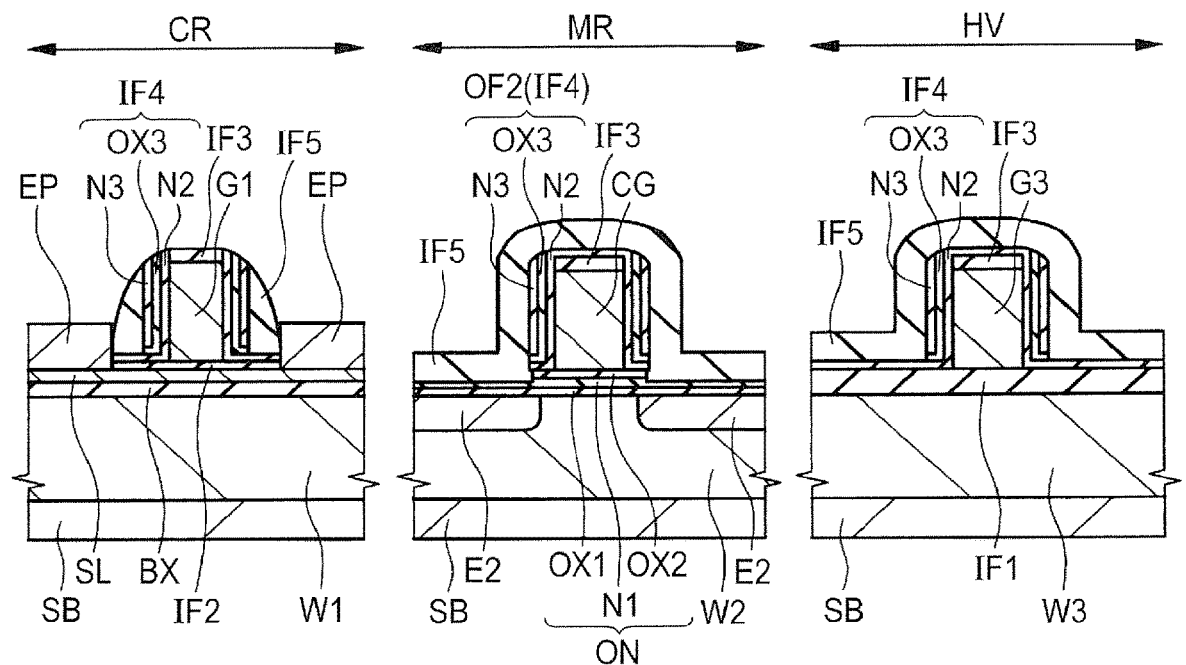
FIG. 10 is a cross sectional view of the semiconductor device during a manufacturing step following FIG. 9.

Then, as shown in FIG. 10, using a photolithography technology and a dry etching method, a part of the insulation film IF5 in the core region CR is removed, thereby to expose the top surface of the insulation film IF3. As a result, at each side surface of the gate electrode G1, a sidewall formed of the insulation film IF5 is formed via the lamination film formed of the silicon nitride film N2, the silicon oxide film OX3, and the silicon nitride film N3. Herein, the insulation film IF5 in the memory cell region MR and the I/O region HV is protected by a photoresist film, and hence is not removed. Subsequently, after removing the photoresist film, the insulation film IF2 exposed from the sidewall, or the like is removed, thereby to expose a part of the top surface of the semiconductor layer SL.

Subsequently, using an epitaxial growth method, an epitaxial layer (semiconductor layer or raised layer) EP is formed over the semiconductor layer SL. Namely, a pair of epitaxial layers EP are formed over the portions of the semiconductor layer SL lateral to the gate electrode G1. The memory cell region MR and the I/O region HV are covered with the insulation film IF5. For this reason, the epitaxial layer is not formed over respective portions of the semiconductor substrate SB in the memory cell region MR and the I/O region HV.

Figure 11:
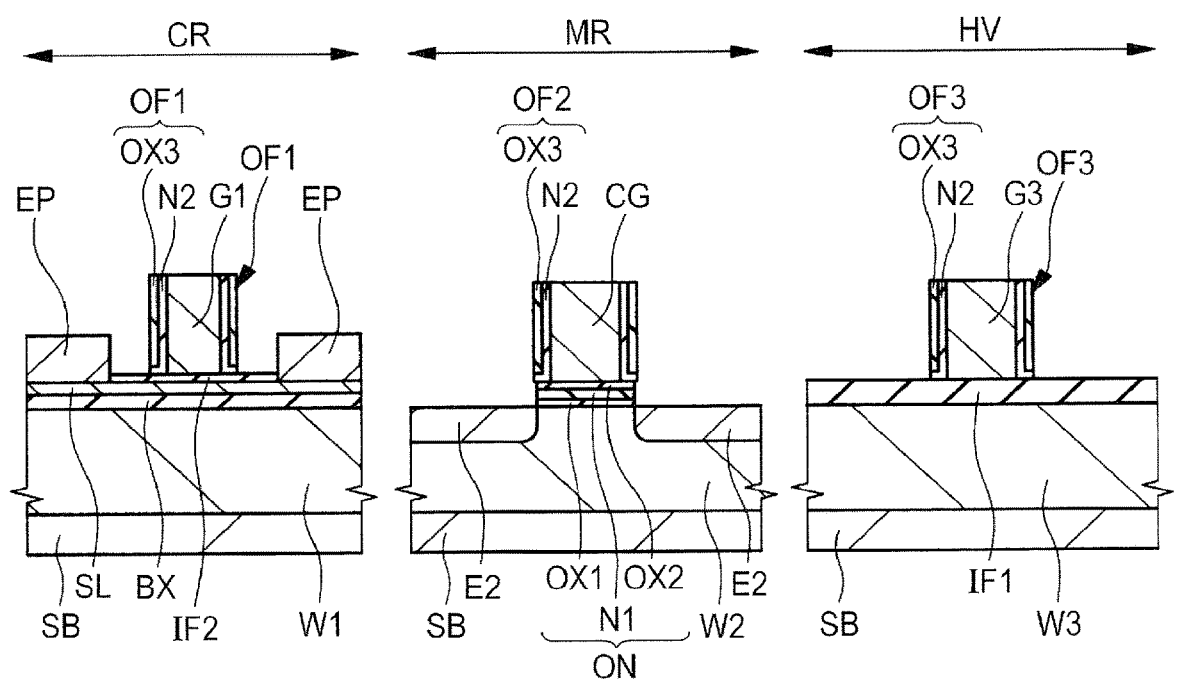
FIG. 11 is a cross sectional view of the semiconductor device during a manufacturing step following FIG. 10.

Then, as shown in FIG. 11, by an etching method, the insulation films IF5 and IF3, and the silicon nitride film N3 in the core region CR, the memory cell region MR, and the I/O region HV are removed. Herein, dry etching or wet etching, or etching of a combination thereof is performed. For wet etching, for example, phosphoric acid is used as a chemical. As a result, the side surface of the silicon oxide film OX3, the top surface of the gate electrode G1, the top surface of the control gate electrode CG, and the top surface of the gate electrode G3 are exposed. In the etching step, in the memory cell region MR, the silicon nitride film N1 and the silicon oxide film OX1 exposed from the control gate electrode CG and the offset spacer OF2 are removed, respectively, thereby to expose the top surface of the semiconductor substrate SB.

Herein, etching was performed using the offset spacer OF2 covering the side surface of the control gate electrode CG as a mask (etching protective mask). As a result, the ends on the opposite sides in the transverse direction (gate length direction) of the ONO film ON including the silicon nitride film N1 and the silicon oxide film OX1 processed by the etching protrude outwardly from the side surfaces of the control gate electrode CG, respectively. In other words, in the transverse direction, the ONO film ON is terminated at a position not overlapping the control gate electrode CG in a plan view. Namely, in a plan view, the terminations of the control gate electrode CG and the ONO film ON are separated from each other. In other words, in the gate length direction of the control gate electrode CG, the width of the ONO film ON is larger than the width of the control gate electrode CG.

In the core region CR, the silicon nitride film N2 and the silicon oxide film OX3 covering each side surface of the gate electrode G1 forms an offset spacer OF1. Whereas, in the I/O region HV, the silicon nitride film N2 and the silicon oxide film OX3 covering each side surface of the gate electrode G3 forms an offset spacer OF3. Each width of the offset spacers OF1, OF2, and OF3 in the gate length direction of each gate electrode is, for example, 6 nm.

Figure 12:
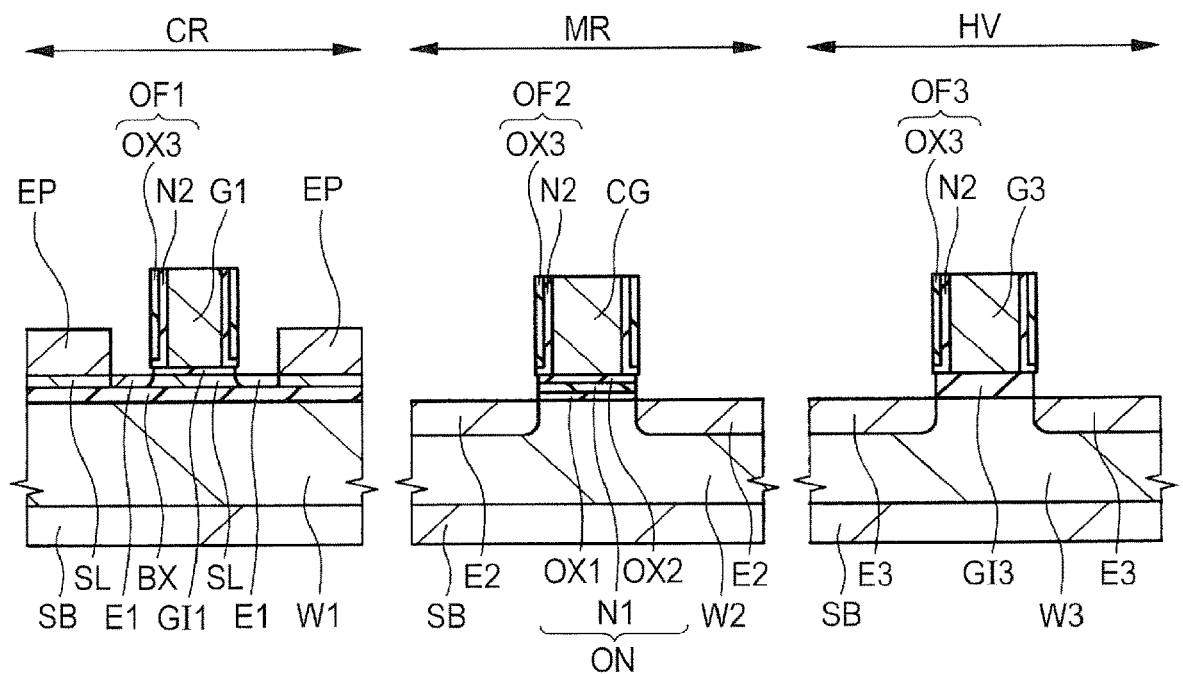
FIG. 12 is a cross sectional view of the semiconductor device during a manufacturing step following FIG. 11.

Then, as shown in FIG. 12, for example, by performing etching, respective portions of the insulation films IF1 and IF2 are removed. Namely, the insulation film IF2 exposed from the gate electrode G1 and the offset spacer OF1 in the core region CR is removed, thereby to expose the top surface of the semiconductor layer SL. As a result, a gate insulation film GI1 formed of the insulation film IF2 is formed. Further, in the etching step, the insulation film IF1 exposed from the gate electrode G3 and the offset spacer OF3 in the I/O region HV is removed, thereby to expose the top surface of the semiconductor substrate SB. As a result, a gate insulation film GI3 formed of the insulation film IF1 is formed.

Herein, etching was performed using the offset spacer OF1 covering the side surface of the gate electrode G1 as a mask. As a result, the ends on the opposite sides in the transverse direction (gate length direction) of the gate insulation film GI1 formed by the etching protrude outwardly from the side surfaces of the gate electrode G1, respectively In other words, in the transverse direction, the gate insulation film GI1 is terminated at a position not overlapping the gate electrode G1 in a plan view. Namely, in a plan view, respective terminations of the gate electrode G1 and the gate insulation film GI1 are separated from each other. In other words, in the gate length direction of the gate electrode G1, the width of the gate insulation film GI1 is larger than the width of the gate electrode G1.

Similarly, herein, etching was performed using the offset spacer OF3 covering the side surface of the gate electrode G3 as a mask. As a result, the ends on the opposite sides in the transverse direction (gate length direction) of the gate insulation film GI3 formed by the etching protrude outwardly from the side surfaces of the gate electrode G3, respectively. In other words, in the transverse direction, the gate insulation film GI3 is terminated at a position not overlapping the gate electrode G3 in a plan view. Namely, in a plan view, respective terminations of the gate electrode G3 and the gate insulation film GI3 are separated from each other. In other words, in the gate length direction of the gate electrode G3, the width of the gate insulation film GI3 is larger than the width of the gate electrode G3.

Subsequently, using a photolithography technology and an ion implantation method, an n type impurity (e.g., As (arsenic) or P (phosphorus)) is implanted into each of the top surface of the semiconductor layer SL in the core region CR and the top surface of the semiconductor substrate SB in the I/O region HV. At this step, each of the gate electrodes G1 and G2, the offset spacers OF1 and OF3 is used as an implantation inhibiting mask. As a result, a pair of extension regions E1 are formed in the semiconductor layer SL in the core region CR, and a pair of extension regions E3 are formed in the top surface of the semiconductor substrate SB in the I/O region HV. The offset spacer OF1 has a role of adjusting the distance between the pair of extension regions E1 formed at the top surface of the semiconductor layer SL. In other words, provision of the offset spacer OF1 for use as a mask for ion implantation can prevent the pair of extension regions E1 from excessively accessing each other. The offset spacers OF2 and OF3 also have the same role.

Incidentally, herein, an n type impurity is also implanted into the epitaxial layer EP, thereby to form a part of the extension region E1. However, the semiconductor region formed in the epitaxial layer EP is not shown. The extension region E1 is formed from the top surface through to the lower surface of the semiconductor layer SL.

Figure 13:
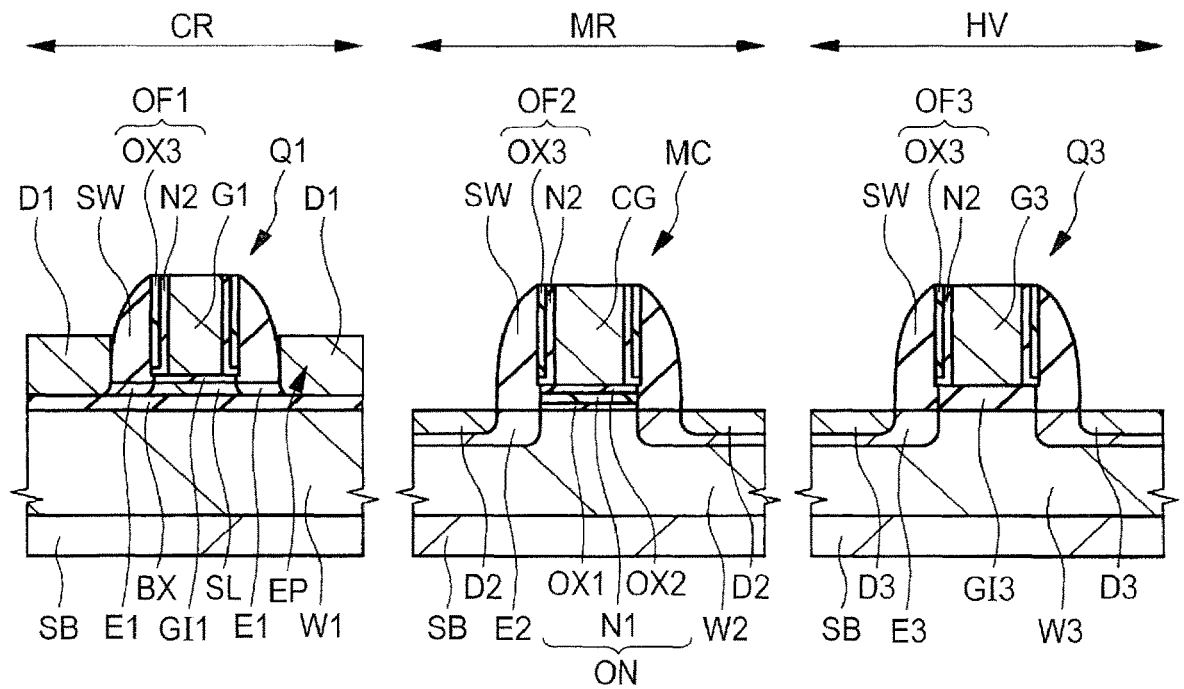
FIG. 13 is a cross sectional view of the semiconductor device during a manufacturing step following FIG. 12.

Then, as shown in FIG. 13, a sidewall SW covering each side surface of the gate electrode G1, the control gate electrode CG, and the gate electrode G3 is formed. The sidewall SW is formed in the following manner: for example, over the semiconductor substrate SB, a silicon nitride film is deposited by a CVD method, or the like; then, anisotropic etching is performed, thereby to remove a part of the silicon nitride film; as a result, the silicon nitride film left at the side surface of each gate electrode forms the sidewall SW. The sidewall SW in the core region CR is formed between the offset spacer OF1 and the epitaxial layer EP. Namely, the sidewall SW is formed at the side surface of the gate electrode G1 via the offset spacer OF1, the sidewall SW is formed at the side surface of the control gate electrode CG via the offset spacer OF2, and the sidewall SW is formed at the side surface of the gate electrode G3 via the offset spacer OF3.

Subsequently, an n type impurity (e.g., As (arsenic) or P (phosphorus)) is implanted into the epitaxial layer EP and into the semiconductor layer SL in the core region CR, into respective top surfaces of the semiconductor substrate SB in the memory cell region MR and the I/O region HV using the offset spacers OF1 to OF3, the sidewall SW, and the like as a mask.

As a result, a pair of diffusion regions D1 are formed in the epitaxial layer EP and in the semiconductor layer SL immediately under the epitaxial layer EP in the core region CR. Whereas, diffusion regions D2 are formed at the top surface of the semiconductor substrate SB in the memory cell region MR. Further, a pair of diffusion regions D3 are formed at the top surface of the semiconductor substrate SB in the I/O region HV.

The diffusion regions D1 are formed from the top surface of the epitaxial layer EP through to the lower surface of the semiconductor layer SL. Further, the diffusion regions D2 and D3 are formed with a shallower depth than that of each of the extension regions E2 and E3. The diffusion regions D1 to D3 are each an n type semiconductor region with a higher impurity density than that of any of the extension regions E1 to E3. In the gate length direction, each diffusion region D1 is formed at a position more distant from the gate electrode G1 than the extension region E1, the diffusion region D2 is formed at a position more distant from the control gate electrode CG than the extension region E2, and the diffusion region D3 is formed at a position more distant from the gate electrode G3 than the extension region E3.

The extension regions E1 and the diffusion regions D1 adjacent to each other, respectively, in the core region CR form the source/drain regions, respectively. Whereas, the extension regions E2 and the diffusion regions D2 adjacent to each other, respectively, in the memory cell region MR form the source/drain regions, respectively. Further, the extension regions E3 and the diffusion regions D3 adjacent to each other, respectively, in the I/O region HV form the source/drain regions, respectively.

The source/drain regions and the gate electrode G1 in the core region CR form a low breakdown voltage transistor Q1. The source/drain regions and the control gate electrode CG in the memory cell region MR form a MONOS memory MC. The source/drain regions, and the gate electrode G3 in the I/O region HV form a high breakdown voltage transistor Q3. The MONOS memory MC is a memory cell of a nonvolatile memory including the silicon nitride film N1 in the ONO film ON as a charge accumulation film (charge accumulation part).

Figure 14:
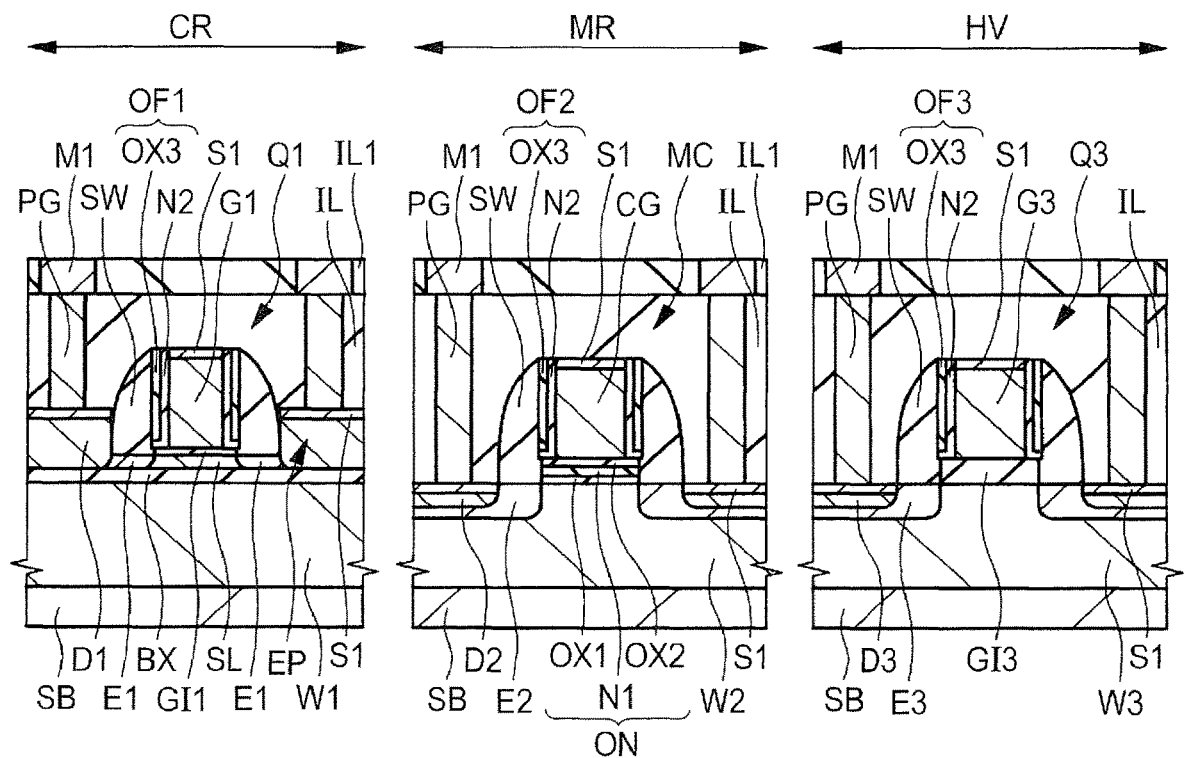
FIG. 14 is a cross sectional view of the semiconductor device during a manufacturing step following FIG. 13.

Then, as shown in FIG. 14, a salicide process is performed, thereby to form silicide layers S1 at the top surface of the gate electrode G1, the top surface of the control gate electrode CG, the top surface of the gate electrode G3, and respective surfaces of the diffusion regions D1 to D3. In the salicide process, first, using a sputtering method, a metal film including, for example, Co (cobalt) or N1 (nickel) is formed entirely over the top surface of the semiconductor substrate SB. Then, the semiconductor substrate SB is heated, thereby to allow the metal film and the semiconductor to react with each other. As a result, the silicide layer S1 is formed. Subsequently, the unreacted portions of the metal film are removed.

Subsequently, over the semiconductor substrate SB, an interlayer insulation film IL is formed in such a manner as to cover the low breakdown voltage transistor Q1, the MONOS memory MC, and the high breakdown voltage transistor Q3. The interlayer insulation film IL is formed in the following manner. Entirely over the top surface of the semiconductor substrate SB, using, for example, a CVD method, a silicon oxide film is formed. The top surface of the silicon oxide film is polished using a CMP (Chemical Mechanical Polishing) method, or the like. The film thickness of the interlayer insulation film IL is larger than each thickness of the gate electrode G1, the control gate electrode CG, and the gate electrode G3. Incidentally, before forming the interlayer insulation film IL, a liner insulation film formed of, for example, a silicon nitride film, and covering the low breakdown voltage transistor Q1, the MONOS memory MC, and the high breakdown voltage transistor Q3 may be formed by, for example, a CVD method, but herein is not shown.

Subsequently, using a photolithography technology and a dry etching method, a plurality of contact holes penetrating through the interlayer insulation film IL are formed. Then, a plurality of plugs (contact plugs or conductive coupling parts) PG filling the contact holes are formed. Herein, a plurality of contact holes are formed in such a manner as to cause respective top surfaces of the gate electrode G1, the control gate electrode CG, the gate electrode G3, and the diffusion regions D1 to D3 to be exposed from the interlayer insulation film IL. At the bottom surface of each contact hole, the silicide layer S1 is exposed. The plugs PG are electrically coupled via the silicide layer S1 with the gate electrode G1, the control gate electrode CG, the gate electrode G3, or the diffusion regions D1 to D3, respectively.

In the plug PG formation step, over the interlayer insulation film IL including the insides of the plurality of contact holes, a metal film mainly including W (tungsten) is formed. Then, the metal film over the interlayer insulation film IL is polished by, for example, a CMP method, thereby to be removed, so that the top surface of the interlayer insulation film IL is exposed. As a result, a plurality of plugs PG each formed of the metal film embedded in each of the plurality of contact holes are formed. The plug PG is formed of, for example, a lamination film including a titanium nitride film covering the side surface and the bottom surface in the contact hole, and a tungsten film embedded in the contact hole via the titanium nitride film.

Subsequently, over the interlayer insulation film IL including the plugs PG embedded therein, a first wiring layer including the first-layer wire M1 is formed. The wire M1 can be formed using a so-called single damascene technology. Namely, over the interlayer insulation film IL, using a CVD method, or the like, the interlayer insulation film IL1 formed of, for example, a silicon oxide film is formed. Then, the interlayer insulation film IL1 is processed, thereby to form a plurality of wire trenches penetrating through the interlayer insulation film IL1. The interlayer insulation film IL1 is formed of, for example, a silicon oxide film. Subsequently, a conductor film formed mainly of Cu (copper) is embedded in the wire trenches. Then, by a CMP method, or the like, the excess portions of the conductor film over the interlayer insulation film IL1 are removed. As a result, the wire M1 formed of the conductor film embedded in the wire trenches is formed.

The bottom surface of the wire M1 is coupled with the top surface of the plug PG. Although the subsequent steps are not shown, over the first wiring layer, a second wiring layer, a third wiring layer, and the like are sequentially formed, thereby to form a lamination wiring layer. Then, the semiconductor wafer is singulated by a dicing step, resulting in a plurality of semiconductor chips. In the manner described up to this point, the semiconductor device of the present embodiment is formed. Incidentally, conceivably, in the completed semiconductor device, in the gate length direction of the control gate electrode CG, the end of the ONO film ON is retreated from the end of the offset spacer OF2 toward the control gate electrode CG side.

Description of the Operation of a Memory Cell

A MONOS memory MC is a kind of nonvolatile memory electrically rewritable both in the write operation and the erase operation, and is also referred to as an electrically erasable programmable read-only memory. For the write operation and the erase operation of the MONOS memory MC, for example, the Fowler-Nordheim type tunneling phenomenon is used. Incidentally, it is also possible to allow the write operation or the erase operation using hot electrons or hot holes.

At the time of the write operation of the MONOS memory MC, or the like, the MONOS memory MC is applied with a high potential difference (about 12 V). For this reason, a relatively higher breakdown voltage transistor is required. As the high breakdown voltage transistor, for example, the high breakdown voltage transistor Q3 shown in FIG. 14 is used.

Herein, a description will be given to the erase, write, and read operations of the 1-cell 1-transistor type memory cell.

First, the erase operation will be described. For example, a consideration will be given to the case of erasure of the data stored in the MONOS memory MC as the memory cell (selected memory cell) from which data is erased. The electric potential of the selected well W2 is set at 1.5 V; the electric potential of the word line, in other words, the control gate electrode CG of the MONOS memory MC, at −8.5 V; the electric potential of the source line, in other words, the source region of the MONOS memory MC, at 1.5 V; and the data line, in other words, the drain region of the MONOS memory MC is made floating. Then, the electric charges accumulated in the charge accumulation film (silicon nitride film N1) of the MONOS memory MC are drawn toward the semiconductor substrate SB side, so that data is erased.

Then, the write operation will be described. For example, a consideration will be given to the case of write of the data to the MONOS memory MC as the memory cell (selected memory cell) to which data is written. In the selected MONOS memory MC, the electric potential of the well W2 is set at −10.5 V; the electric potential of the control gate electrode CG, at 1.5 V; the electric potential of the source region, at −10.5 V; and the drain region is made floating. Then, electric charges are implanted into the charge accumulation film (silicon nitride film N1) of the MONOS memory MC, so that data is written.

Then, the read operation will be described. For example, data "1" is written into the MONOS memory MC, so that the threshold voltage of the transistor increases. In addition, other MONOS memories MC have data "0", so that the threshold voltages of the transistors are reduced. In this state, when data is read, the electric potential of the well W2 of the selected MONOS memory MC is set at −2 V; the electric potential of the control gate electrode CG, at 0 V; the electric potential of the source region, at 0 V; and the electric potential of the drain region, at 1 V. As a result, the data of the MONOS memory MC is read. In this case, the threshold voltage of the data-written MONOS memory MC is high, and the threshold voltages of other MONOS memories MC from which data has been erased are reduced. For this reason, it is possible to determine whether data is written, or not.

Description of Effects of the Present Embodiment

Figure 51:
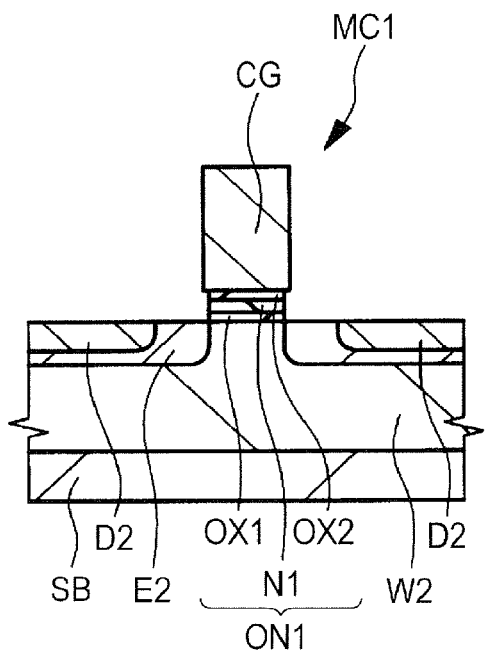
FIG. 51 is a cross sectional view showing a semiconductor device of Comparative Example.
Figure 52:
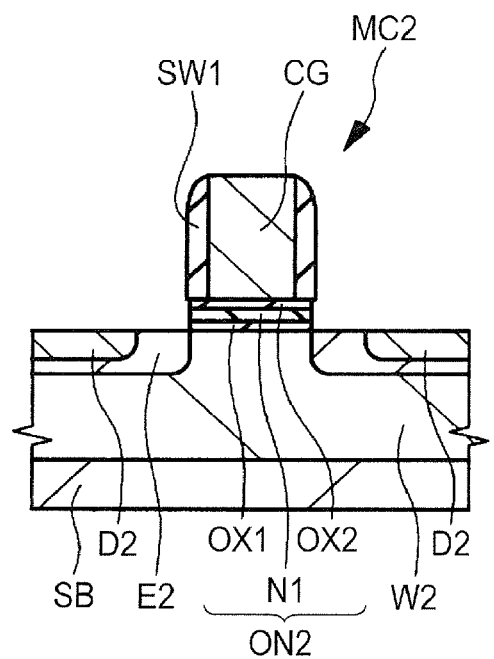
FIG. 52 is a cross sectional view showing the semiconductor device of Comparative Example.

Below, by reference to FIGS. 51 and 52, the effects of the present embodiment will be described. FIGS. 51 and 52 are each a cross sectional view showing a semiconductor device of Comparative Example. FIGS. 51 and 52 each show respective cross sections of the single gate type MONOS memories MC1 and MC2, and do not show the offset spacer, the sidewall, the silicide layer, the interlayer insulation film, the plugs, the wires, and the like.

First, FIG. 51 shows, as the memory cell of Comparative Example, a structure in which the ends of the ONO film ON1 are retreated from the side surfaces of the control gate electrode CG, respectively. Namely, the end of the ONO film ON1 in the gate length direction is terminated immediately under the control gate electrode CG. Such a structure is formed when the side surface of the ONO film ON1 is excessively cut away upon patterning the polysilicon film by dry etching, and subsequently processing the ONO film ON1, or when the side surface of the ONO film ON1 is retreated in a washing step or an oxidation step after processing of the ONO film ON1.

The corner part of the end of the bottom surface of the control gate electrode CG is the site on which an electric field tends to concentrate. Unfavorably, a dropping short circuit (dielectric breakdown) due to the insulation film deterioration tends to occur at the site by the electric field stress applied by the rewrite operation of the MONOS memory MC1. Particularly, when the corner part of the control gate electrode CG lateral to the end of the ONO film ON1 protrudes in a canopy form as in the Comparative Example, dielectric breakdown becomes more likely to occur between the control gate electrode CG and the semiconductor substrate SB.

In contrast, when the gate length of the MONOS memory MC1 is sufficiently long, an offset spacer is formed at the side surface of the control gate electrode CG by an oxidation method. Conceivably, by the oxidation step, a bird's beak formed of a silicon oxide film with a large film thickness is formed between the corner part of the control gate electrode CG and the semiconductor substrate SB, thereby to prevent the breakdown at the gate end.

However, in an element having a gate length reduced with an advance of miniaturization of a semiconductor device, the formation of a bird's beak results in an increase in film thickness of the ONO film ON1. As a result, the electric field at the time of the rewrite operation is reduced, which unfavorably causes the reduction of the operation speed of the MONOS memory MC1. Accordingly, in a miniaturized MONOS memory MC1, the formation of a bird's beak is required to be prevented. Thus, the problem of the dielectric breakdown cannot be resolved by the formation of a bird's beak. Incidentally, as a method for preventing the formation of a bird's beak, conceivably, for example, an offset spacer covering the side surface of the control gate electrode CG is formed by a CVD method, or the like, thereby to prevent the oxidation of the semiconductor substrate in the vicinity of the ONO film ON1 of a gate insulation film, and the like.

In this case, in order to prevent the failure at the end of the ONO film ON1, the oxidation amount of the end of the control gate electrode CG is adjusted. Use of the method, or other methods results in the degradation of the characteristics of the MONOS memory MC1. For this reason, it is difficult to combine the performances and the reliability of the semiconductor device.

In contrast, the following is conceivable: as shown in FIG. 52, the ends of the ONO film ON2 in the gate length direction are set to protrude outwardly from the side surfaces of the control gate electrode CG, respectively; this prevents a dielectric breakdown and a short circuit between the control gate electrode CG and the semiconductor substrate SB. In the manufacturing steps of the MONOS memory MC2 of Comparative Example shown in FIG. 52, after processing a polysilicon film by dry etching, and thereby forming the control gate electrode CG, and before processing the ONO film ON2, a sidewall SW1 covering the side surface of the control gate electrode CG is formed. Thereafter, using the sidewall SW1 as a mask, etching is performed, thereby to process the ONO film ON2. This can cause the ends of the ONO film ON2 to protrude outwardly from the control gate electrode CG, respectively. Incidentally, the offset spacer covering each of the side surfaces of the control gate electrode CG or the gate electrodes of other MISFETs is formed separately from the sidewall SW1.

In this case, in the step of forming the sidewall SW1, an insulation film (e.g., silicon oxide film) forming the sidewall SW1 is deposited by a deposition method. Subsequently, the insulation film is etched back, thereby to form the sidewall SW1 formed of the insulation film. Namely, in Comparative Example shown in FIG. 52, a deposition step for forming the sidewall SW1 is additionally performed. Accordingly, the heat generated upon film formation (deposition) unfavorably results in an increase in heat load to be applied to the semiconductor substrate SB, other elements or wells, and the like.

Alternatively, when a pattern such as a gate electrode is formed over the semiconductor substrate SB in other regions than the memory cell region, the sidewall SW1 is also formed at the side surface of the pattern. This unfavorably results in fluctuations in characteristics of other elements. The fluctuations in the characteristics of the elements necessitates second design for additionally mounting a MONOS memory when the logic process has already been established. This leads to an increase in manufacturing cost of the semiconductor device. Further, addition of the step of forming the sidewall SW1 separately from the formation step of the offset spacer also causes an increase in manufacturing cost. Further, prevention of the fluctuations in characteristics of the elements by removing the sidewall SW1 formed in other regions than the memory cell region MR as described above results in addition of a further removal step. For this reason, the manufacturing cost increases.

Thus, in the present embodiment, as described by reference to FIGS. 4 to 11, after the formation of the control gate electrode CG, subsequently, the ONO film ON is not processed in accordance with the shape of the control gate electrode CG. The offset spacer OF2 is formed at the side surface of the control gate electrode CG. Thereafter, using the offset spacer OF2 as a mask, etching is performed, thereby to process the ONO film ON. Namely, in the step shown in FIG. 4, the control gate electrode CG is formed by etching. Then, without processing the ONO film ON, silicon nitride films N2 and N3 and a silicon oxide film OX3 to serve as the offset spacer OF2 are formed. Thereafter, as shown in FIG. 7, the offset spacer OF2 is formed. Then, as shown in FIGS. 7 to 11, using the offset spacer OF2 as a mask, etching is performed, thereby to pattern the ONO film ON.

For this reason, the ends on the opposite sides in the transverse direction (the gate length direction) of the ONO film ON protrude outwardly from respective side surfaces of the control gate electrode CG, respectively. Accordingly, the ONO film ON is interposed between the corner part of the bottom surface of the control gate electrode CG and the top surface of the semiconductor substrate SB. As a result, it is possible to prevent the occurrence of a dielectric breakdown and a short circuit even in the vicinity of the corner part of the control gate electrode CG of the site on which an electric field tends to concentrate. Namely, it is possible to improve the reliability of the semiconductor device.

Further, the offset spacer OF2 is a protective film to be formed irrespective of whether or not there is the problem of dielectric breakdown for the purpose of protection of the side surfaces of the control gate electrode CG, adjustment of the distance between the pair of extension regions E2, and the like. For this reason, the procedure in which the ends of the ONO film ON are caused to protrude using the offset spacer OF2 does not lead to an increase in manufacturing steps. Further, the offset spacers OF1 and OF3 formed in the core region CR and the I/O region HV, respectively are each a protective film not required to be removed. For this reason, it is not necessary to newly add the removal step of the offset spacers OF1 and OF3 in order to prevent the fluctuations in respective characteristics of the low breakdown voltage transistor Q1 and the high breakdown voltage transistor Q3. Therefore, it is possible to prevent an increase in manufacturing cost of the semiconductor device.

Further, the offset spacer OF2 is formed not by an oxidation method, but by a deposition method such as a CVD method, and hence can prevent an increase in thermal load of an element such a MONOS memory MC, and can prevent the formation of a bird's beak in the vicinity of the corner part of the control gate electrode CG. Accordingly, it is possible to prevent the degradation of the characteristics of the element such as the MONOS memory MC.

Second Embodiment

Below, a method for manufacturing a semiconductor device of the present Second Embodiment will be described by reference to FIGS. 15 to 23. FIGS. 15 to 23 are each a cross sectional view for illustrating the manufacturing steps of the semiconductor device of the present embodiment. In each of FIGS. 15 to 23, a memory cell region MR, a core region (logic circuit region or low breakdown voltage transistor region) CR, and an I/O region (high breakdown voltage transistor region) HV are shown sequentially from the left-hand side of the drawing.

In the First Embodiment, a description has been given to the following: the semiconductor device has a SOI substrate, and the control gate electrode in the memory cell region and the gate electrode in the peripheral circuit region are formed from one silicon film. However, herein, a description will be given to the following: the semiconductor device does not have a SOI substrate, and the control gate electrode in the memory cell region and the gate electrode in the peripheral circuit region are formed from different silicon films. Further, herein, a description will be given to the following: after forming the gate insulation film in the core region and the I/O region, and the silicon film for gate electrode formation, an ONO film and a silicon film for control gate electrode formation are formed.

Figure 15:
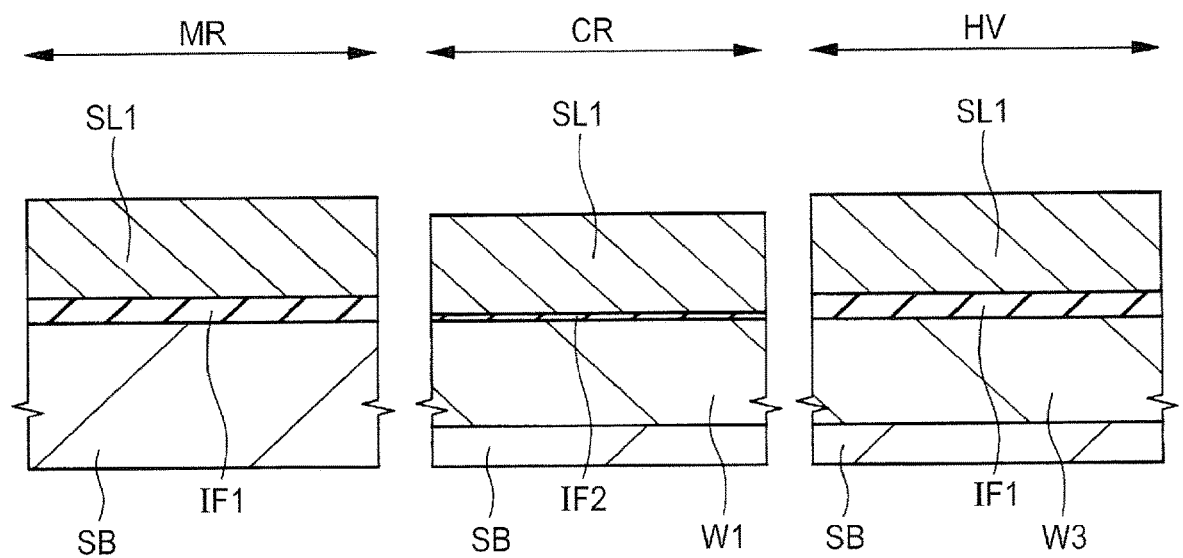
FIG. 15 is a cross sectional view of a semiconductor device of Second Embodiment during a manufacturing step.

In the manufacturing steps of the semiconductor device of the present embodiment, first, as shown in FIG. 15, a semiconductor substrate SB is provided. An element isolation region (not shown) embedded in the isolation trench in the top surface of the semiconductor substrate SB is formed. Subsequently, using a photolithography technology and an ion implantation method, a p type impurity (e.g., B (boron)) is implanted into respective top surfaces of the semiconductor substrate SB in the core region CR and the I/O region HV. As a result, wells W1 and W3 are formed in respective top surfaces of the semiconductor substrate SB in the core region CR and the I/O region HV, respectively. Thereafter, although not shown, using a photolithography technology and an ion implantation method, a p type impurity (e.g., B (boron)) is implanted into respective top surfaces of the semiconductor substrate SB in the core region CR and the I/O region HV, thereby to form a channel region.

Subsequently, an insulation film IF1 is formed over the top surface of the semiconductor substrate SB using an oxidation method, or the like. Then, using a photolithography technology and an etching method, the insulation film IF1 in the core region CR is removed. Thereafter, using, for example, a thermal oxidation method, an insulation film IF2 having a smaller film thickness than that of the insulation film IF1 is formed over the top surface of the semiconductor substrate SB in the core region CR. Subsequently, entirely over the top surface of the semiconductor substrate SB, by, for example, a CVD method, a polysilicon film SL1 is formed.

Figure 16:
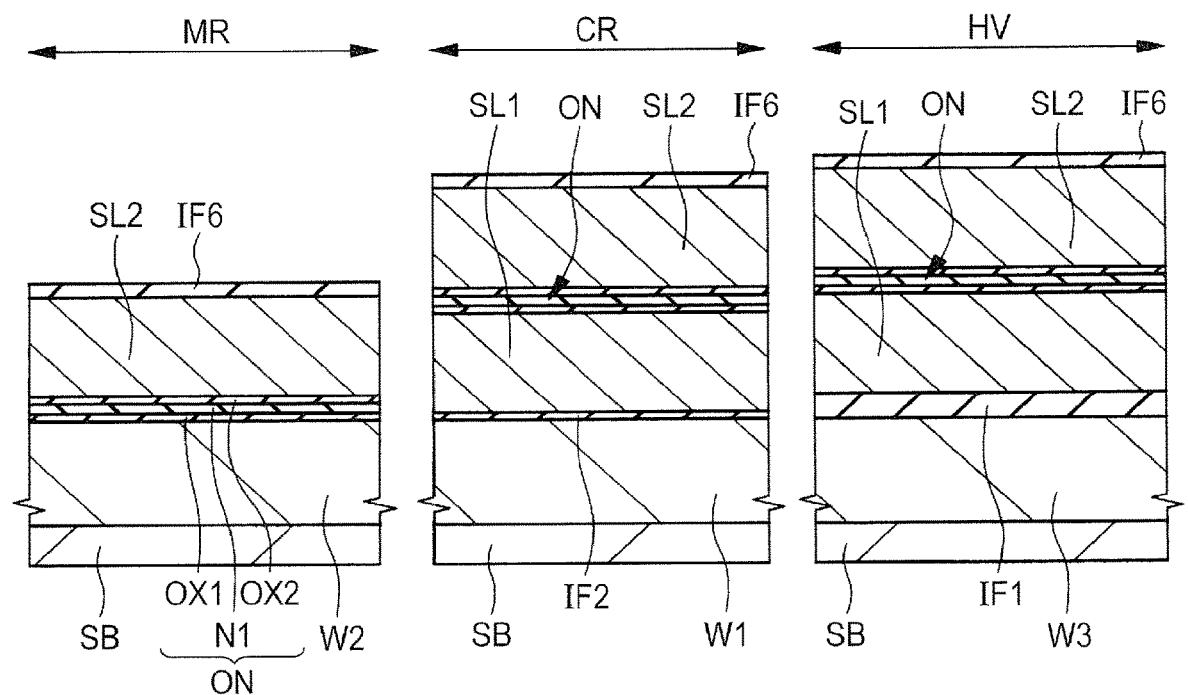
FIG. 16 is a cross sectional view of the semiconductor device during a manufacturing step following FIG. 15.

Then, as shown in FIG. 16, using a photolithography technology and an etching method, the polysilicon film SL1 and the insulation film IF1 in the memory cell region MR are removed, thereby to expose the top surface of the semiconductor substrate SB. Subsequently, a p type impurity (e.g., B (boron)) is implanted into the top surface of the semiconductor substrate SB in the memory cell region MR using, for example, an ion implantation method. As a result, a well W2 and a channel region (not shown) are formed, respectively.

Subsequently, entirely over the top surface of the semiconductor substrate SB, an ONO film ON, a polysilicon film SL2, and an insulation film IF6 are sequentially formed. A lamination film formed of the films cover the polysilicon film SL1 in the core region CR and the I/O region HV. The thickness of the polysilicon film SL2 is equal to the thickness of, for example, the polysilicon film SL1. The ONO film ON has a lamination structure including the silicon oxide film OX1, the silicon nitride film N1, and the silicon oxide film OX3 sequentially stacked. The silicon oxide film OX1 is formed by, for example, a thermal oxidation method, and the silicon nitride film N1 and the silicon oxide film OX3 are formed by, for example, a CVD method.

The insulation film IF6 is formed of, for example, a silicon oxide film, and is formed by, for example, a CVD method. The film thickness of the insulation film IF6 is, for example, 5 to 15 nm, and the film thickness of the insulation film IF6 herein is 10 nm. The insulation film IF6 is a film having a role of protecting the control gate electrode CG (see FIG. 20) when the silicon oxide film OX3 and the silicon nitride film N1 forming the ONO film ON are removed in an etching step described later by reference to FIG. 20.

Figure 17:
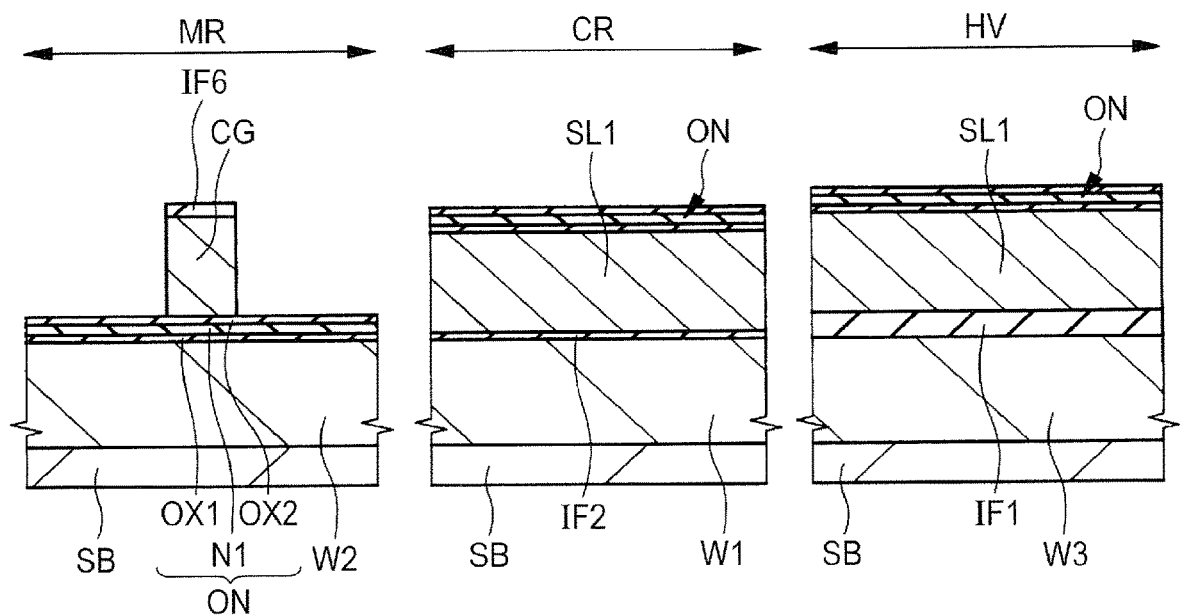
FIG. 17 is a cross sectional view of the semiconductor device during a manufacturing step following FIG. 16.

Then, as shown in FIG. 17, using a photolithography technology and an etching method, the insulation film IF6 and the polysilicon film SL2 are processed. As a result, a part of the top surface of the ONO film ON in the memory cell region MR, and the top surfaces of respective ONO films ON in the core region CR and the I/O region HV are exposed. Herein, in the memory cell region MR, the insulation film IF6 and the polysilicon film SL2 are patterned, thereby to form the control gate electrode CG formed of the polysilicon film SL2. The top surface of the control gate electrode CG is covered with the insulation film IF6. Whereas, in the region adjacent to the control gate electrode CG in the gate length direction of the control gate electrode CG, the top surface of the semiconductor substrate SB is covered with the ONO film ON. In other words, in the etching step, the ONO film ON is not processed.

Figure 18:
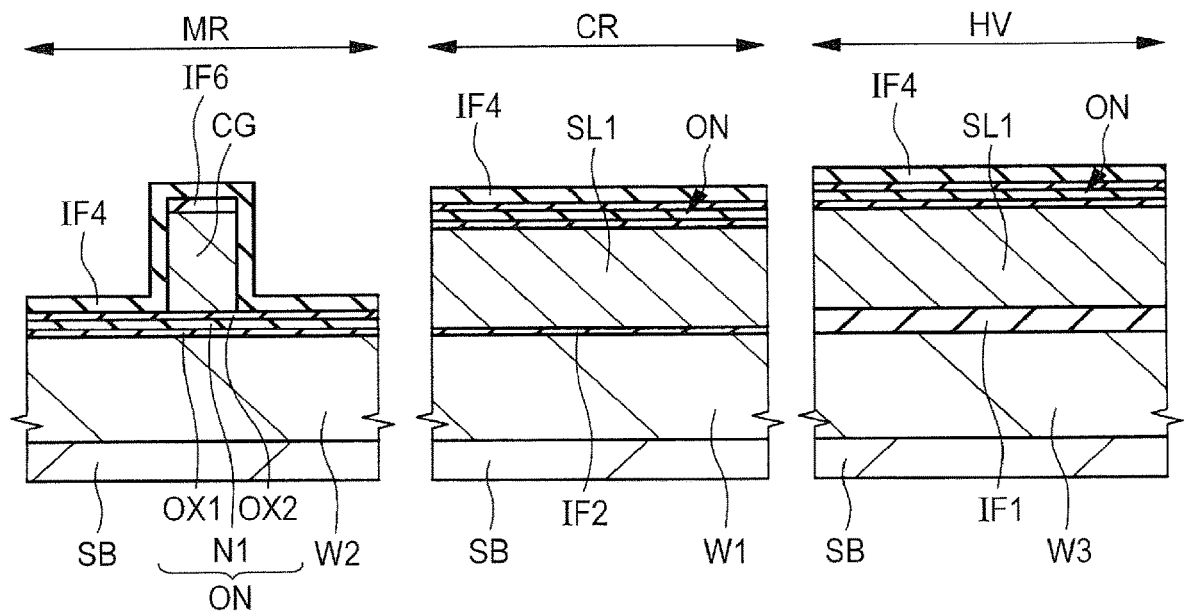
FIG. 18 is a cross sectional view of the semiconductor device during a manufacturing step following FIG. 17.

Then, as shown in FIG. 18, using, for example, a CVD method, entirely over the top surface of the semiconductor substrate SB, an insulation film IF4 is formed (deposited). The insulation film IF4 may have a lamination structure as with the insulation film IF4 (see FIG. 5) described in the First Embodiment. However, herein, a description will be given to the case where the insulation film IF4 is formed of only one film. Namely, for example, the insulation film IF4 is formed of a silicon oxide film. The film thickness of the insulation film IF4 is, for example, 9 nm. The side surfaces of the control gate electrode CG, the surface of the insulation film IF6, and the top surface of the ONO film ON are covered with the insulation film IF4.

Figure 19:
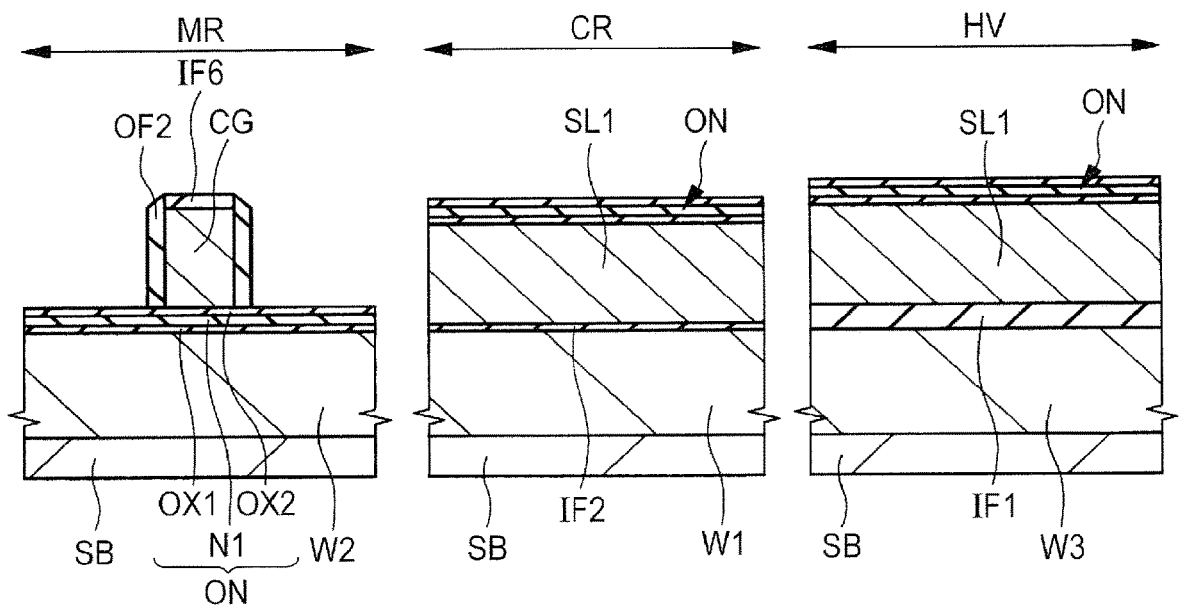
FIG. 19 is a cross sectional view of the semiconductor device during a manufacturing step following FIG. 18.

Then, as shown in FIG. 19, the insulation film IF4 is etched back by a dry etching method, or the like, thereby to expose the top surface of the ONO film ON and the top surface of the insulation film IF6. As a result, the offset spacer OF2 formed of the insulation film IF4 is formed. The offset spacer OF2 is left in a sidewall shape at each side surface of the control gate electrode CG as a film for protecting the side surface of the control gate electrode CG. In other words, the offset spacer OF2 covers each side surface of the control gate electrode CG, and the top surface of the ONO film ON in each region adjacent to the control gate electrode CG.

Figure 20:
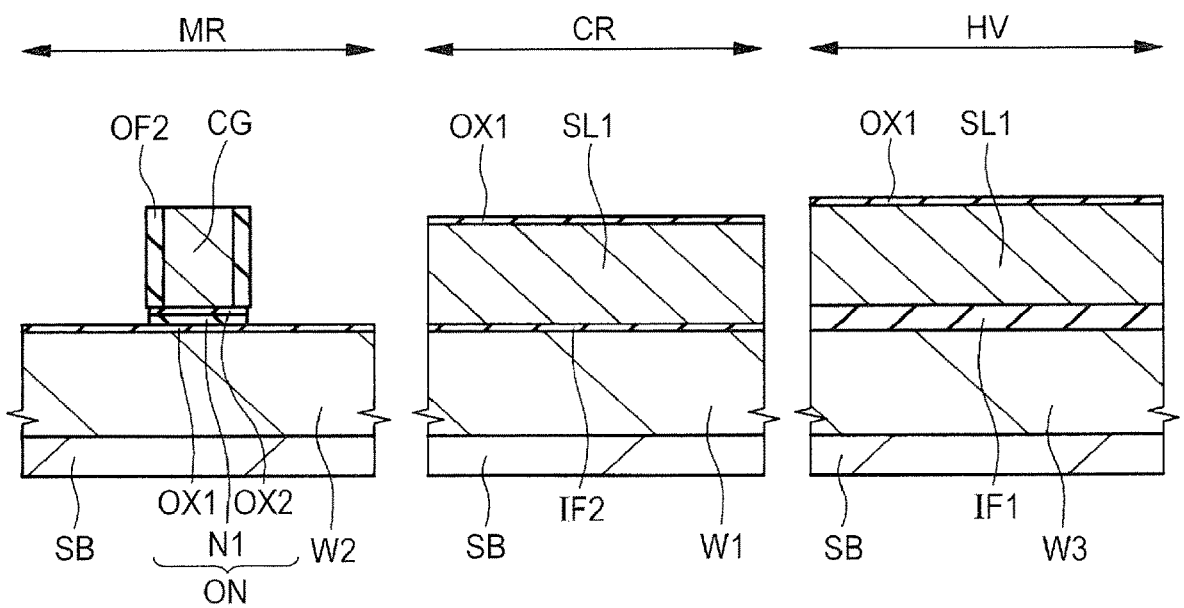
FIG. 20 is a cross sectional view of the semiconductor device during a manufacturing step following FIG. 19.

Then, as shown in FIG. 20, for example, dry etching is performed, thereby to remove the silicon oxide film OX3 and the silicon nitride film N1. As a result, the top surface of the silicon oxide film OX1 is exposed. Herein, using the offset spacer OF2 and the insulation film IF6 as a mask, dry etching is performed. As a result, the silicon oxide film OX3 and the silicon nitride film N1 in the region exposed from the offset spacer OF2 and the control gate electrode CG are removed. Accordingly, the silicon oxide film OX3 and the silicon nitride film N1 extending in the transverse direction continuously from the region immediately under the offset spacer OF2 to the region immediately under the control gate electrode CG are left. In the etching step, the insulation film IF6 used as a protective mask for the top surface of the control gate electrode CG is removed, so that the top surface of the control gate electrode CG is exposed. At this step, the top surface of the semiconductor substrate SB in the memory cell region MR, and the surface of the polysilicon film SL1 in the core region CR and the I/O region HV are covered with the silicon oxide film OX1.

Figure 21:
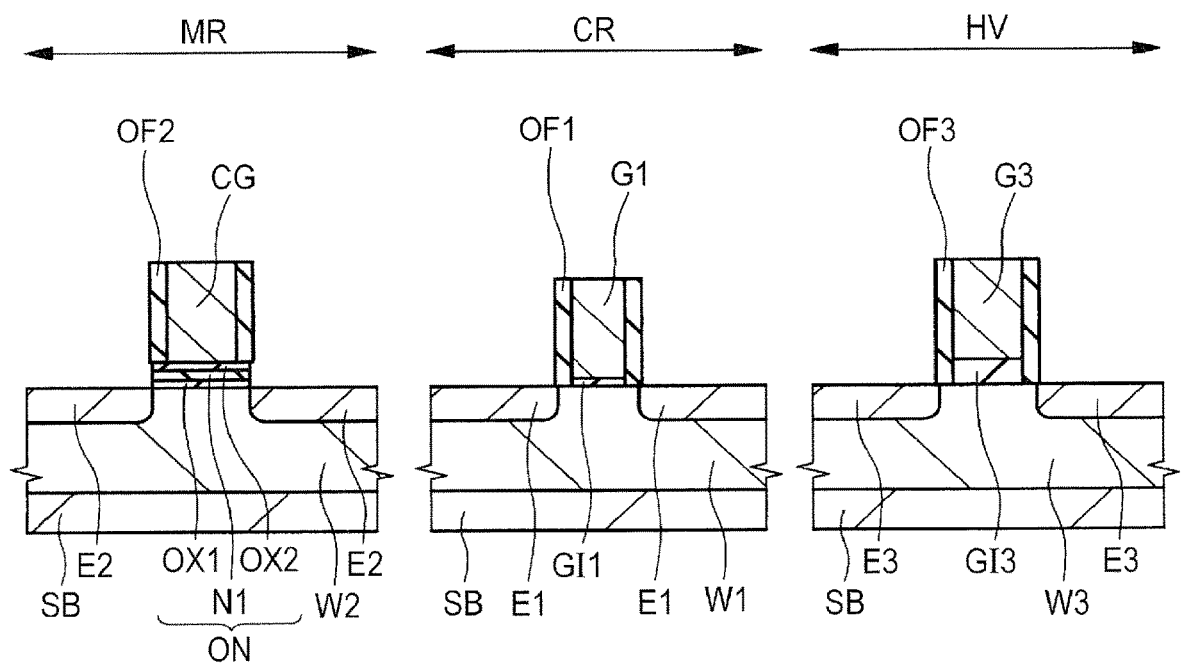
FIG. 21 is a cross sectional view of the semiconductor device during a manufacturing step following FIG. 20.

Then, as shown in FIG. 21, a washing step is performed, thereby to remove the silicon oxide film OX1. As a result, the top surface of the semiconductor substrate SB in the memory cell region MR, and the surfaces of the polysilicon film SL1 in the core region CR and the I/O region HV are exposed. Subsequently, using a photolithography technology and an etching method, the polysilicon film SL1, the insulation films IF1 and IF2 in the core region CR and the I/O region HV are processed. As a result, in the core region CR, over the top surface of the semiconductor substrate SB, a gate electrode G1 formed of the polysilicon film SL1 is formed via a gate insulation film GI1 formed of the insulation film IF2. Whereas, in the I/O region HV, over the top surface of the semiconductor substrate SB, a gate electrode G3 formed of the polysilicon film SL1 is formed via a gate insulation film GI3 formed of the insulation film IF1.

Subsequently, the offset spacers OF1 and OF3 covering respective side surfaces of the gate electrodes G1 and G3, respectively are formed. The offset spacers OF1 and OF3 are each formed of, for example, a silicon oxide film. For forming the offset spacers OF1 and OF3, an insulation film covering respective top surfaces and side surfaces of the gate electrodes G1 and G3 is formed by, for example, a CVD method. Then, the insulation film is etched back. This results in the formation of the offset spacers OF1 and OF3 formed of the insulation films left at respective side surfaces of the gate electrodes G1 and G3. Herein, in the formation step of the offset spacers OF1 and OF3, the insulation film formed lateral to the control gate electrode CG the memory cell region MR is removed.

Subsequently, an n type impurity (e.g., As (arsenic) or P (phosphorus)) is implanted into respective portions of the semiconductor substrate SB in the memory cell region MR, the core region CR, and the I/O region HV. At this step, each of the gate electrodes G1 and G2, the control gate electrode CG, and the offset spacer OF2, and the offset spacer (not shown) at each side surface of the gate electrodes G1 and G3 are used as an implantation inhibiting mask. As a result, a pair of extension regions E2 are formed in the top surface of the semiconductor substrate SB in the memory cell region MR, a pair of extension regions E1 are formed in the top surface of the semiconductor substrate SB in the core region CR, and a pair of extension regions E3 are formed in the top surface of the semiconductor substrate SB in the I/O region HV.

Figure 22:
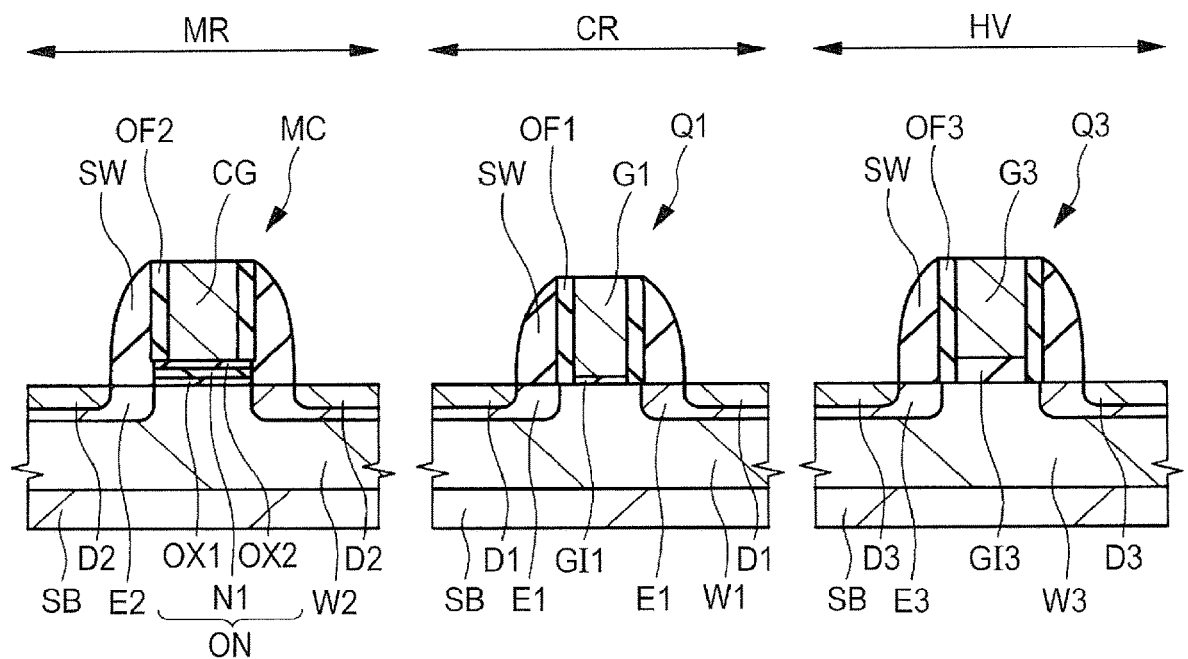
FIG. 22 is a cross sectional view of the semiconductor device during a manufacturing step following FIG. 21.

Then, as shown in FIG. 22, the same step as the step described by reference to FIG. 13 is performed, thereby to form a sidewall SW and diffusion regions D1 to D3. In other words, a sidewall SW covering each side surface of the control gate electrode CG via the offset spacer OF2, a sidewall SW covering each side surface of the gate electrodes G1 and G2 via the offset spacer (not shown) are formed. Further, a pair of diffusion regions D2 are formed in the top surface of the semiconductor substrate SB in the memory cell region MR, a pair of diffusion regions D1 are formed in the top surface of the semiconductor substrate SB in the core region CR, and a pair of diffusion regions D3 are formed in the top surface of the semiconductor substrate SB in the I/O region HV.

As a result, in the memory cell region MR, a MONOS memory MC including source/drain regions each formed of the extension region E2 and the diffusion region D2, and the control gate electrode CG is formed. Whereas, in the core region CR, a low breakdown voltage transistor Q1 including source/drain regions each formed of the extension region E1 and the diffusion region D1, and the gate electrode G1 is formed. Further, in the I/O region HV, a high breakdown voltage transistor Q3 including source/drain regions each formed of the extension region E3 and the diffusion region D3, and the gate electrode G3 is formed.

Figure 23:
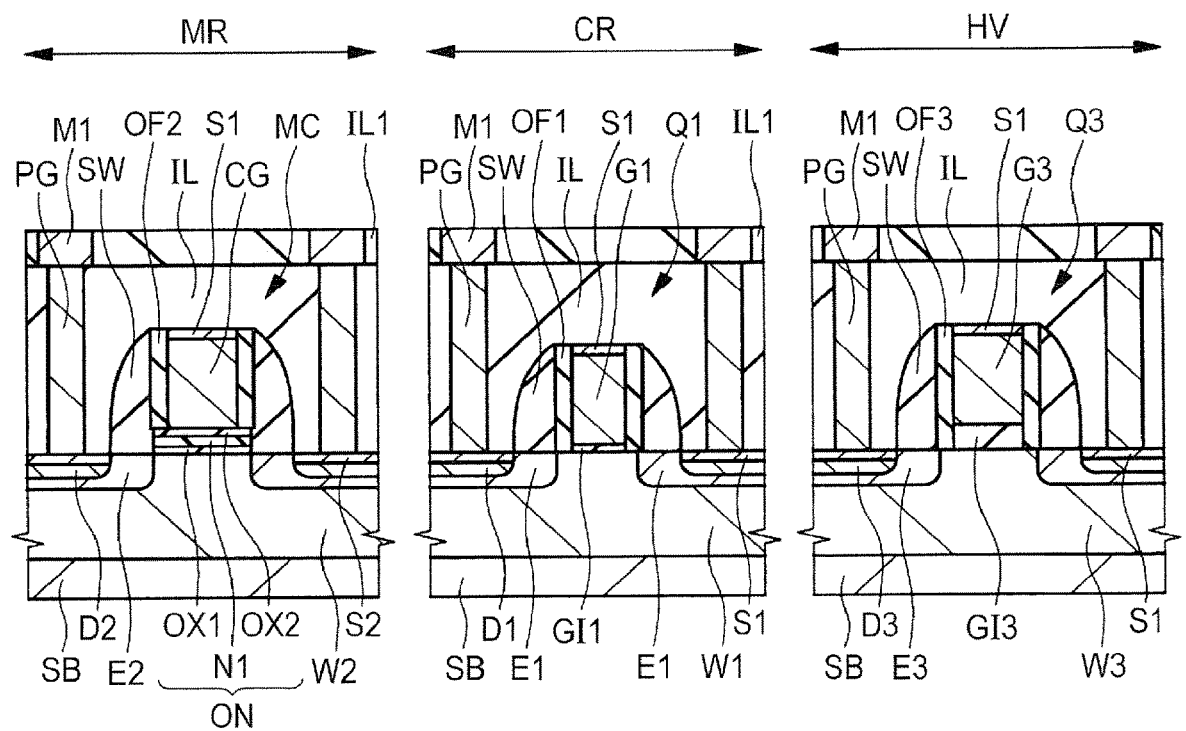
FIG. 23 is a cross sectional view of the semiconductor device during a manufacturing step following FIG. 22.

Then, as shown in FIG. 23, the same step as the step described by reference to FIG. 14 is performed, thereby to form the semiconductor device of the present embodiment. Namely, the silicide layers S1, the interlayer insulation film IL, the plugs PG, the interlayer insulation film IL1, and the wire M1 are formed.

Even when as in the present embodiment, the control gate electrode CG in the memory cell region MR, the gate electrodes G1 and G2 in the core region CR and the I/O region HV are formed of different silicon films, before the processing step of the ONO film ON (see FIGS. 20 and 21), the offset spacer OF2 covering each side surface of the control gate electrode CG is formed. As a result, it is possible to improve the reliability of the semiconductor device.

Namely, as described by reference to FIGS. 17 to 21, after the formation of the control gate electrode CG, and before processing of the ONO film ON, the offset spacer OF2 is formed at each side surface of the control gate electrode CG. Subsequently, using the offset spacer OF2 as a mask, etching is performed, thereby to process the ONO film ON. Accordingly, the ends on the opposite sides in the transverse direction (the gate length direction) of the ONO film ON protrude outwardly from respective side surfaces of the control gate electrode CG, respectively. Thus, the ONO film ON is interposed between the corner part of the bottom surface of the control gate electrode CG and the top surface of the semiconductor substrate SB. As a result, it is possible to prevent the occurrence of a dielectric breakdown and a short circuit even in the vicinity of the corner part of the control gate electrode CG of the site on which an electric field tends to concentrate.

Modified Example

Below, a method for manufacturing a semiconductor device of Modified Example of the present Second Embodiment will be described by reference to FIGS. 24 to 33. FIGS. 24 to 33 are each a cross sectional view for illustrating a manufacturing step of the semiconductor device of the present embodiment. In FIGS. 24 to 33, the memory cell region MR, the core region (logic circuit region or low breakdown voltage transistor region) CR, and the I/O region (high breakdown voltage transistor region) HV are shown sequentially from the left-hand side of the drawing.

Herein, a description will be given to the following case: the control gate electrode in the memory cell region and the gate electrode of the peripheral circuit are formed of different silicon films, and the charge accumulation film (charge accumulation part, charge holding part, or charge holding film) of the memory cell is formed of not a silicon nitride film but a high-k film (high dielectric constant film). In accordance with the present Modified Example, as distinct from the steps described by reference to FIGS. 15 to 23, the charge accumulation film, and the silicon film forming the control gate electrode are formed before the formation of the silicon film forming the gate electrode in the peripheral circuit region. The high-k film referred to in the present application is a film formed of, for example, a material having a higher dielectric constant than that of silicon nitride.

Figure 24:
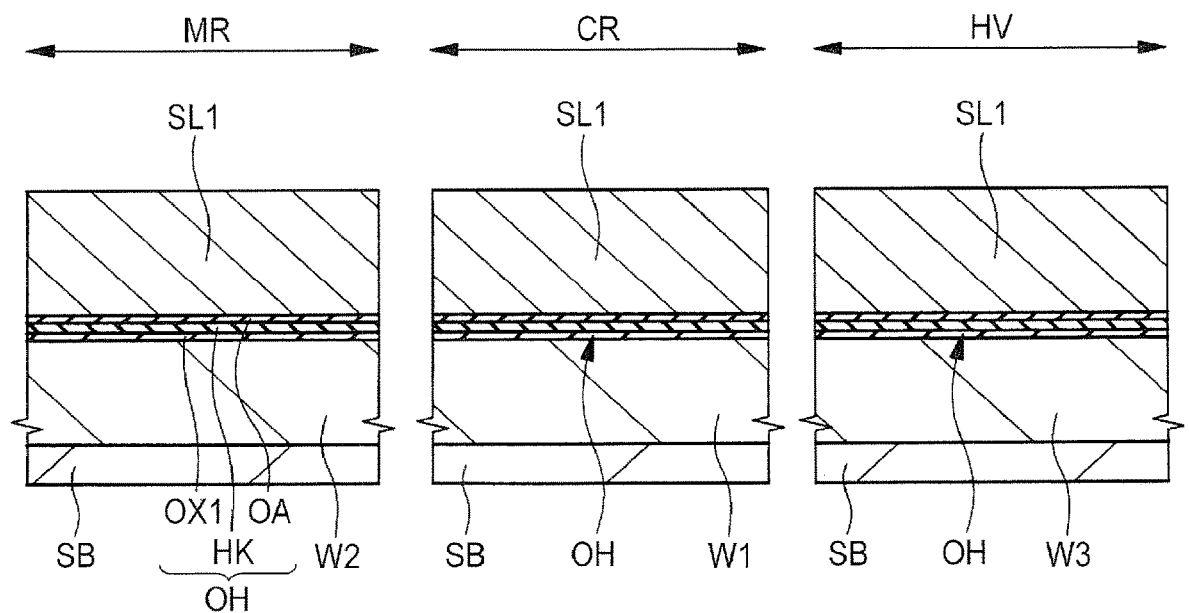
FIG. 24 is a cross sectional view of a semiconductor device of Modified Example of Second Embodiment during a manufacturing step.

In the manufacturing steps of the semiconductor device of the present Modified Example, first, as shown in FIG. 24, a semiconductor substrate SB is provided, and an element isolation region (not shown) embedded in the isolation trench at the top surface of the semiconductor substrate SB is formed. Subsequently, a p type impurity (e.g., B (boron)) is implanted into the top surface of the semiconductor substrate SB in the memory cell region MR using, for example, an ion implantation method, thereby to respectively form a well W2 and a channel region (not shown).

Subsequently, entirely over the top surface of the semiconductor substrate SB, an insulation film OH and a polysilicon film SL1 are sequentially formed. The insulation film OH has a lamination structure of a silicon oxide film OX1, a high-k film HK, and an aluminum oxide film OA sequentially stacked. The silicon oxide film OX1 is formed by, for example, a thermal oxidation method. The high-k film HK and the aluminum oxide film OA are formed by, for example, a CVD method or a sputtering method. The high-k film HK is a film containing, for example, Hf (hafnium). As the material for the high-k film HK, for example, HfO (hafnium oxide) can be used.

Figure 26:
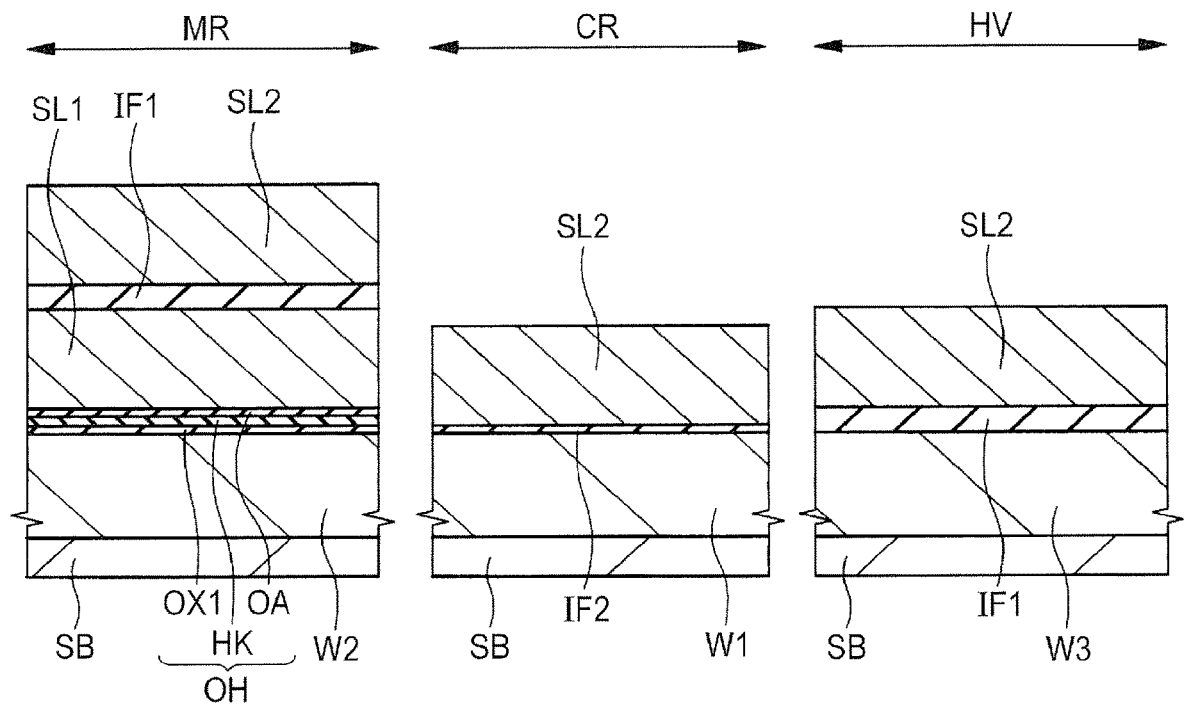
FIG. 26 is a cross sectional view of the semiconductor device during a manufacturing step following FIG. 25.

The film thickness of the polysilicon film SL1 herein formed has at least a first film thickness equal to that of the polysilicon film SL2 formed in the core region CR and the I/O region HV by a step described layer by reference to FIG. 26, and has at maximum a second film thickness equal to the thickness of the sum of the thickness of the polysilicon film SL2, and the thickness of the insulation film IF1 (see FIG. 26) to be formed for the gate insulation film of the high breakdown voltage transistor. In other words, the film thickness of the polysilicon film SL1 herein formed may properly have a film thickness equal to, or larger than the first film thickness and equal to, or smaller than the second film thickness.

Herein, the reason why the polysilicon film SL1 is formed with the second film thickness larger than the thickness (first film thickness) of the polysilicon film SL2 is to suppress the effects due to the following: in the formation step of the insulation film IF1 described later by reference to FIG. 26, an insulation film IF1 is formed at the top surface of the polysilicon film SL1 by an oxidation treatment, so that the polysilicon film SL1 is reduced in film thickness by that much. Namely, the film thickness of the polysilicon film SL1 is made relatively larger. As a result, the polysilicon film SL1 reduced in film thickness by the formation of the insulation film IF1, and the polysilicon film SL2 deposited over the insulation film IF1 can be matched in terms of the film thickness.

Figure 25:
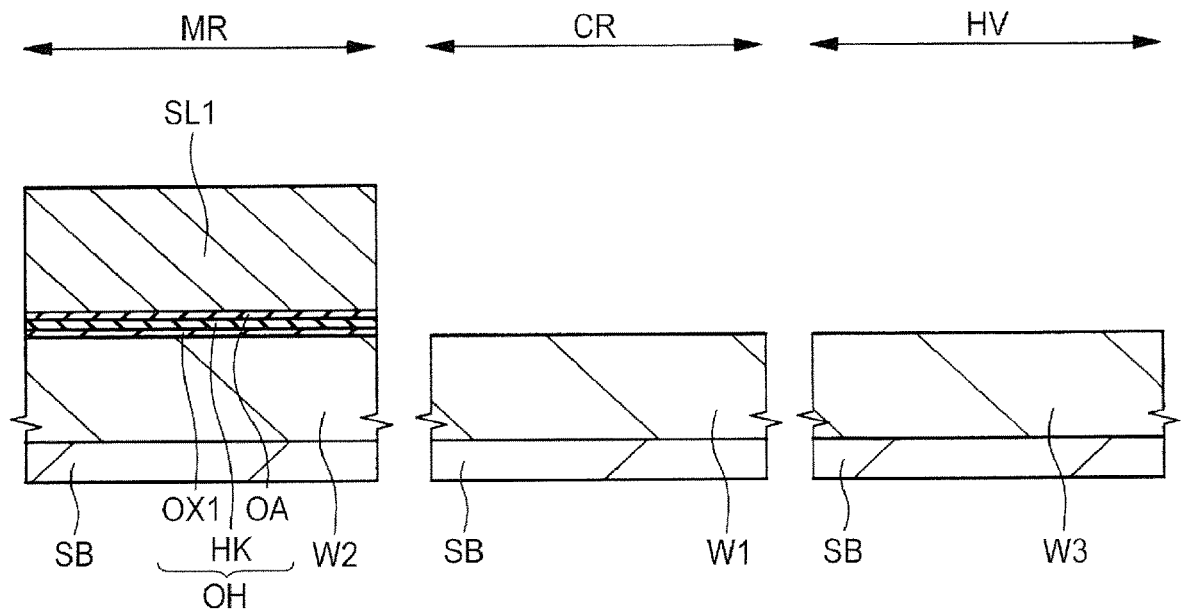
FIG. 25 is a cross sectional view of the semiconductor device during a manufacturing step following FIG. 24.

Then, as shown in FIG. 25, using a photolithography technology and an etching method, the polysilicon film SL1 and the insulation film OH in the core region CR and the I/O region HV are removed, thereby to expose the top surface of the semiconductor substrate SB.

Then, as shown in FIG. 26, using a photolithography technology and an ion implantation method, a p type impurity (e.g., B (boron)) is implanted into respective top surfaces of the semiconductor substrate SB in the core region CR and the I/O region HV. As a result, wells W1 and W3 are formed in respective top surfaces of the semiconductor substrate SB in the core region CR and the I/O region HV, respectively. Thereafter, although not shown, using a photolithography technology and an ion implantation method, a p type impurity (e.g., B (boron)) is implanted into respective top surfaces of the semiconductor substrate SB in the core region CR and the I/O region HV, thereby to form a channel region.

Subsequently, at the top surface of the semiconductor substrate SB and the surface of the polysilicon film SL1, an insulation film IF1 is formed using an oxidation method, or the like. Then, using a photolithography technology and an etching method, the insulation film IF1 in the core region CR is removed. Thereafter, using, for example, a thermal oxidation method, over the top surface of the semiconductor substrate SB in the core region CR, an insulation film IF2 having a smaller film thickness than that of the insulation film IF1 is formed. Subsequently, entirely over the top surface of the semiconductor substrate SB, a polysilicon film SL2 is formed by, for example, a CVD method.

Figure 27:
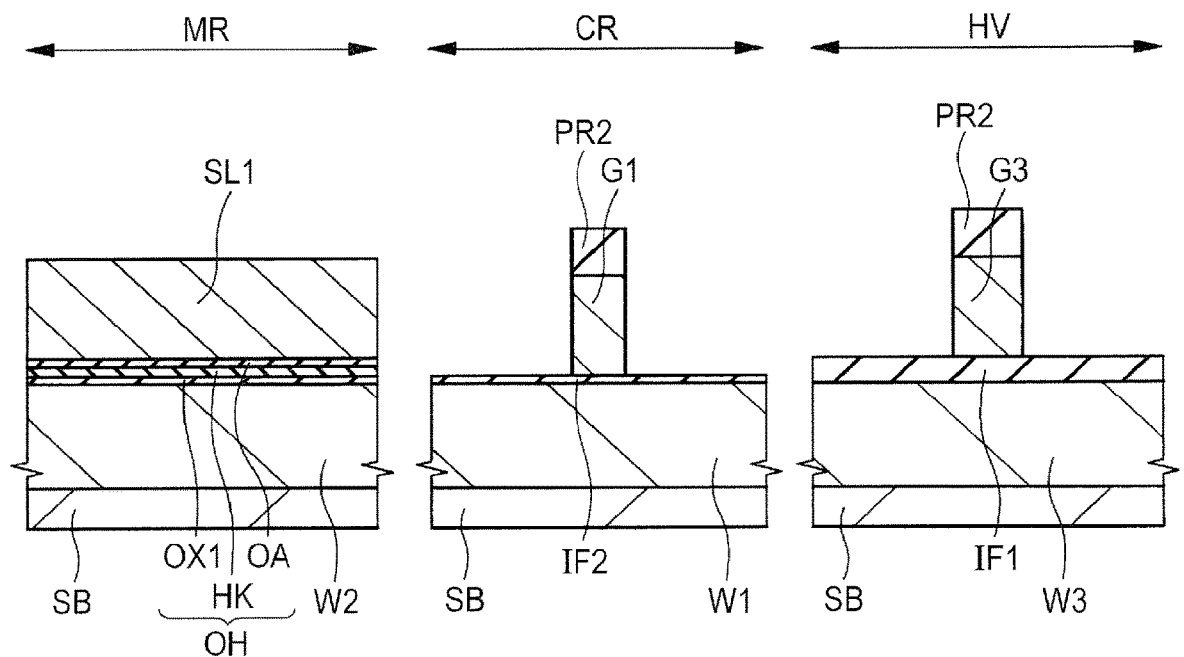
FIG. 27 is a cross sectional view of the semiconductor device during a manufacturing step following FIG. 26.

Then, as shown in FIG. 27, using a photolithography technology and an etching method, the polysilicon film SL2 in the core region CR and the I/O region HV is processed. Namely, over the polysilicon film SL2 in the core region CR and the I/O region HV, a photoresist film PR2 of a resist pattern is formed. Then, using the photoresist film PR2 as a mask, etching is performed. As a result, in the core region CR, over the top surface of the semiconductor substrate SB, a gate electrode G1 formed of the polysilicon film SL2 is formed via the insulation film IF2. Whereas, in the I/O region HV, over the top surface of the semiconductor substrate SB, a gate electrode G3 formed of the polysilicon film SL2 is formed via the insulation film IF1. Herein, the insulation films IF1 and IF2 are not processed. Whereas, in the memory cell region MR, the top surface of the polysilicon film SL1 is exposed.

Figure 28:
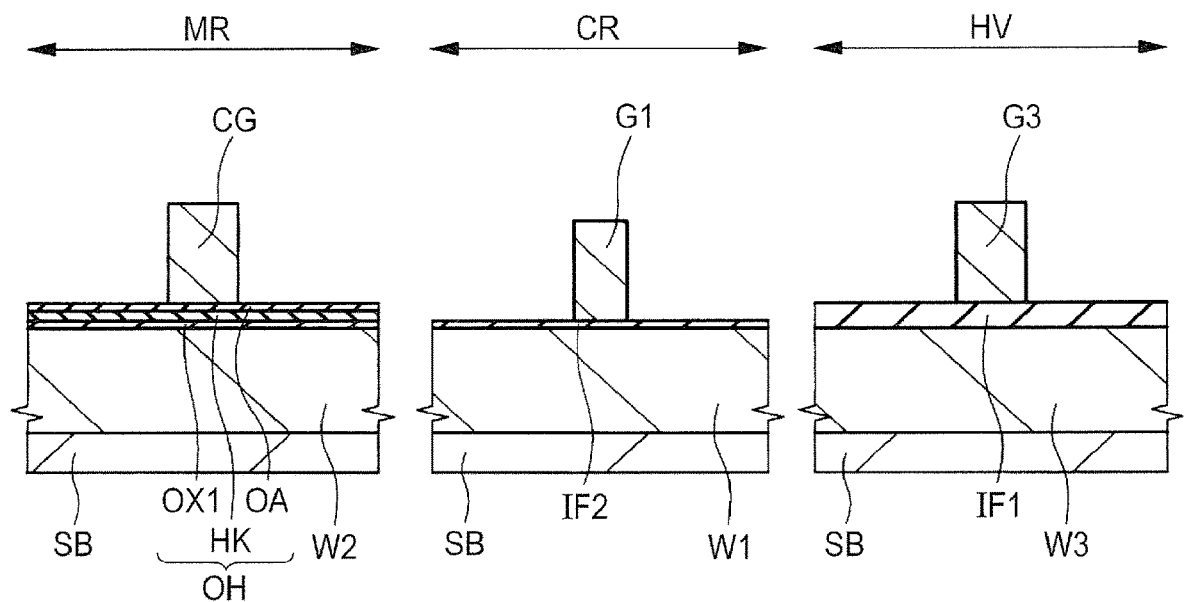
FIG. 28 is a cross sectional view of the semiconductor device during a manufacturing step following FIG. 27.

Then, as shown in FIG. 28, the photoresist film PR2 is removed. Then, using a photolithography technology and an etching method, the polysilicon film SL1 is processed, thereby to expose a part of the top surface of the insulation film OH in the memory cell region MR. Herein, in the memory cell region MR, the polysilicon film SL1 is patterned, thereby to form a control gate electrode CG formed of the polysilicon film SL1. In the region adjacent to the control gate electrode CG in the gate length direction of the control gate electrode CG, the top surface of the semiconductor substrate SB is covered with the insulation film OH. In other words, in the etching step, the insulation film OH is not processed.

Figure 29:
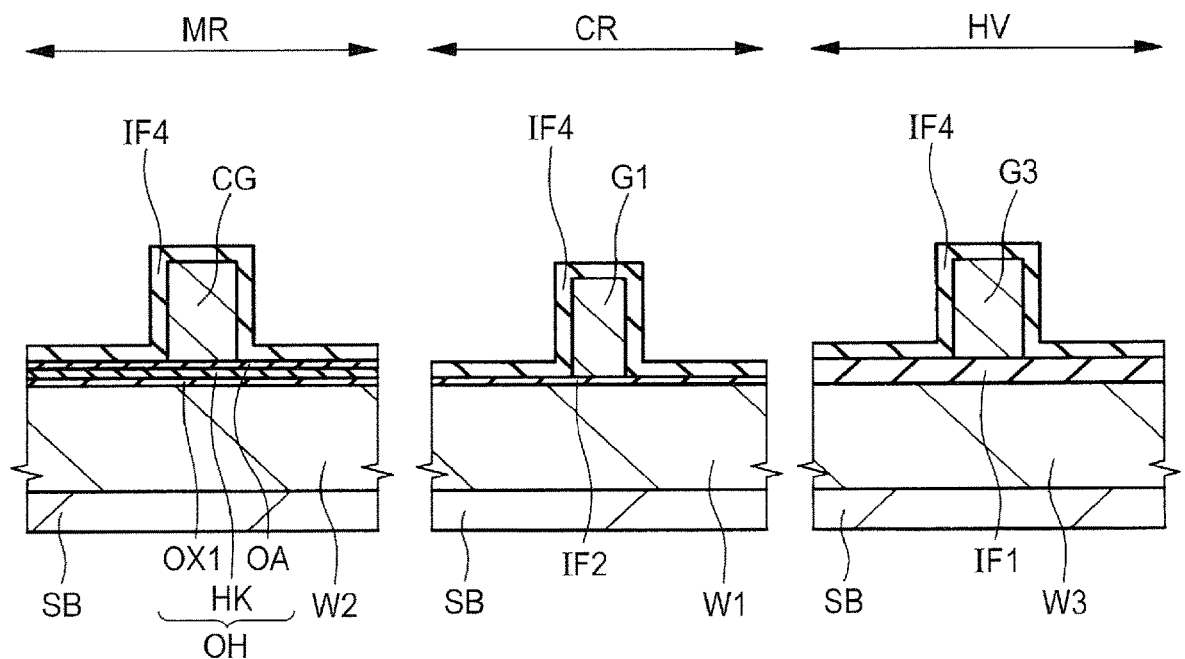
FIG. 29 is a cross sectional view of the semiconductor device during a manufacturing step following FIG. 28.

Then, as shown in FIG. 29, for example, using a CVD method, entirely over the top surface of the semiconductor substrate SB, an insulation film IF4 is formed. The insulation film IF4 may have a lamination structure as with the insulation film IF4 (see FIG. 5) described in the First Embodiment. However, herein, a description will be given to the case where the insulation film IF4 is formed of only one film. Namely, for example, the insulation film IF4 is formed of a silicon oxide film. The film thickness of the insulation film IF4 is, for example, 9 nm. Thus, respective top surfaces and side surfaces of the control gate electrode CG, and the gate electrodes G1 and G2, and respective top surfaces of the insulation films IF1, IF2, and OH are covered with the insulation film IF4.

Figure 30:
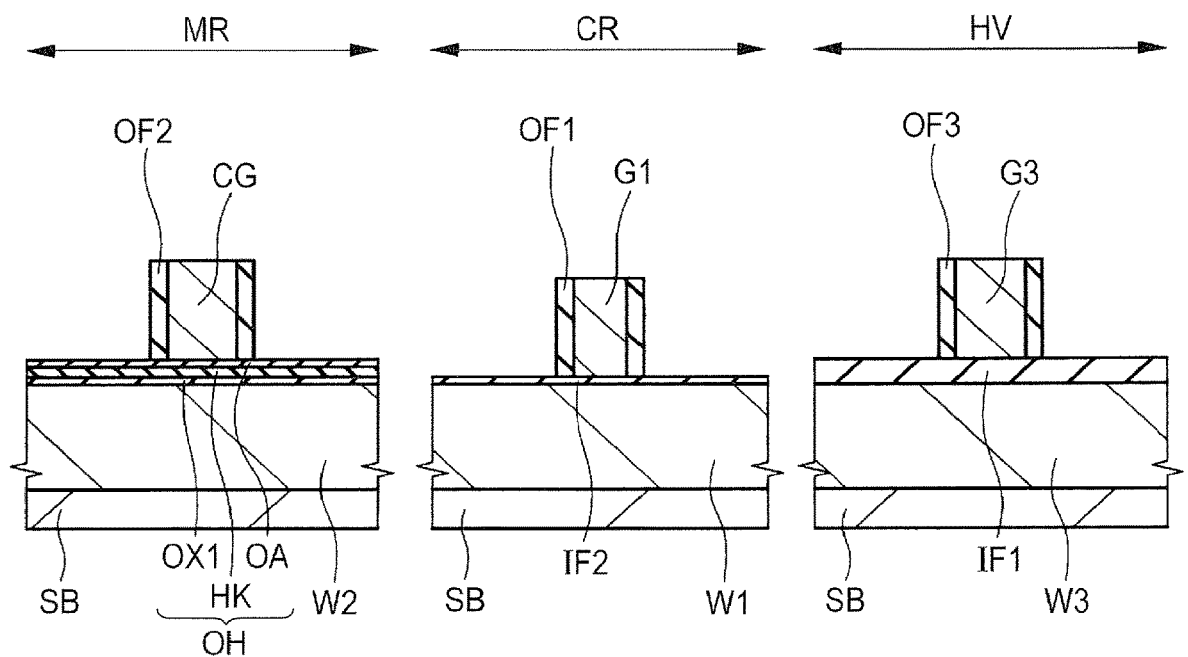
FIG. 30 is a cross sectional view of the semiconductor device during a manufacturing step following FIG. 29.

Then, as shown in FIG. 30, the insulation film IF4 is etched back by a dry etching method, or the like, thereby to expose respective top surfaces of the control gate electrode CG, the gate electrodes G1 and G2, and the insulation films IF1, IF2, and OH. This results in the formation of offset spacers OF1, OF2, and OF3 formed of the insulation film IF4. The offset spacer OF2 is left in a sidewall shape at the side surface of the control gate electrode CG as the film for protecting the side surface of the control gate electrode CG. Similarly, sidewall-shaped offset spacers OF1 and OF3 are formed at the side surfaces of the gate electrodes G1 and G2, respectively. The offset spacer OF2 covers the side surface of the control gate electrode CG, and the top surface of the insulation film OH in the region adjacent to the control gate electrode CG.

Figure 31:
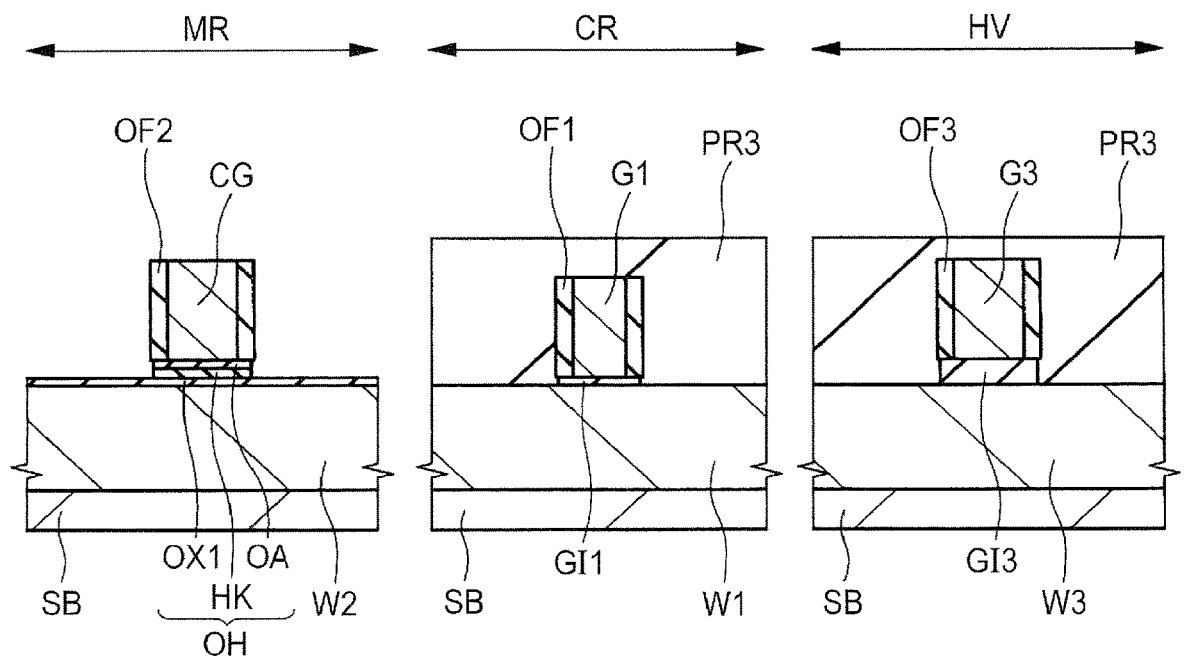
FIG. 31 is a cross sectional view of the semiconductor device during a manufacturing step following FIG. 30.

Then, as shown in FIG. 31, a photoresist film PR3 covering the core region CR and the I/O region HV, and exposing the memory cell region MR is formed. Subsequently, using the photoresist film PR3 as a mask, dry etching is performed, thereby to remove the aluminum oxide film OA and the high-k film HK. As a result, the top surface of the silicon oxide film OX1 is exposed. Herein, using the offset spacer OF2 as a mask, dry etching is performed, thereby to remove the aluminum oxide film OA and the high-k film HK in the region exposed from the offset spacer OF2 and the control gate electrode CG. Accordingly, the aluminum oxide film OA and the high-k film HK extending in the transverse direction continuously from the region immediately under the offset spacer OF2 to the region immediately under the control gate electrode CG are left. Immediately after the etching step, the top surface of the semiconductor substrate SB in the memory cell region MR is covered with the silicon oxide film OX1.

Figure 32:
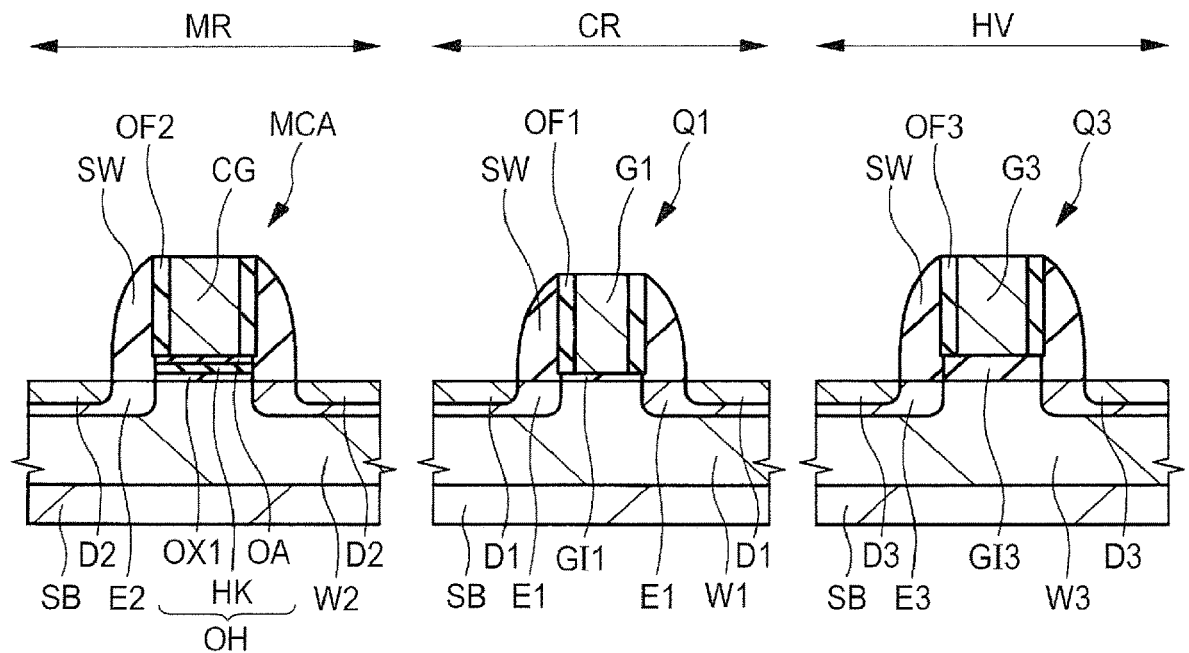
FIG. 32 is a cross sectional view of the semiconductor device during a manufacturing step following FIG. 31.

Then, as shown in FIG. 32, after removing the photoresist film PR3, a washing step or etching is performed, thereby to remove the exposed portions of the silicon oxide film OX1, and the insulation films IF1 and IF3. As a result, the top surface of the semiconductor substrate SB in the memory cell region MR, the core region CR, and the I/O region HV is exposed. Namely, herein, in the core region CR, the insulation film IF1 exposed from the offset spacer OF1 and gate electrode G1 is removed, resulting in the formation of a gate insulation film GI1 formed of the insulation film IF1. Similarly, in the I/O region HV, the insulation film IF3 exposed from the offset spacer OF3 and the gate electrode G3 is removed, resulting in the formation of a gate insulation film GI3 formed of the insulation film IF3.

Subsequently, an n type impurity (e.g., As (arsenic) or P (phosphorus)) is implanted into respective portions of the semiconductor substrate SB in the memory cell region MR, the core region CR, and the I/O region HV. At this step, the offset spacers OF1 to OF3 are used as an implantation inhibiting mask. As a result, a pair of extension regions E2 are formed at the top surface of the semiconductor substrate SB in the memory cell region MR, a pair of extension regions E1 are formed at the top surface of the semiconductor substrate SB in the core region CR, and a pair of extension regions E3 are formed at the top surface of the semiconductor substrate SB in the I/O region HV.

Subsequently, the same step as the step described by reference to FIG. 22 is performed, thereby to form sidewalls SW and diffusion regions D1 to D3. As a result, the sidewalls SW, and the diffusion regions D1 to D3 are formed. This results in the formation of a memory cell MCA including source/drain regions each formed of the extension region E2 and the diffusion region D2, and the control gate electrode CG in the memory cell region MR. Whereas, in the core region CR, a low breakdown voltage transistor Q1 including source/drain regions each formed of the extension region E1 and the diffusion region D1, and a gate electrode G1 is formed. Further, in the I/O region HV, a high breakdown voltage transistor Q3 including source/drain regions each formed of the extension region E3 and the diffusion region D3, and the gate electrode G3 is formed.

Figure 33:
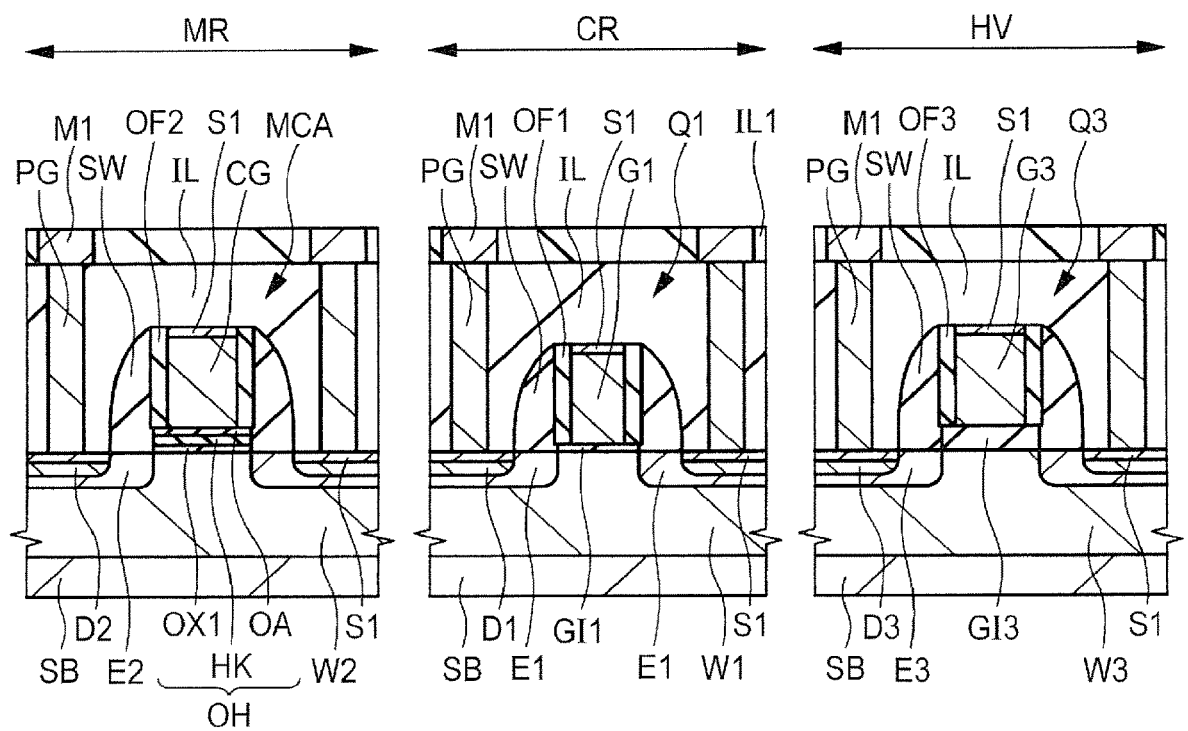
FIG. 33 is a cross sectional view of the semiconductor device during a manufacturing step following FIG. 32.

Then, as shown in FIG. 33, the same step as the step described by reference to FIG. 14 is performed, thereby to form the semiconductor device of the present embodiment.

Namely, a silicide layer S1, an interlayer insulation film IL, plugs PG, an interlayer insulation film IL1, and a wire M1 are formed.

In this manner, a memory cell having a high-k film HK as a charge accumulation film may be formed.

In the present embodiment, the control gate electrode CG in the memory cell region MR and the gate electrodes G1 and G2 in the core region CR and the I/O region HV are formed of different silicon films. In addition, the charge accumulation film (charge accumulation part, charge holding part, or charge holding film) of the memory cell MCA is formed of the high-k film HK. The high-k film HK is a film generating a high heat during deposition as distinct from the silicon nitride film in the ONO film. This heat prevents the movement of the impurity doped into the peripheral circuit regions such as the channel regions and wells in the core region CR and the I/O region HV. For this reason, in the present Modified Example, the high-k film HK and the polysilicon film SL1 shown in FIG. 25 are formed before forming the polysilicon film SL2 for the gate electrode, the wells W1 and W3, and the channel region in the peripheral circuit regions.

Even in such a case, before the processing step of the insulation film OH (see FIGS. 31 and 32), the offset spacer OF2 covering each side surface of the control gate electrode CG is formed. This can improve the reliability of the semiconductor device.

Namely, as described by reference to FIGS. 28 to 32, after the formation of the control gate electrode CG, and before processing of the insulation film OH, the offset spacer OF2 is formed at each side surface of the control gate electrode CG. Thereafter, using the offset spacer OF2 as a mask, etching is performed, thereby to process the insulation film OH. For this reason, the ends on the opposite sides in the transverse direction (the gate length direction) of the insulation film OH protrude outwardly from respective side surfaces of the control gate electrode CG, respectively. Accordingly, the insulation film OH is interposed between the corner part of the bottom surface of the control gate electrode CG and the top surface of the semiconductor substrate SB. As a result, it is possible to prevent the occurrence of a dielectric breakdown and a short circuit even in the vicinity of the corner part of the control gate electrode CG of the site on which an electric field tends to concentrate.

Third Embodiment

Description of a Structure of a Semiconductor Device

Figure 34:
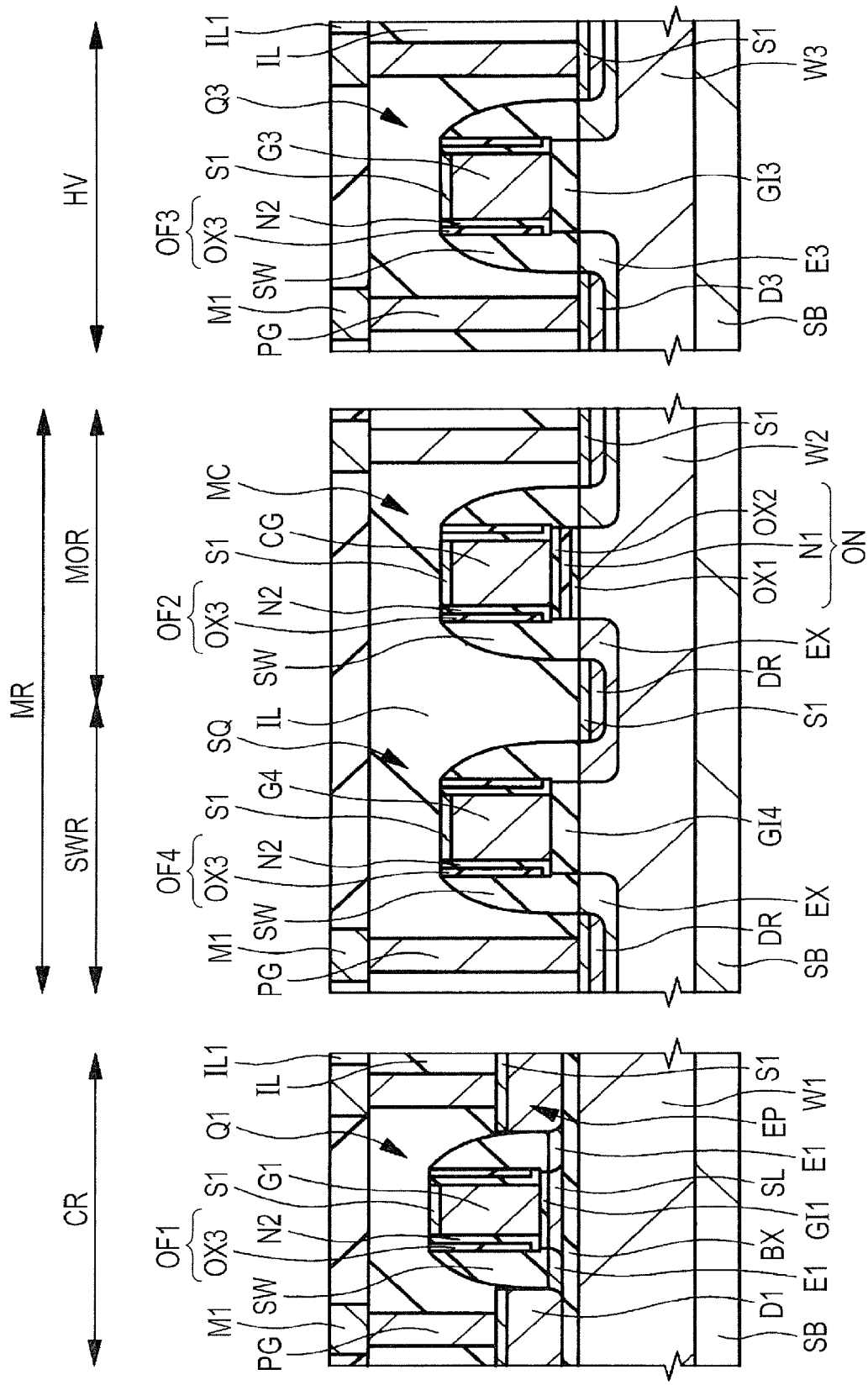
FIG. 34 is a cross sectional view showing a semiconductor device of Third Embodiment.
Figure 36:
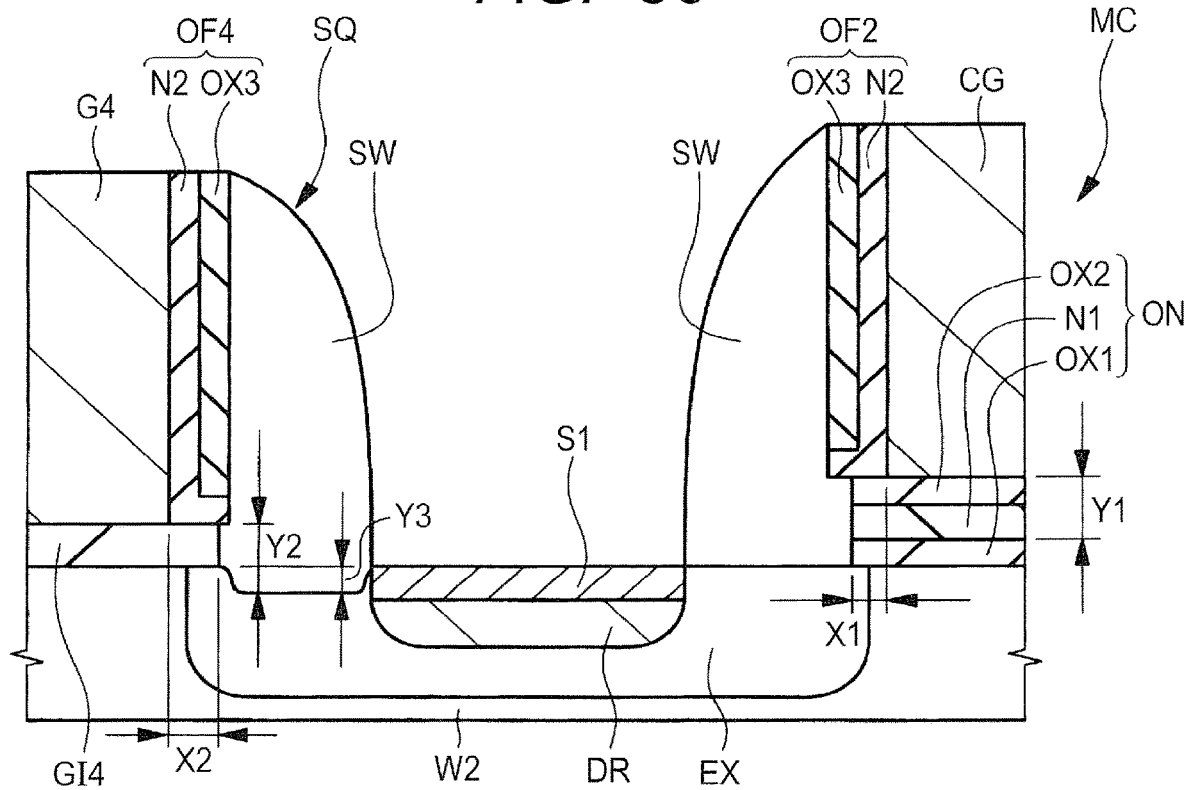
FIG. 36 is a cross sectional view showing a part of FIG. 34 on an enlarged scale.

Below, a method for manufacturing a semiconductor device of the present Third Embodiment will be described by reference to FIGS. 34 to 36. FIG. 34 is a cross sectional view showing the semiconductor device of the present embodiment. In FIG. 34, a core region (logic circuit region or low breakdown voltage transistor region) CR, a selection transistor region SWR, a MONOS memory region MOR, and an I/O region (high breakdown voltage transistor region) HV are shown sequentially from the left-hand side of the drawing. The selection transistor region SWR and the MONOS memory region MOR form the memory cell region MR. FIG. 35 is a plan view schematically showing a semiconductor chip including the semiconductor device of the present embodiment mounted therein. FIG. 36 is an enlarged cross sectional view showing the semiconductor device of the present embodiment.

In the semiconductor device of the present embodiment, as distinct from the First Embodiment, a selection transistor having a part of the source/drain regions in common with the MONOS memory is formed. Further, as with the First Embodiment, a semiconductor layer (SOI layer) is formed partially over the semiconductor substrate via a BOX film.

FIG. 35 shows a low breakdown voltage transistor Q1, a selection transistor SQ, a MONOS memory MC, and a high breakdown voltage transistor Q3 of the present embodiment. Respective structures of the MONOS memory MC, the low breakdown voltage transistor Q1, and the high breakdown voltage transistor Q3 are the same as respective structures of the MONOS memory MC, the low breakdown voltage transistor Q1, and the high breakdown voltage transistor Q3 of the First Embodiment, respectively.

The MONOS memory MC and the selection transistor SQ have anyone of respective source regions or drain regions in common. Namely, any one of the source region or the drain region of the MONOS memory MC is electrically coupled with any one of the source region or the drain region of the selection transistor SQ. In other words, the MONOS memory MC and the selection transistor SQ are coupled in series with each other. For example, the source region of the MONOS memory MC functions as the drain region of the selection transistor SQ. Further, herein, respective source/drain regions of the selection transistor SQ and the MONOS memory MC are each formed of the extension region EX and the diffusion region DR.

In the core region CR, the semiconductor layer SL is formed over the top surface of the semiconductor substrate SB via the BOX film BX. Over the semiconductor layer SL, the gate electrode G1 is formed via the gate insulation film GI1. The side surfaces of the gate electrode G1, and a part of the top surface of the gate insulation film GI1 are covered with the offset spacer OF1. At each side surface of the gate electrode G1, a sidewall SW is formed via the offset spacer OF1. Whereas, in the gate length direction of the gate electrode G1, over the semiconductor layer SL lateral to the pattern including the gate insulation film GI1, the gate electrode G1, the offset spacer OF1, and the sidewall SW, the epitaxial layer (semiconductor layer) EP gradually rising upwardly from the tops surface of the semiconductor layer SL is formed.

In the epitaxial layer EP and in the semiconductor layer SL immediately under the epitaxial layer EP, a diffusion region D1 of an n type semiconductor region is formed from the top surface of the epitaxial layer EP through to the lower surface of the semiconductor layer SL. Further, in the semiconductor layer SL, an extension region E1 of an n type semiconductor region is formed between the diffusion region D1 and the semiconductor layer SL (channel region) immediately under the gate electrode G1. In other words, in the semiconductor layer SL and in the epitaxial layer EP in the region lateral to the gate electrode G1, a pair of extension regions E1 and a pair of diffusion regions D1 are formed. Each extension region E1 and each diffusion region D1 are in contact with each other.

The extension regions E1 and the diffusion regions D1 form the source/drain regions, and the impurity density of the extension region E1 is lower than the impurity density of the diffusion region D1. Namely, the source/drain regions each have a LDD (Lightly Doped Drain) structure. The low breakdown voltage transistor Q1 is formed of the source/drain regions, and the gate electrode G1. Thus, the low breakdown voltage transistor Q1 has a channel region in the semiconductor layer SL over the BOX film BX. In other words, the low breakdown voltage transistor Q1 is formed over the SOI substrate.

In the selection transistor region SWR, a gate electrode G4 is formed over the semiconductor substrate SB via a gate insulation film GI4. The side surfaces of the gate electrode G4 and a part of the top surface of the gate insulation film GI4 are covered with the offset spacer OF4. A sidewall SW is formed at each side surface of the gate electrode G4 via the offset spacer OF4.

At the top surface of the semiconductor substrate SB lateral to the gate electrode G4, a pair of diffusion regions DR of n type semiconductor regions are formed. Further, an extension region EX of an n type semiconductor region is formed between each diffusion region DR and the top surface of the semiconductor substrate SB (channel region) immediately under the gate electrode G4. In other words, at the top surface of the semiconductor substrate SB in the regions lateral to the gate electrode G4, a pair of extension regions EX and a pair of diffusion regions DR are formed. Each extension region EX and each diffusion region DR are in contact with each other.

The extension regions EX and the diffusion regions DR form the source/drain regions. The impurity density of the extension region EX is lower than the impurity density of the diffusion region DR. The selection transistor SQ is formed of the source/drain regions, and the gate electrode G4. Thus, the selection transistor SQ is formed over a bulk substrate not having a SOI structure.

In the MONOS memory region MOR, the control gate electrode CG is formed over the semiconductor substrate SB via the ONO film ON. The side surfaces of the control gate electrode CG, and a part of the top surface of the ONO film ON are covered with the offset spacer OF2. A sidewall SW is formed at each side surface of the control gate electrode CG via the offset spacer OF2. The ONO film ON has a lamination structure in which the silicon oxide film OX1, the silicon nitride film N1, and the silicon oxide film OX3 are sequentially stacked over the top surface of the semiconductor substrate SB. The side surface of the ONO film ON is exposed from the offset spacer OF2. Incidentally, it is considered that in the gate length direction of the control gate electrode CG, the end of the ONO film ON is retreated from the end of the offset spacer OF2 toward the control gate electrode CG side.

A pair of diffusion regions DR of n type semiconductor regions are formed at the top surface of the semiconductor substrate SB lateral to the control gate electrode CG. Further, an extension region EX of an n type semiconductor region is formed between the diffusion region DR and the top surface of the semiconductor substrate SB (channel region) immediately under the control gate electrode CG. In other words, a pair of extension regions EX and a pair of diffusion regions DR are formed at the top surface of the semiconductor substrate SB in the regions lateral to the control gate electrode CG. Each extension region EX and each diffusion region DR are in contact with each other.

The extension regions EX and the diffusion regions DR form the source/drain regions, and the impurity density of the extension region EX is lower than the impurity density of the diffusion region DR. The MONOS memory MC is formed of the source/drain regions and the control gate electrode CG. Thus, the MONOS memory MC is formed over a bulk substrate not having a SOI structure. The MONOS memory MC is formed of a MISFET including the source/drain regions and the control gate electrode CG. The ONO film ON functions as the gate insulation film of the MISFET.

The selection transistor SQ and the MONOS memory MC form one memory cell. In the memory cell region MR, such memory cells each having the selection transistor SQ and the MONOS memory MC are arranged in an array. The selection transistor SQ is used for selecting the MONOS memory MC, for example, when information of the MONOS memory MC is read.

In the I/O region HV, a gate electrode G3 is formed over the semiconductor substrate SB via a gate insulation film GI3. The side surfaces of the gate electrode G3, and a part of the top surface of the gate insulation film GI3 are covered with the offset spacer OF3. A sidewall SW is formed at each side surface of the gate electrode G3 via the offset spacer OF3. The film thickness of the gate insulation film GI3 is larger than the film thickness of the gate insulation film GI1. Further, the width of the gate electrode G3 in the gate length direction is larger than the width of the gate electrode G1 in the gate length direction.

A pair of diffusion regions D3 of n type semiconductor regions are formed at the top surface of the semiconductor substrate SB lateral to the control gate electrode G3. Further, an extension region EX of an n type semiconductor region is formed between the diffusion region D3 and the top surface of the semiconductor substrate SB (channel region) immediately under the gate electrode G3. In other words, a pair of extension regions E3 and a pair of diffusion regions D3 are formed at the top surface of the semiconductor substrate SB in the regions lateral to the gate electrode G3. Each extension region E3 and each diffusion region D3 are in contact with each other.

The extension regions E3 and the diffusion regions D3 form the source/drain regions. The impurity density of the extension region E3 is lower than the impurity density of the diffusion region D3. The high breakdown voltage transistor Q3 is formed of the source/drain regions and the gate electrode G3. Thus, the high breakdown voltage transistor Q3 is formed over a bulk substrate not having a SOI structure.

The gate insulation films GI1, GI3, and GI4 are each formed of, for example, a silicon oxide film. The gate electrodes G1, G3, and G4, and the control gate electrode CG are each formed of, for example, a polysilicon film. The sidewall SW is formed of a silicon nitride film or a silicon oxide film, or a lamination film of the films sequentially stacked. The offset spacers OF1 to OF4 are each formed of, for example, a lamination film of a silicon nitride film and a silicon oxide film sequentially stacked, or is formed of only a silicon oxide film or a silicon nitride film. The BOX film BX is formed of a silicon oxide film, and the semiconductor layer SL is formed of Si (silicon). The film thickness of the semiconductor layer SL is, for example, 12 nm.

Silicide layers S1 are formed at the top surfaces of the gate electrodes G1, G3, and G4, and the control gate electrode CG, and the surface of diffusion region D1, DR, or D3. The silicide layer S1 is formed of, for example, CoSi (cobalt silicide) or NiSi (nickel silicide). Over the semiconductor substrate SB and over the semiconductor layer SL, an interlayer insulation film IL mainly formed of, for example, a silicon oxide film is formed in such a manner as to cover the low breakdown voltage transistor Q1, the selection transistor SQ, the MONOS memory MC, and the high breakdown voltage transistor Q3.

A plug PG mainly formed of, for example, W (tungsten) is embedded in each of a plurality of contact holes penetrating through the interlayer insulation film IL. The top surface of each plug PG and the top surface of the interlayer insulation film IL are planarized at substantially the same plane. Over the interlayer insulation film IL and over the plugs PG, a wire M1 formed mainly of, for example, Cu (copper) is formed. The wire M1 is electrically coupled via the plugs PG and the silicide layer S1 with the top surfaces of the gate electrodes G1, G3, and G4, and the control gate electrode CG and the diffusion region D1, DR, or D3. However, the plug PG is not formed immediately over the diffusion region DR between the control gate electrode CG and the gate electrode G4. The wire M1 is embedded in a wire trench penetrating though the interlayer insulation film IL1 over the interlayer insulation film IL.

FIG. 35 shows a schematic plan view of a semiconductor chip CHP. As shown in FIG. 35, at the top surface of the semiconductor chip CHP, the core region CR, the memory cell region MR, and the I/O region HV are present at positions not overlapping each other in a plan view.

FIG. 36 shows a cross section of the vicinity of the region between the selection transistor SQ and the MONOS memory MC shown in FIG. 34 on an enlarged scale. Herein, some silicide layers, interlayer insulation films, and plugs are not shown. Further, for ease of understanding of the drawing, some hatching is omitted.

As shown in FIG. 36, in the gate length direction of the control gate electrode CG, the width of the ONO film ON is larger than the width of the control gate electrode CG. Accordingly, the ends in the gate length direction of the ONO film ON protrude from the side surfaces of the control gate electrode CG, respectively. In other words, in the transverse direction, the ONO film ON is terminated at positions not overlapping the control gate electrode CG in a plan view. Namely, in a plan view, the terminations of the control gate electrode CG and the ONO film ON are separated from each other.

Similarly, in the gate length direction of the gate electrode G4, the width of the gate insulation film GI4 is larger than the width of the gate electrode G4. Accordingly, the ends in the gate length direction of the gate insulation film GI4 protrude from the side surfaces of the gate electrode G4, respectively. In other words, in the transverse direction, the gate insulation film GI4 is terminated at positions not overlapping the gate electrode G4 in a plan view. Namely, in a plan view, the terminations of the gate electrode G4 and the gate insulation film GI4 are separated from each other. Similarly, the gate insulation films GI1 and GI3 shown in FIG. 34 protrude in the transverse direction from respective side surfaces of the gate electrodes G1 and G3, respectively.

As shown in FIG. 36, the width of the offset spacer OF4 in the gate length direction is substantially equal to the width of the offset spacer OF2. In contrast, a distance X1 between the termination of the control gate electrode CG and the termination of the ONO film ON in the gate length direction is equal to, or smaller than a distance X2 between the termination of the gate electrode G4 and the termination of the gate insulation film GI4 in the gate length direction. This is due to the following: in the manufacturing steps of the semiconductor device, in the steps after processing of the ONO film ON, the silicon nitride film N1 is oxidized, so that the terminations of the whole ONO film ON are retreated.

In the structure shown in FIG. 36, the film thickness of the gate insulation film GI4 is, for example, 8.5 nm, and the film thickness of the ONO film ON is, for example, 13 nm. In other words, the film thickness of the gate insulation film GI4 is smaller than the film thickness of the ONO film ON. However, FIG. 34 and the drawings for use in description of manufacturing steps described later each show the case where the film thickness of the gate insulation film GI4 and the film thickness of the ONO film ON are equal to each other. When the film thickness of the gate insulation film GI4 is smaller than the film thickness of the ONO film ON, the structure as shown in FIG. 36 is obtained. Namely, in the selection transistor region SWR, the top surface of the semiconductor substrate SB immediately under the sidewall SW adjacent to the offset spacer OF4 is dented downwardly from the top surface of the semiconductor substrate SB immediately under the sidewall SW adjacent to the offset spacer OF2 in the MONOS memory region MOR, in other words, the top surface of the semiconductor substrate SB lateral to the control gate electrode CG.

In other words, the difference in height between the top surface of the semiconductor substrate SB immediately under the gate insulation film GI4 and the top surface of the semiconductor substrate SB in the region adjacent in the gate length direction to the gate insulation film GI4 is larger than the difference in height between the top surface of the semiconductor substrate SB immediately under the ONO film ON, and the top surface of the semiconductor substrate SB in the region adjacent in the gate length direction to the ONO film ON. The term "the difference in height" herein referred to is the distance in the direction (vertical direction, longitudinal direction, or height direction) perpendicular to the top surface of the semiconductor substrate SB, and herein denotes the distance between the positions of the top surface of the semiconductor substrate at two sites. In other words, the distance in the height direction between the top surface of the semiconductor substrate SB immediately under the gate insulation film GI4 and the top surface of the semiconductor substrate SB in the region adjacent in the gate length direction to the gate insulation film GI4 is larger than the distance in the height direction between the top surface of the semiconductor substrate SB immediately under the ONO film ON and the top surface of the semiconductor substrate SB in the region adjacent in the gate length direction to the ONO film ON.

In the selection transistor region SWR, at the top surface of the semiconductor substrate SB in the region adjacent to the offset spacer OF4, a dented part is formed due to the fact that the film thickness of the gate insulation film GI4 is smaller than the film thickness of the ONO film ON. The reason why the dented part is formed when the film thickness of the gate insulation film GI4 is smaller than the film thickness of the ONO film ON is as follows. As described later by reference to FIGS. 43, 44, and 46, the film thickness of the ONO film ON and the insulation film forming the gate insulation film GI4 are processed in the same step. The term "depth of the dented part" herein referred to denotes the distance in the height direction between the bottom surface of the dented part and the top surface of the semiconductor substrate SB lateral to the dented part. A depth Y3 of the dented part is, for example, 4.5 nm. A distance Y1 in the height direction between the top surface of the silicon oxide film OX2 and the lower surface of the silicon nitride film N1 is substantially equal to a distance Y2 between the top surface of the gate insulation film GI4 and the bottom surface of the dented part. Such a dented part can be formed at the top surface of the semiconductor layer in the memory cell region even in Modified Example of the present embodiment described later.

In the semiconductor device of the present embodiment, the ends on the opposite sides in the transverse direction (the gate length direction) of the ONO film ON protrude outwardly from the side surfaces of the control gate electrode CG, respectively. Accordingly, the ONO film ON is interposed between the corner part of the bottom surface of the control gate electrode CG and the top surface of the semiconductor substrate SB. As a result, it is possible to prevent the occurrence of a dielectric breakdown and a short circuit even in the vicinity of the corner part of the control gate electrode CG of the site on which an electric field tends to concentrate as compared with the semiconductor device of Comparative Example described by reference to FIG. 51. Namely, it is possible to improve the reliability of the semiconductor device.

Description of a Method for Manufacturing a Semiconductor Device

Below, a method for manufacturing a semiconductor device of the present Third Embodiment will be described by reference to FIGS. 37 to 49. FIGS. 37 to 49 are each a cross sectional view for illustrating a manufacturing step of the semiconductor device of the present embodiment. In FIGS. 37 to 49, the core region (logic circuit region or low breakdown voltage transistor region) CR, the selection transistor region SWR, the MONOS memory region MOR, and the I/O region (high breakdown voltage transistor region) HV are shown sequentially from the left-hand side of the drawing. The selection transistor region SWR and the MONOS memory region MOR form the memory cell region MR. Herein, a description will be given to the case where the low breakdown voltage transistor is formed over a SOI substrate, and the selection transistor and the MONOS memory forming the memory cell are formed over a bulk substrate.

Figure 37:
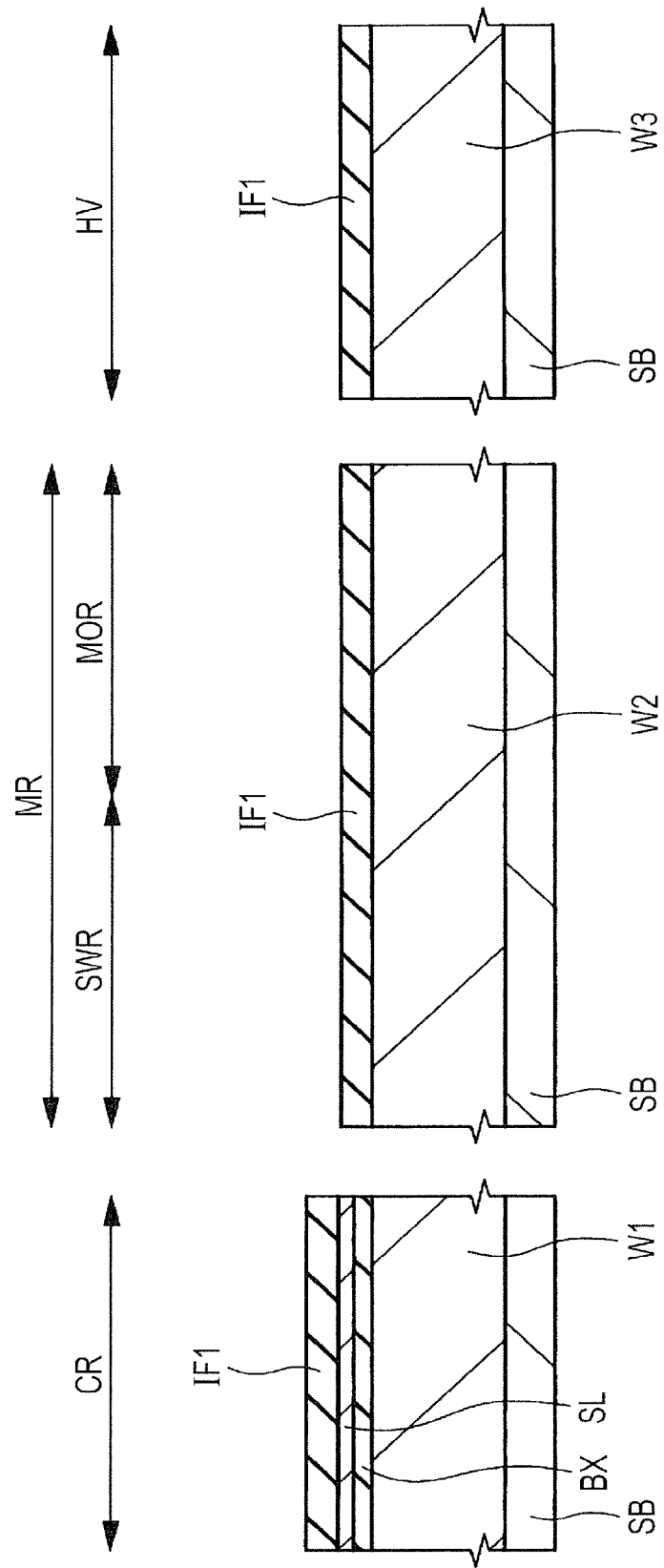
FIG. 37 is a cross sectional view of the semiconductor device of Third Embodiment during a manufacturing step.

First, as shown in FIG. 37, the same step as the step described by reference to FIG. 1 is performed, thereby to form a semiconductor substrate SB having a BOX film BX and the semiconductor layer SL in the core region CR, and to form wells W1 to W3 and an insulation film IF1. Herein, in the selection transistor region SWR and the MONOS memory region MOR, the step for the memory cell region MR described by reference to FIG. 1 is performed. Namely, in the memory cell region MR (selection transistor region SWR and MONOS memory region MOR) of the present embodiment, the well W2 is formed at the top surface of the semiconductor substrate SB, and the insulation film IF1 is formed over the top surface of the semiconductor substrate SB. Subsequently, a p type impurity (e.g., B (boron)) is implanted into the top surface of the semiconductor substrate SB in the selection transistor region SWR using, for example, an ion implantation method, thereby to form a channel region (not shown). The film thickness of the semiconductor layer SL is, for example, 12 nm.

Figure 38:
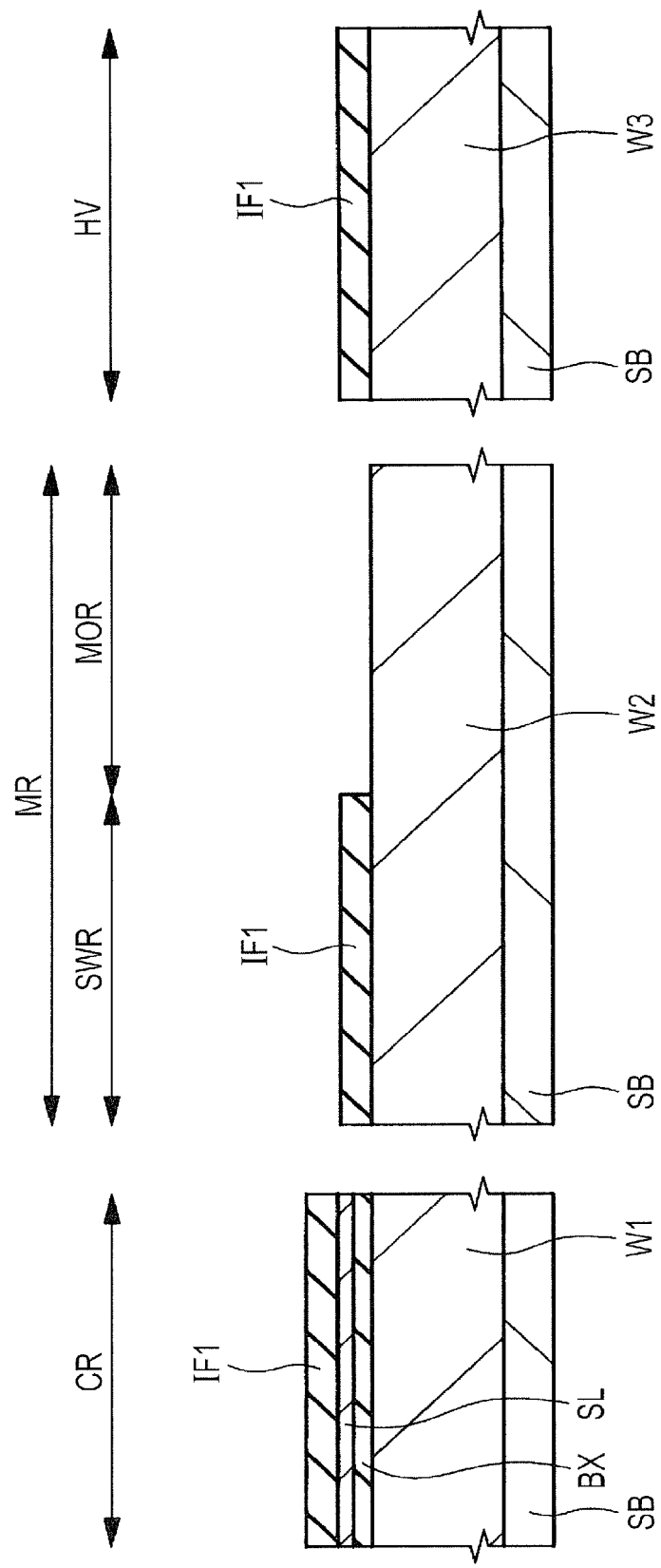
FIG. 38 is a cross sectional view of the semiconductor device during a manufacturing step following FIG. 37.

Then, as shown in FIG. 38, using a photolithography technology and a wet etching method, the insulation film IF1 in the MONOS memory region MOR is removed, thereby to expose the top surface of the semiconductor substrate SB.

Figure 39:
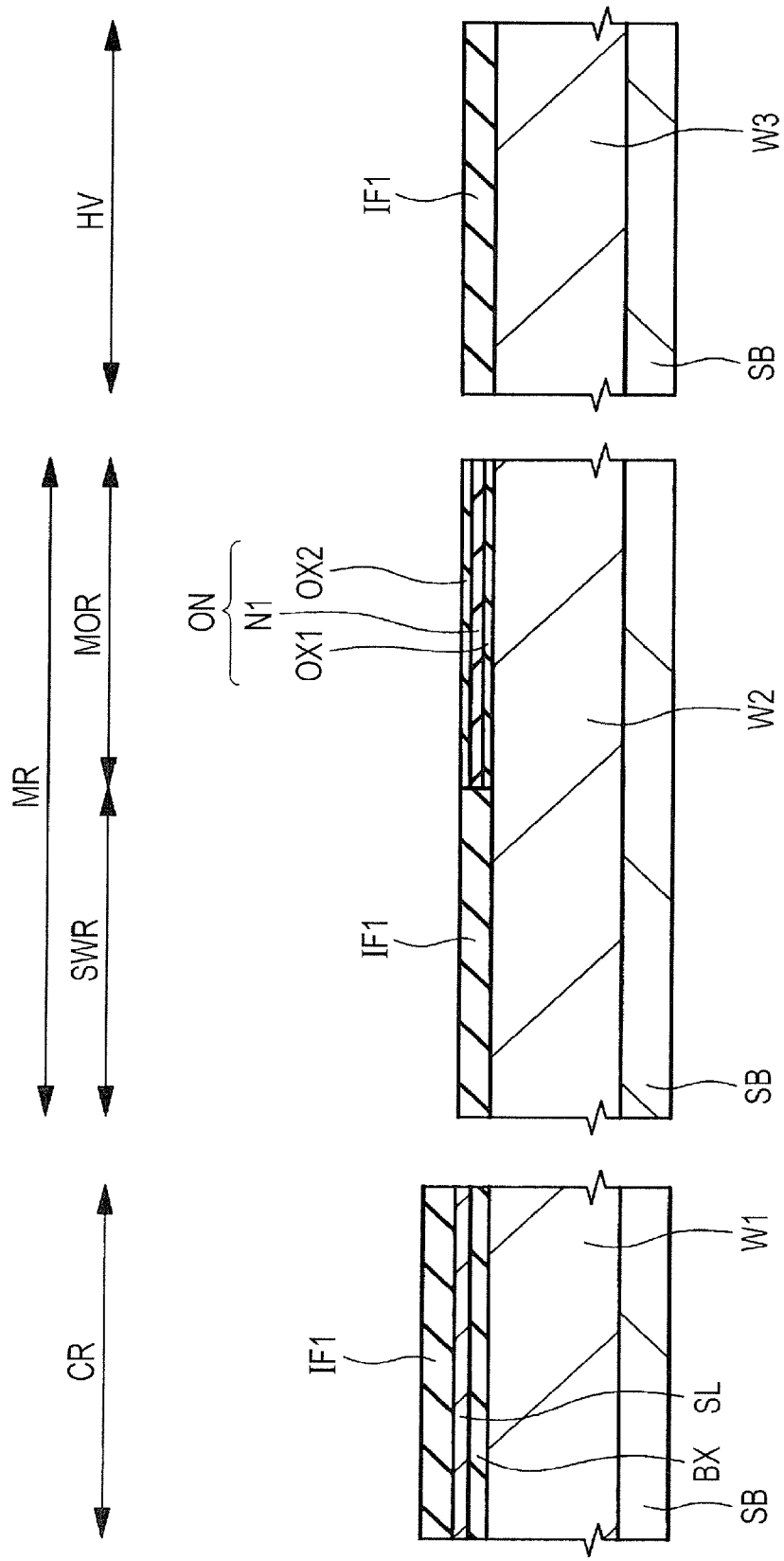
FIG. 39 is a cross sectional view of the semiconductor device during a manufacturing step following FIG. 38.

Then, as shown in FIG. 39, the same step as the formation step of the ONO film described by reference to FIG. 2 is performed. As a result, an ONO film ON is formed over the top surface of the semiconductor substrate SB. Then, the ONO film ON is processed, so that the ONO film ON is left only in the MONOS memory region MOR.

Figure 40:
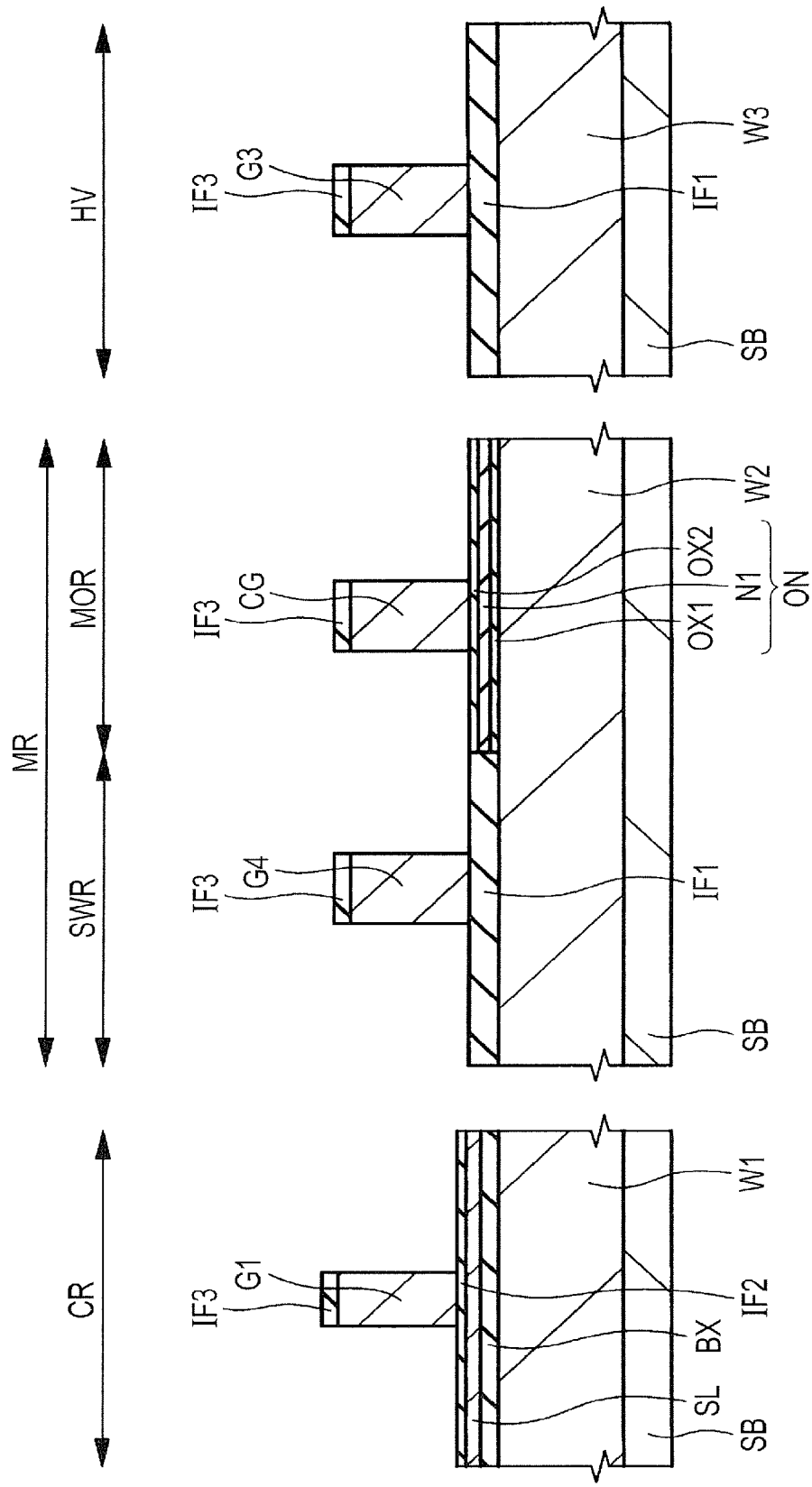
FIG. 40 is a cross sectional view of the semiconductor device during a manufacturing step following FIG. 39.

Then, as shown in FIG. 40, the same steps as the steps described by reference to FIGS. 3 and 4 are performed. As a result, in the core region CR, a lamination pattern formed of the insulation film IF2, the gate electrode G1, and the insulation film IF3 is formed, and in the selection transistor region SWR, a lamination pattern formed of the insulation film IF1, the gate electrode G4, and the insulation film IF3 is formed. Whereas, in the MONOS memory region MOR, a lamination pattern formed of the ONO film ON, the control gate electrode CG, and the insulation film IF3 is formed, and in the I/O region HV, a lamination pattern formed of the insulation film IF1, the gate electrode G3, and the insulation film IF3 is formed. Namely, in the selection transistor region SWR, a gate electrode G4 and an insulation film IF3 are formed over the semiconductor substrate SB via the insulation film IF1.

At this step, the insulation films IF1 and IF2, and the ONO film ON are not processed. In other words, in the step of forming the gate electrodes G1, G3, and G4, and the control gate electrode CG, etching is terminated at the time point when the top surface of the insulation film underlying the polysilicon film is exposed by the etching performed for processing the polysilicon film.

Figure 41:
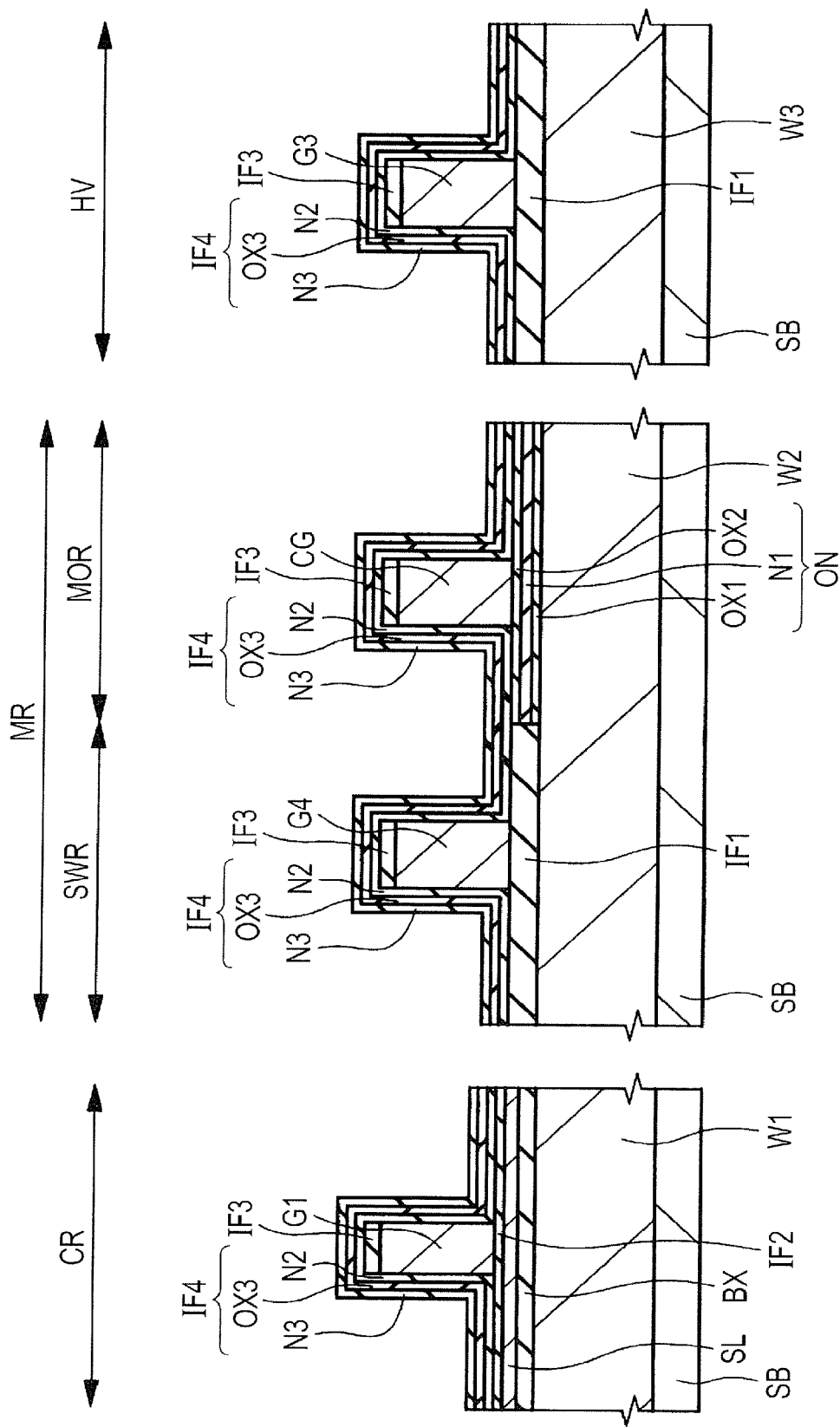
FIG. 41 is a cross sectional view of the semiconductor device during a manufacturing step following FIG. 40.

Then, as shown in FIG. 41, the same step as the step described by reference to FIG. 5 is performed. As a result, the insulation film IF4 formed of the silicon nitride film N2, the silicon oxide film OX3, and the silicon nitride film N3 covers respective surfaces of the gate electrodes G1, G3, and G4, and the control gate electrode CG.

Figure 42:
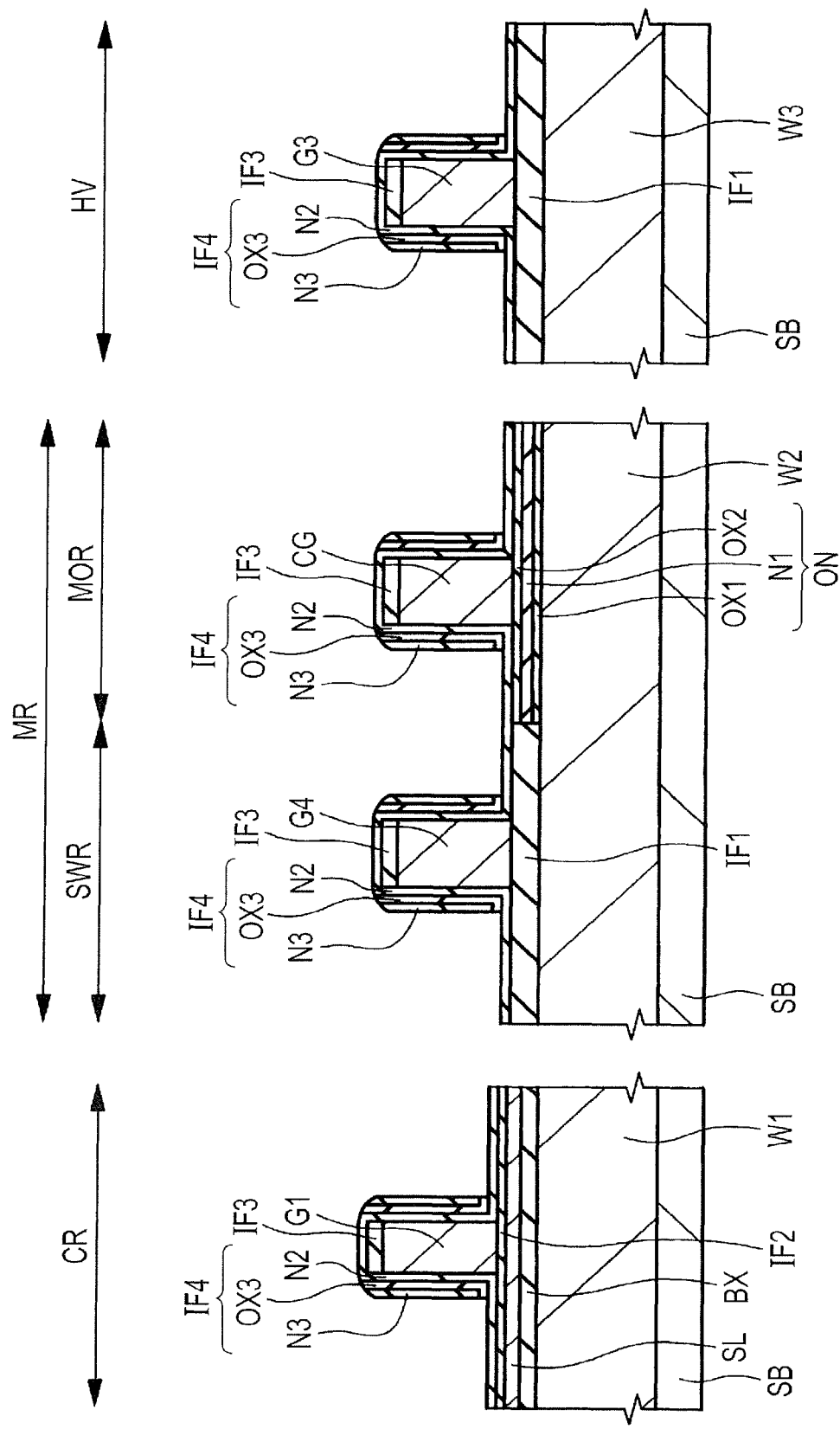
FIG. 42 is a cross sectional view of the semiconductor device during a manufacturing step following FIG. 41.

Then, as shown in FIG. 42, the same step as the step described by reference to FIG. 6 is performed. As a result, a part of the silicon nitride film N3 and a part of the silicon oxide film OX3 are removed, thereby to expose the top surface of the silicon nitride film N2. At this step, respective top surfaces of the portions of the insulation films IF1 and IF2, and the ONO film ON not covered with the gate electrodes G1, G3, and G4, and the control gate electrode CG are covered with the silicon nitride film N2. The silicon nitride film N2 has a role of preventing the oxidation of the gate electrodes G1, G3, and G4, the control gate electrode CG, the semiconductor substrate SB, and the semiconductor layer SL in the subsequent steps.

Figure 43:
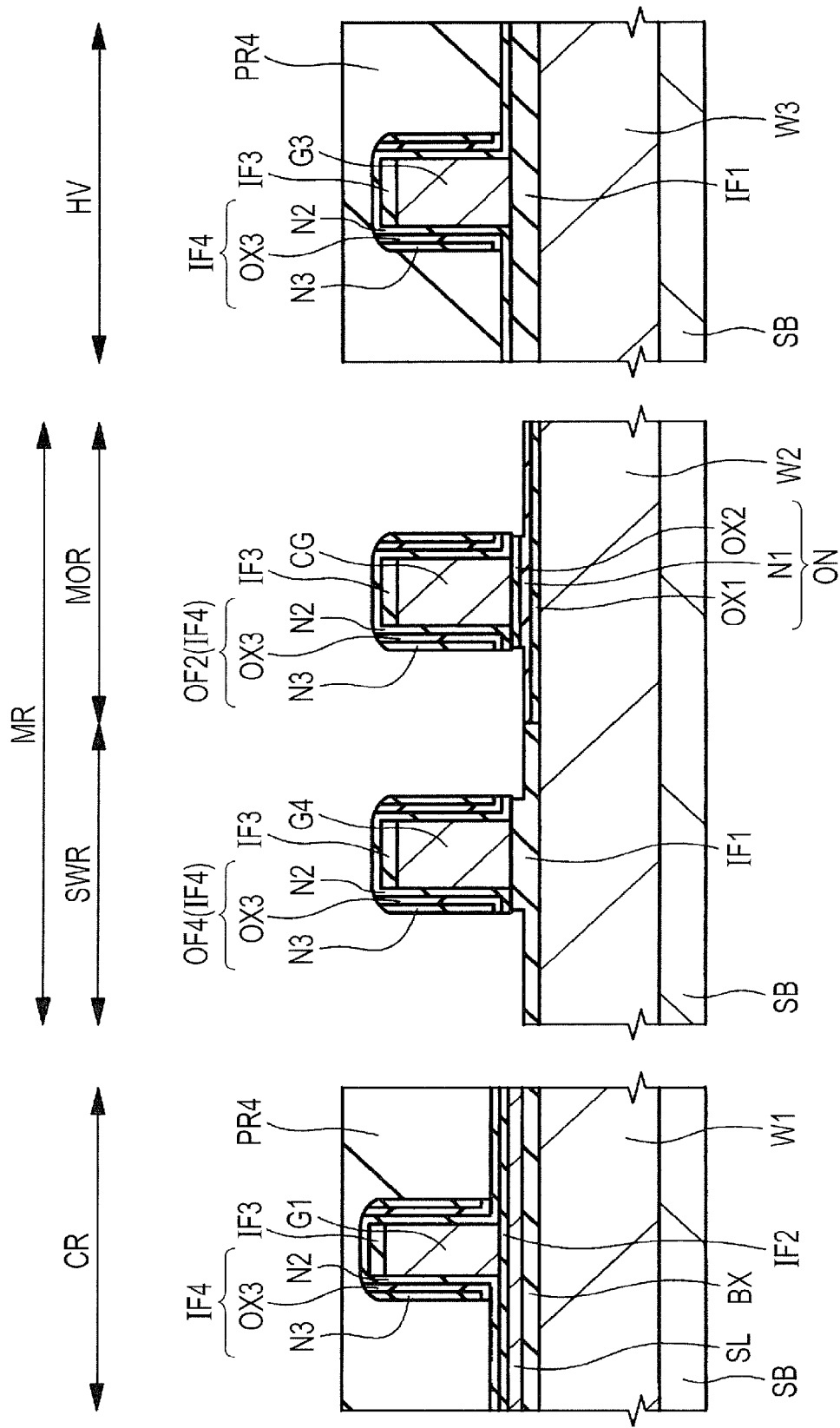
FIG. 43 is a cross sectional view of the semiconductor device during a manufacturing step following FIG. 42.

Then, as shown in FIG. 43, the same step as the step described by reference to FIG. 7 is performed. In other words, the silicon nitride film N3 extending in the transverse direction is removed. Thus, the top surface of the insulation film IF1 in the selection transistor region SWR of the memory cell region MR is retreated, and the top surface of the ONO film ON in the MONOS memory region MOR of the memory cell region MR is retreated. Herein, using the photoresist film PR4 as a mask, etching back is performed by a dry etching method.

Namely, etching back is performed. As a result, the top surface of the insulation film IF1 in the selection transistor region SWR is retreated to an intermediate depth of the insulation film IF1, and the top surface of the ONO film ON is retreated to an intermediate depth of the silicon nitride film N1. Herein, in the selection transistor region SWR, the silicon nitride film covering the top surface of the semiconductor substrate SB is removed. Thus, in the subsequent steps, the top surface of the semiconductor substrate SB becomes more likely to be oxidized as compared with in other regions.

In the etching back step, adjustment is performed so that the film thickness of the portion of the insulation film IF1 whose top surface is retreated and the film thickness of the portion of the ONO film ON whose top surface is retreated are equal to the film thickness of the silicon nitride film N2. This can equalize the states of the film structures among the insulation film left lateral to the gate electrode G1 over the core region CR, the insulation film left lateral to each of the gate electrode G4 and the control gate electrode CG in the memory cell region MR, and the insulation film left lateral to the gate electrode G3 in the I/O region HV. Accordingly, by the subsequent steps, elements over the SOI substrate and elements over the bulk substrate can be formed with precision. In other words, it becomes easy to form respective merged elements with desirable characteristics.

The insulation film IF4 formed of the silicon nitride film N2, the silicon oxide film OX3, and the silicon nitride film N3 covering each side surface of the control gate electrode CG forms the offset spacer OF2. In the dry etching step, the insulation film IF3 and the offset spacer OF2 in the MONOS memory region MOR are also used as a mask. Dry etching using the offset spacer OF2 covering each side surface of the control gate electrode CG as a mask is performed. As a result, the ends in the transverse direction (the gate length direction) of the silicon oxide film OX2 processed by the dry etching protrude outwardly from the side surfaces of the control gate electrode CG, respectively.

Further, the insulation film IF4 formed of the silicon nitride film N2, the silicon oxide film OX3, and the silicon nitride film N3 covering each side surface of the gate electrode G4 forms the offset spacer OF4. In the dry etching step, the insulation film IF3 and the offset spacer OF4 in the selection transistor region SWR are also used as a mask. Dry etching using the offset spacer OF4 covering each side surface of the gate electrode G4 is performed. As a result, the ends in the transverse direction (the gate length direction) of the insulation film IF1 processed by the dry etching protrude outwardly from the side surfaces of the gate electrode G4, respectively.

Figure 44:
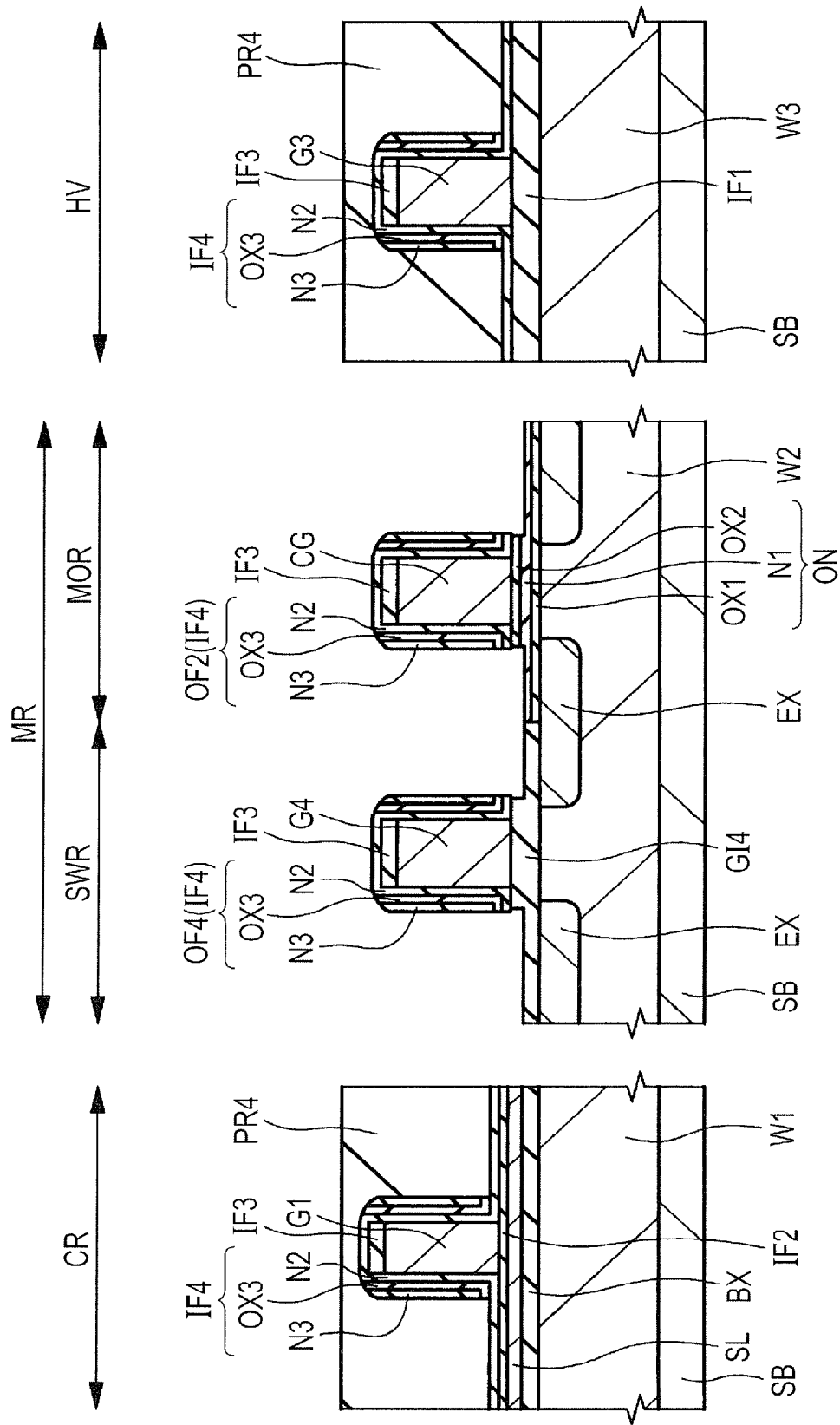
FIG. 44 is a cross sectional view of the semiconductor device during a manufacturing step following FIG. 43.

Then, as shown in FIG. 44, the same step as the step described by reference to FIG. 8 is performed. As a result, a plurality of extension regions EX are formed at the top surface of the semiconductor substrate SB in the selection transistor region SWR, and the top surface of the semiconductor substrate in the MONOS memory region MOR of the memory cell region MR, respectively. In other words, a pair of extension regions EX are formed in the selection transistor region SWR, and a pair of extension regions EX are formed in the MONOS memory region MOR. One extension region EX is formed at the top surface of the semiconductor substrate SB between the mutually adjacent gate electrode G4 and control gate electrode CG. Herein, using the photoresist film PR4 as a mask, ion implantation is performed.

Figure 45:
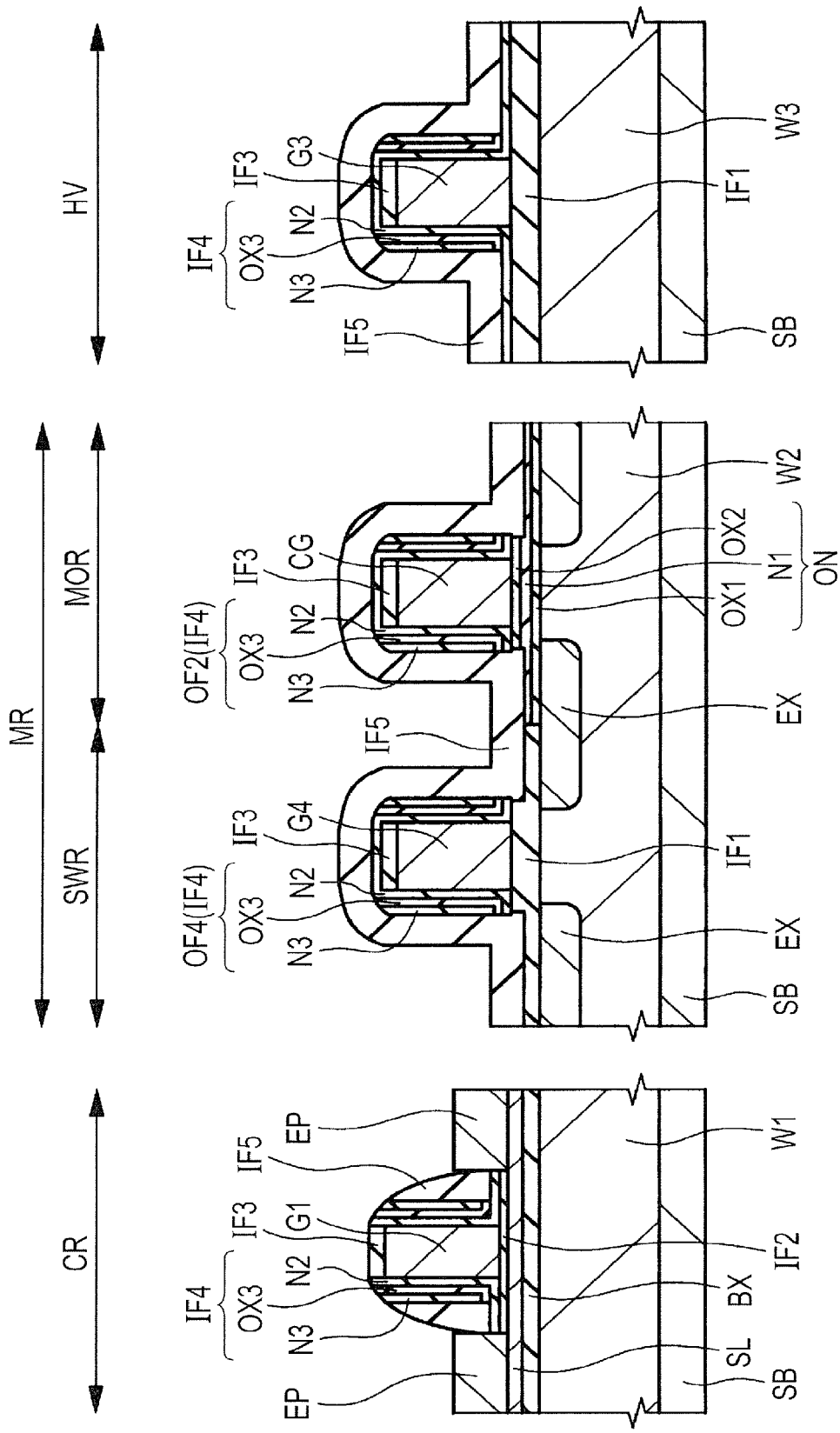
FIG. 45 is a cross sectional view of the semiconductor device during a manufacturing step following FIG. 44.

Then, as shown in FIG. 45, the photoresist film PR4 is removed, and the same steps as the steps described by reference to FIGS. 9 and 10 are performed, thereby to form an insulation film IF5 and an epitaxial layer EP. In the core region CR, the insulation film IF5 is formed in a sidewall shape. The insulation films IF5 in other regions are formed in such a manner as to cover the top surface of the semiconductor substrate SB, and the gate electrodes G3 and G4, and the control gate electrode CG.

Figure 46:
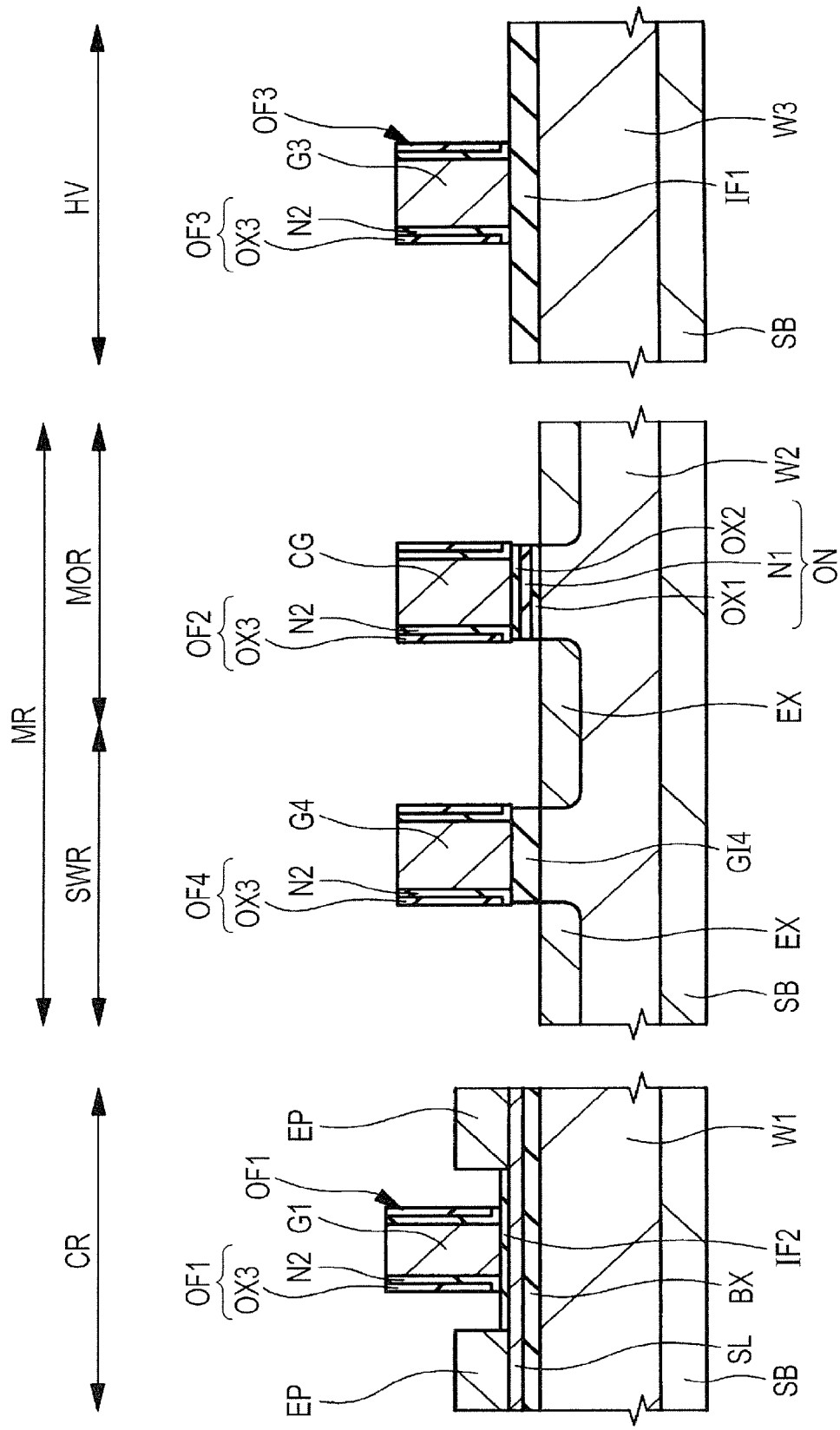
FIG. 46 is a cross sectional view of the semiconductor device during a manufacturing step following FIG. 45.

Then, as shown in FIG. 46, the same step as the step described by reference to FIG. 11 is performed, thereby to form the offset spacer OF1 in the core region CR, and the offset spacer OF3 in the I/O region HV. In the selection transistor region SWR, the insulation film IF1 is processed, thereby to expose the top surface of the semiconductor substrate SB, resulting in the formation of a gate insulation film GI4 formed of the insulation film IF1. In the MONOS memory region MOR, the ONO film ON is processed, thereby to expose the top surface of the semiconductor substrate SB.

Figure 47:
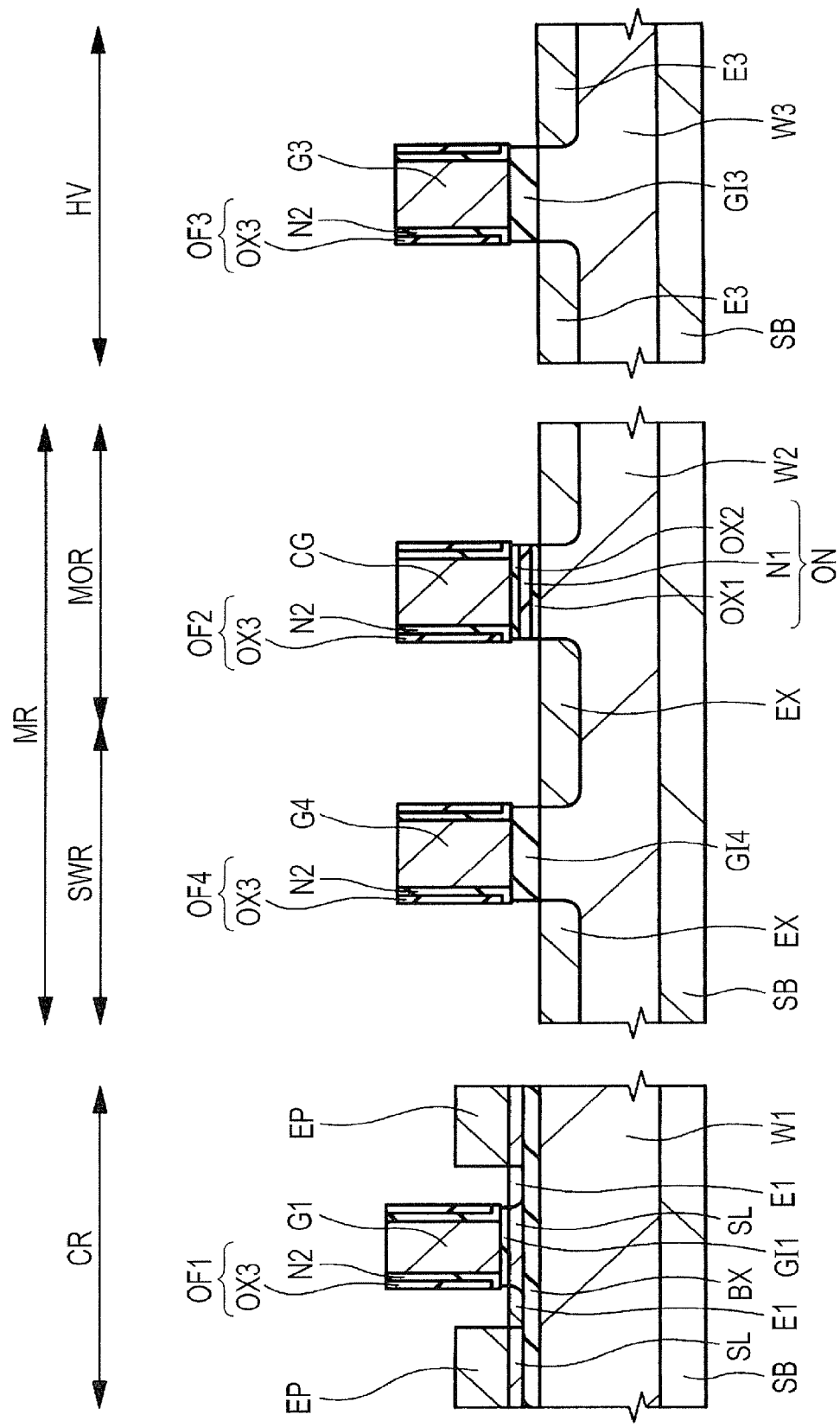
FIG. 47 is a cross sectional view of the semiconductor device during a manufacturing step following FIG. 46.

Then, as shown in FIG. 47, the same step as the step described by reference to FIG. 12 is performed, thereby to form the extension regions E1 and E3, and the gate insulation films GI1 and GI3.

Figure 48:
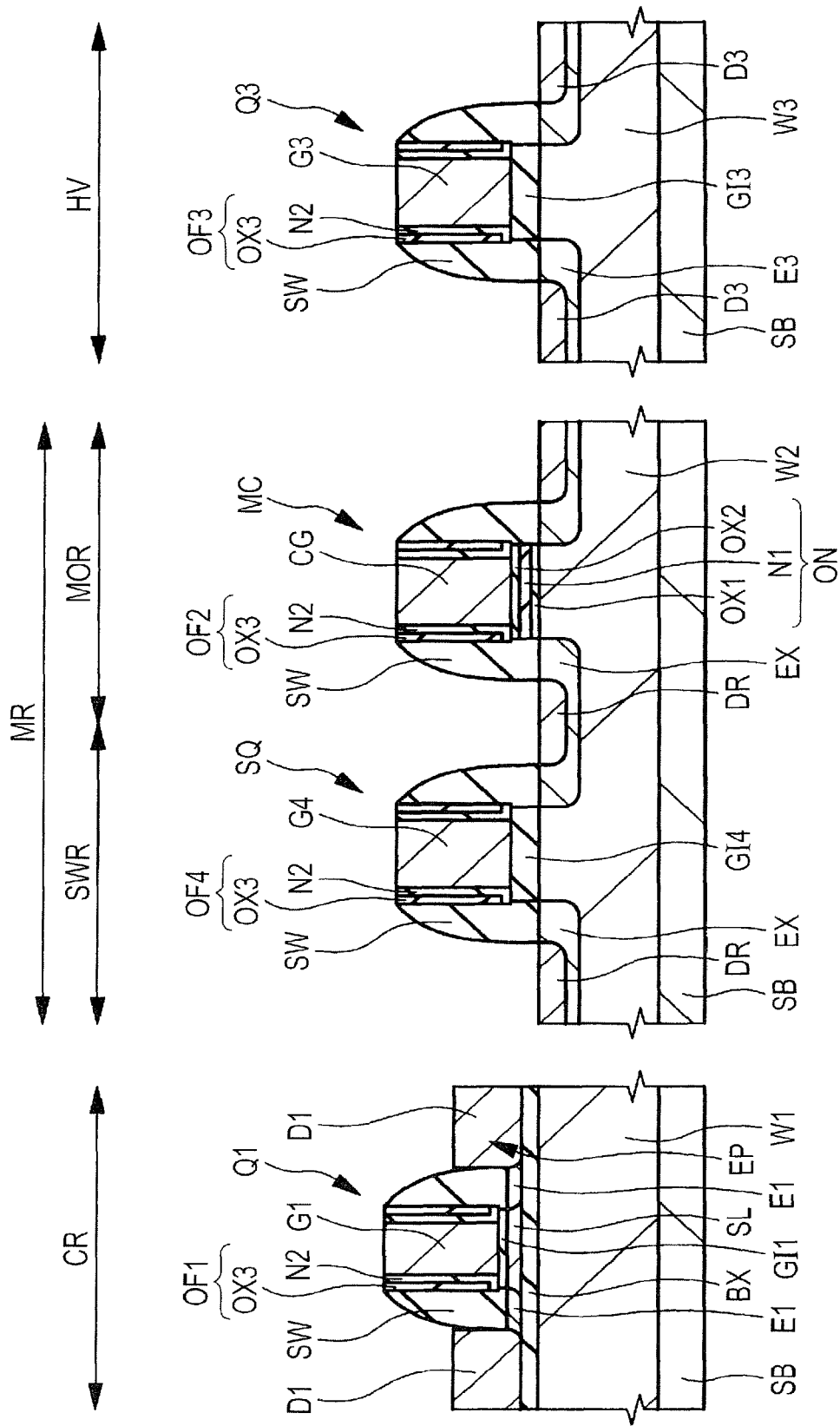
FIG. 48 is a cross sectional view of the semiconductor device during a manufacturing step following FIG. 47.

Then, as shown in FIG. 48, the same step as the step described by reference to FIG. 13 is performed, thereby to form a sidewall SW covering each side surface of the gate electrodes G1, G3, and G4, and the control gate electrode CG, and diffusion regions D1, D3, and DR. Herein, a plurality of diffusion regions DR are formed at the top surface of the semiconductor substrate SB in the selection transistor region SWR and the top surface of the semiconductor substrate in the MONOS memory region NOR of the memory cell region MR, respectively. In other words, a pair of diffusion regions DR are formed in the selection transistor region SWR, and a pair of diffusion regions DR are formed in the MONOS memory region MOR. One diffusion region DR is formed at the top surface of the semiconductor substrate SB between the mutually adjacent gate electrode G4 and control gate electrode CG.

Respective mutually adjacent extension regions E1 and diffusion regions D1 in the core region CR form source/drain regions, respectively. Whereas, respective mutually adjacent extension regions EX and diffusion regions DR in the selection transistor region SWR and the MONOS memory region MOR form source/drain regions, respectively. Whereas, respective mutually adjacent extension regions E3 and diffusion regions D3 in the I/O region HV form source/drain regions, respectively.

This results in the formation of the low breakdown voltage transistor Q1 in the core region CR, the MONOS memory MC in the MONOS memory region MOR, and the high breakdown voltage transistor Q3 in the I/O region HV. Whereas, in the selection transistor region SWR, the source/drain regions and the gate electrode G4 form a selection transistor SQ. All of the low breakdown voltage transistor Q1, the selection transistor SQ, the MONOS memory MC, and the high breakdown voltage transistor Q3 are n channel type MISFETs (MIS type field effect transistors).

Figure 49:
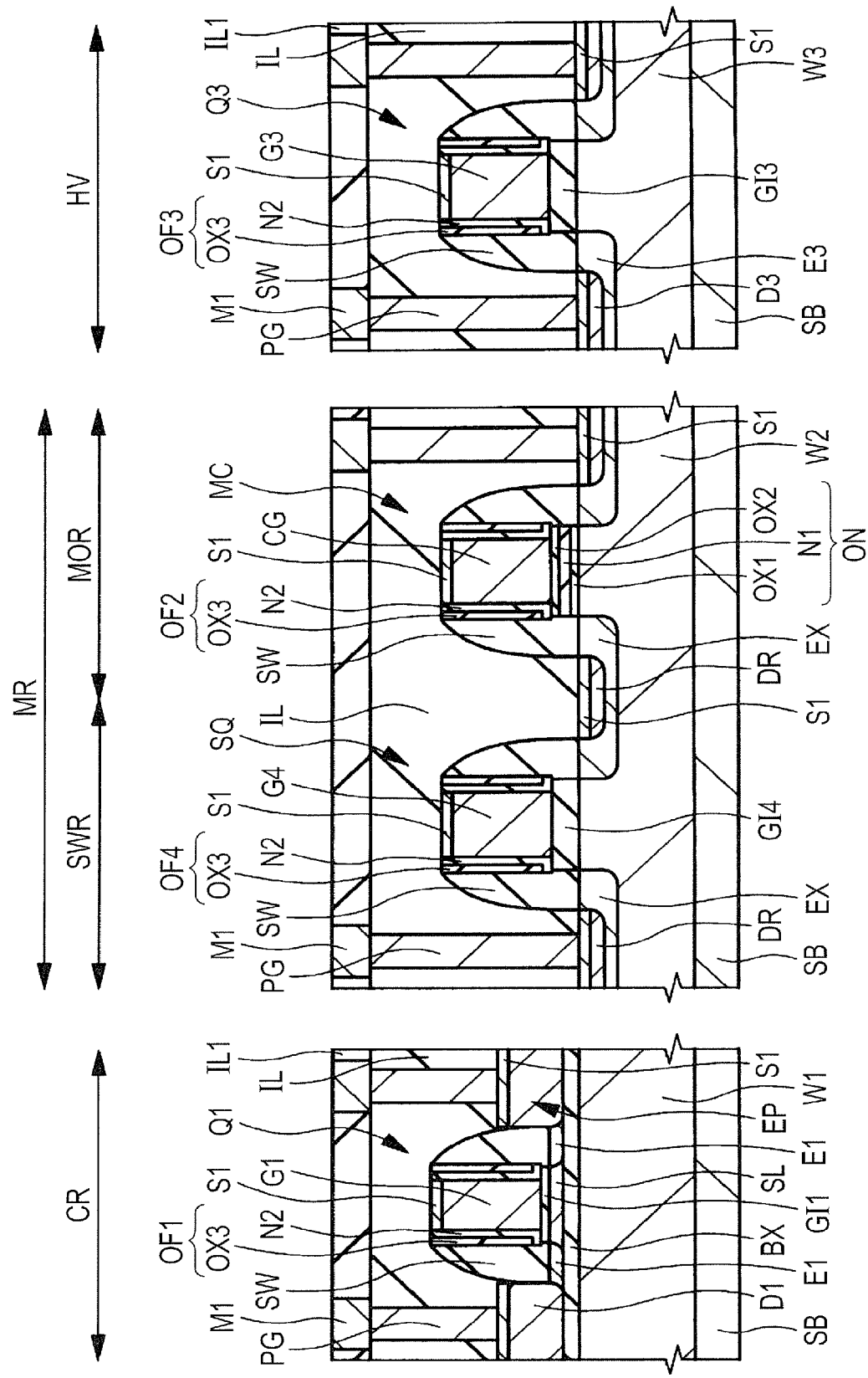
FIG. 49 is a cross sectional view of the semiconductor device during a manufacturing step following FIG. 48.

Then, as shown in FIG. 49, the same step as the step described by reference to FIG. 14 is performed, thereby to form the semiconductor device of the present embodiment. Namely, the silicide layer S1, the interlayer insulation film IL, the plugs PG, the interlayer insulation film IL1, and the wire M1 are formed. However, the plug PG is not formed immediately over the diffusion region DR between the control gate electrode CG and the gate electrode G4.

Below, a description will be given to the effects of the method for manufacturing the semiconductor device of the present embodiment.

The dimensions of the gate electrode formed in the manufacturing step of a miniaturized semiconductor device are small. The dimensions are reduced by oxidation. Thus, it is feared that the characteristics of the MISFET are affected. For this reason, the side surface of the gate electrode after formation by etching processing of the gate electrode may be protected by being covered with an insulation film formed not by an oxidation method but by a deposition method, in other words, a silicon nitride film or a silicon oxide film, or lamination film thereof.

The gate insulation film of the low breakdown voltage transistor is thinner than the gate insulation film of the high breakdown voltage transistor. Particularly, when the low breakdown voltage transistor is formed over a SOI substrate, the SOI layer is thin. For this reason, the film thickness of the gate insulation film of the low breakdown voltage transistor is required to be set particularly small. Accordingly, in order to prevent the SOI layer from being cut away, conceivably, in the manufacturing steps for merging the low breakdown voltage transistor and the high breakdown voltage transistor over the SOI layer, etching performed for forming each gate electrode is stopped at the surface of the insulation film (oxide film) underlying the gate electrode. For this reason, even when the etching is performed, the insulation film forming the gate insulation film of the high breakdown voltage transistor is left without being reduced in film thickness even lateral to the gate electrode. Similarly, in the formation region of the MONOS memory, at the time point upon completion of etching of forming the control gate electrode, the ONO film ON is left without being reduced in film thickness. Herein, as in the present embodiment, the offset spacers OF2 and OF4 of films for protecting the side surfaces of the gate electrode are formed, and subsequently, using the offset spacer OF2 as a mask, etching for processing the ONO film ON is performed. This can result in a structure in which the ends of the ONO film ON are made offset outwardly from respective side surfaces of the control gate electrode CG, respectively.

Namely, the ends on the opposite sides in the transverse direction (the gate length direction) of the ONO film ON protrude outwardly from respective side surfaces of the control gate electrode CG, respectively. Accordingly, the ONO film ON is interposed between the corner part of the bottom surface of the control gate electrode CG and the top surface of the semiconductor substrate SB. As a result, it is possible to prevent the occurrence of a dielectric breakdown and a short circuit even in the vicinity of the corner part of the control gate electrode CG of the site on which an electric field tends to concentrate.

Such a configuration is also applicable to the structure in which the selection transistor SQ is positioned on the source region side or the drain region side of the MONOS memory MC as in the present embodiment. At this step, when the ONO film ON and the insulation film IF1 (see FIG. 40) in the selection transistor region SWR have the same thickness, the film thicknesses of respective remaining films after the dry etching step described by reference to FIG. 43, in other words, respective film thicknesses of the insulation film IF1 and the ONO film ON can be made even. For this reason, this configuration is desirable from the viewpoint of preventing the silicon layer underlying the ONO film ON from being cut away. Particularly, this configuration is suitable for the case where a MONOS memory MC is formed over a thin semiconductor layer SL as in Modified Example of the present embodiment described later.

Alternatively, when the ONO film ON is thinner than the insulation film IF1, the insulation film IF1 is left in the selection transistor region SWR even if the ONO film ON is dry etched. For this reason, the configuration is desirable from the viewpoint of preventing the top surface of the silicon layer underlying the insulation film IF1 from being cut away. Particularly, the configuration is suitable for the case where a selection transistor SQ is formed over a thin semiconductor layer SL as in Modified Example of the present embodiment described later. Also when the selection transistor SQ or the MONOS memory MC is formed over a bulk substrate as in the present embodiment, the top surface of the semiconductor substrate SB can be prevented from being cut away. Thus, a uniform nonvolatile memory can be formed throughout the entire surface of the wafer.

At this step, when the film thickness of the ONO film ON is larger than that of the insulation film IF1 in the selection transistor region SWR, dry etching reaches as far as the top surface of the semiconductor substrate SB in the selection transistor region SWR upon processing the ONO film ON. In this case, the following is feared: the top surface of the semiconductor substrate SB in the selection transistor region SWR is cut away by etching using a phosphoric acid of the removal step (see FIG. 46) of the insulation film IF5 (see FIG. 45) serving as the protective film in an epitaxial growth step of a later step.

However, against this problem, a countermeasure can be taken because asking is performed in order to remove the photoresist film after the dry etching step (see FIG. 46) for processing the ONO film ON, and as a result, an oxide film can be formed at the top surface of the semiconductor substrate SB in the selection transistor region SWR. This method is suitable for the case where cutting away of the silicon layer is allowable as in the case where the MONOS memory MC is formed over a bulk substrate as in the present embodiment. However, when the difference in film thickness between the insulation film IF1 and the ONO film ON is smaller than the film thickness of the semiconductor layer SL, even the formation of the MONOS memory MC over the SOI substrate as in Modified Example of the present embodiment described later causes no problem.

Further, as shown in FIG. 43, the photoresist film PR4 used as a mask for etching back the insulation film IF1 and the ONO film ON is used as a mask for ion implantation in the formation step of the extension region EX to be performed subsequently. This can prevent the increase in the formation step of a resist pattern. Furthermore, the presence of the offset spacers OF1 to OF4 facilitates the formation of the diffusion region of a short channel.

Whereas, the offset spacer OF2 is a protective film formed regardless of whether or not there is the problem of dielectric breakdown for the purposes of protection of the side surfaces of the control gate electrode CG, the adjustment of the distance between the pair of extension regions EX, and the like. For this reason, the fact that the ends of the ONO film ON are caused to protrude using the offset spacer OF2 does not lead to an increase in manufacturing steps.

The structure having a selection transistor in addition to a MONOS memory is a mechanism advantageous in terms of characteristics and reliability because the structure provides the effects of facilitating the operation method such as use of selected bits and non-selected bits depending upon the situation in which the MONOS memory is formed at the memory array, and reducing the occurrence of the off-leakage current of the non-selected bit, and the like. Further, such a structure is a memory structure which tends to be used for memory products, MCU (Micro Controller Unit) products including memories merged therein, and the like. For this reason, the reliability of a large number of memory-merged products can be improved by the semiconductor device of the present embodiment.

Modified Example

Figure 50:
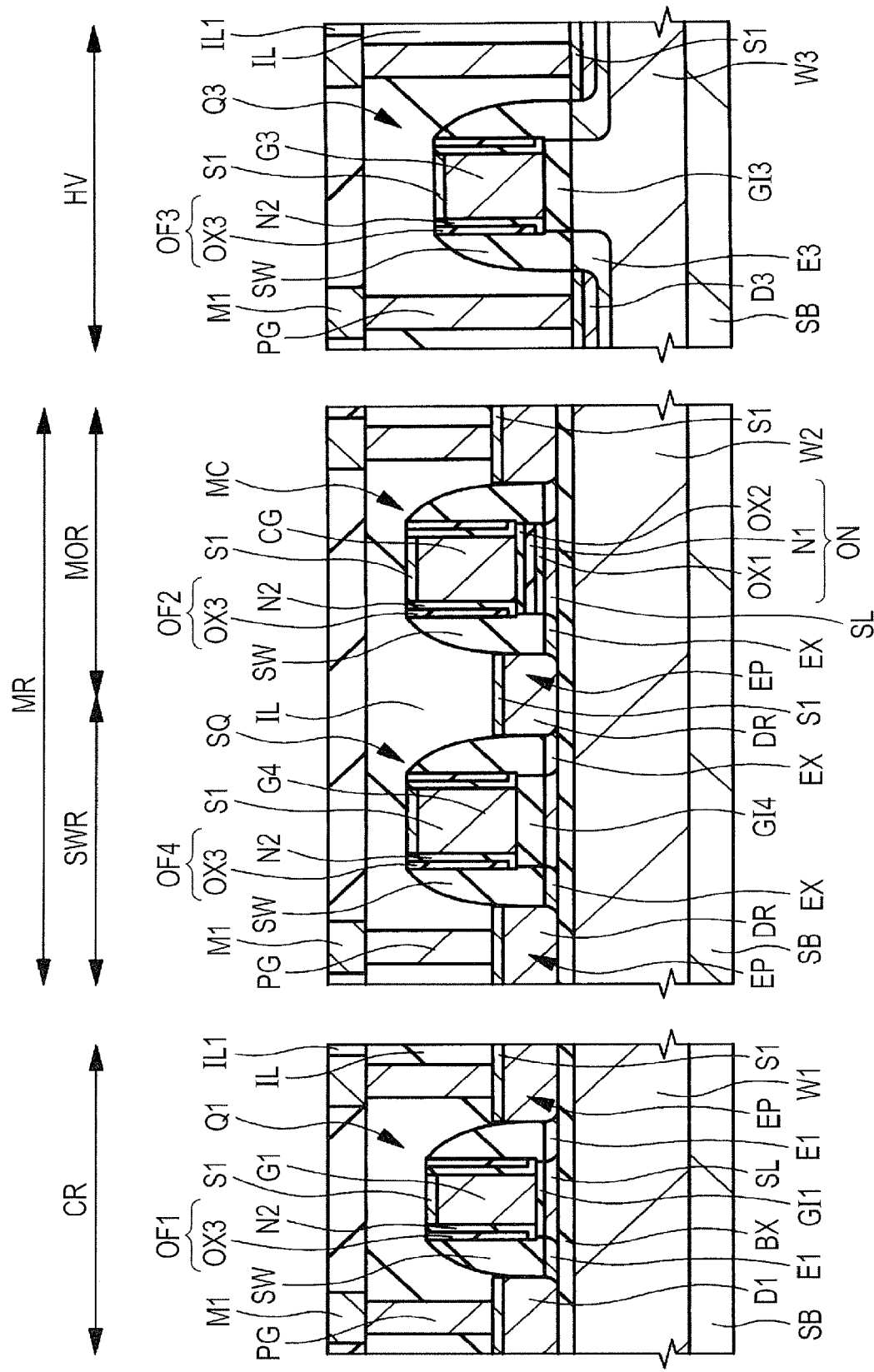
FIG. 50 is a cross sectional view showing a semiconductor device of Modified Example of Third Embodiment.

FIG. 50 shows a cross sectional view of a semiconductor device of Modified Example of the present Third Embodiment. The structure shown in FIG. 50 is different from the structure described by reference to FIG. 34 in that the selection transistor SQ and the MONOS memory MC are formed over the SOI substrate. Namely, in the selection transistor region SWR and the MONOS memory region MOR, the BOX film BX and the semiconductor layer SL are formed sequentially over the top surface of the semiconductor substrate SB, and the selection transistor SQ and the MONOS memory MC are formed over the semiconductor layer SL. The diffusion region DR is formed across in the epitaxial layer EP and in the semiconductor layer SL as with the diffusion region D1.

Even such a configuration can provide the same effects as those of the configuration described by reference to FIGS. 34 to 49. As described above, when the selection transistor SQ and the MONOS memory MC using a thin semiconductor layer SL as the channel region are formed, the effect of the present embodiment of being capable of preventing the silicon layer underlying the gate insulation film GI1 and the ONO film ON from being cut away can be obtained remarkably.

Namely, when the film thickness a of the insulation film IF1, the film thickness b of the ONO film ON, and the film thickness c of the semiconductor layer SL satisfy the conditions shown in the following expression 1, it is possible to prevent the total film thickness of the semiconductor layer SL upon processing the insulation film IF1 and the ONO film ON.

$$|a-b|<c \qquad (1)$$

Up to this point, the invention completed by the present inventors was described by way of the embodiments. However, it is naturally understood that the present invention is not limited to the embodiment, and may be variously changed within the scope not departing from the gist thereof.

What is claimed is:

1. A method of manufacturing a semiconductor device comprising:
   (a) providing an SOI substrate including a semiconductor substrate, a first insulating film formed on the semiconductor substrate and a semiconductor layer formed on the first insulating film, the SOI substrate having a core region and a memory cell region;
   (b) removing the semiconductor layer and the first insulating film positioned in the memory cell region;
   (c) forming a second insulating film on the semiconductor layer in the core region, and forming a third insulating film including a charge accumulation part on the semiconductor substrate in the memory cell region;
   (d) forming a first gate electrode on the third insulating film and a second gate electrode on the second insulating film;
   (e) forming a fourth insulating film so as to cover the first gate electrode and the second gate electrode;
   (f) removing portions of the fourth insulating film by etching in the memory cell region, thereby forming first offset spacers formed of the fourth insulating film on side surfaces of the first gate electrode;
   (g) removing portions of the fourth insulating film by etching in the core region, thereby forming second offset spacers formed of the fourth insulating film on side surfaces of the second gate electrode;
   (h) forming a first gate insulating film formed of the third insulating film between the first gate electrode and the semiconductor substrate, by performing etching to portions of the third insulating film in a state that the first offset spacers are formed; and
   (i) forming a second gate insulating film formed of the second insulating film between the second gate electrode and the semiconductor layer, by performing etching to portions of the second insulating film in a state that the second offset spacers are formed.

2. The method according to claim 1,
   wherein the (h) is performed such that ends of the first gate insulating film protrude outwardly from the side surfaces of the first gate electrode, respectively, in a gate length direction of the first gate electrode.

3. The method according to claim 2,
   wherein the (i) is performed such that ends of the second gate insulating film protrude outwardly from the side surfaces of the second gate electrode, respectively, in a gate length direction of the second gate electrode.

4. The method according to claim 1,
   wherein the (e) includes:

(e1) forming a fifth insulating film so as to cover the first gate electrode and the second gate electrode;

(e2) forming a sixth insulating film on the fifth insulating film; and (e3) forming a seventh insulating film on the sixth insulating film, and wherein the fourth insulating film is formed of the fifth insulating film, the sixth insulating film and the seventh insulating film.

5. The method according to claim 4, wherein the fifth insulating film is a silicon nitride film, wherein the sixth insulating film is a silicon oxide film, and wherein the seventh insulating film is a silicon nitride film.

6. The method according to claim 4, wherein the (f) includes:

(f1) removing portions of each of the sixth insulating film and the seventh insulating film by anisotropic etching, thereby leaving the other portions of each of the sixth insulating film and the seventh insulating film on the side surfaces of the first gate electrode and exposing portions of the fifth insulating film from the sixth insulating film in the memory cell region; and (f2) after the (f1), removing the portions of the fifth insulating film exposed from the sixth insulating film, thereby forming the first offset spacers.

7. The method according to claim 6, wherein the (f) includes:

(f3) removing portions of the third insulating film exposed from the first offset spacers and leaving the other portions of the third insulating film; and (f4) after the (f3), forming extension regions in the semiconductor substrate by performing ion implantation using the first offset spacers as masks.

8. The method according to claim 7, wherein the (f) includes:

(f5) after the (f4), removing the third insulating film exposed from the first offset spacers, thereby exposing portions of the semiconductor substrate from the third insulating film.

9. The method according to claim 4, wherein the (g) includes:

(g1) removing portions of each of the sixth insulating film and the seventh insulating film by anisotropic etching, thereby leaving the other portions of each of the sixth insulating film and the seventh insulating film on the side surfaces of the second gate electrode and exposing portions of the fifth insulating film from the sixth insulating film in the core region;

(g2) after the (g1), removing the seventh insulating film and portions of the fifth insulating film exposed from the sixth insulating film, thereby forming the second offset spacers formed of the fifth insulating film and the sixth insulating film.

10. The method according to claim 9, wherein the (g) includes:

(g3) after the (g1) and before the (g2), forming first sidewall spacers on the side surfaces of the second gate electrode via the fourth insulating film;

(g4) after the (g3) and before the (g2), removing portions of the second insulating film exposed from the first sidewall spacers, thereby exposing portions of the semiconductor layer from the first sidewall spacers; and (g5) after the (g4) and before the (g2), forming epitaxial layers on the portions of the semiconductor layer exposed from the first sidewall spacers.

11. The method according to claim 10, wherein the first sidewall spacers are removed in the (g2).

* * * * *